(12) United States Patent
Ito et al.

(10) Patent No.: US 7,273,534 B2
(45) Date of Patent: Sep. 25, 2007

(54) OPTICAL DEVICE SUBSTRATE FILM-FORMATION APPARATUS, OPTICAL DISK SUBSTRATE FILM-FORMATION METHOD, SUBSTRATE HOLDER MANUFACTURE METHOD, SUBSTRATE HOLDER, OPTICAL DISK AND A PHASE-CHANGE RECORDING TYPE OF OPTICAL DISK

(75) Inventors: Kazunori Ito, Kanagawa (JP);
Katsunari Hanaoka, Kanagawa (JP);
Hiroshi Deguchi, Kanagawa (JP);
Nobuaki Onagi, Kanagawa (JP);
Hiroko Tashiro, Kanagawa (JP);
Kiyoto Shibata, Kanagawa (JP);
Yasutomo Aman, Kanagawa (JP);
Hiroshi Miura, Kanagawa (JP);
Wataru Ohtani, Kanagawa (JP);
Hajime Yuzurihara, Kanagawa (JP);
Masaru Shinkai, Kanagawa (JP)

(73) Assignee: Ricoh Company, Ltd., Tokyo (JP)

( * ) Notice: Subject to any disclaimer, the term of this patent is extended or adjusted under 35 U.S.C. 154(b) by 197 days.

(21) Appl. No.: 10/896,046

(22) Filed: Jul. 22, 2004

(65) Prior Publication Data

US 2004/0262149 A1 Dec. 30, 2004

Related U.S. Application Data

(62) Division of application No. 09/498,375, filed on Feb. 4, 2000, now Pat. No. 6,841,049.

(30) Foreign Application Priority Data

| Feb. 9, 1999 | (JP) | 11-031952 |
| Jul. 12, 1999 | (JP) | 11-197298 |
| Jul. 26, 1999 | (JP) | 11-210671 |
| Sep. 28, 1999 | (JP) | 11-273894 |
| Oct. 13, 1999 | (JP) | 11-290494 |
| Oct. 26, 1999 | (JP) | 11-304096 |
| Nov. 11, 1999 | (JP) | 11-321377 |
| Nov. 15, 1999 | (JP) | 11-323734 |
| Jan. 7, 2000 | (JP) | 12-002005 |

(51) Int. Cl.
C23C 14/34 (2006.01)
C23C 16/00 (2006.01)

(52) U.S. Cl. .............. 204/192.2; 204/192.12; 204/192.16; 204/192.23; 204/192.26; 204/298.15; 204/298.25; 427/127; 427/128; 427/131; 427/249.1; 427/255.14; 427/255.6

(58) Field of Classification Search ........... 204/192.12, 204/192.16, 192.2, 192.23, 192.26, 298.15, 204/298.25; 427/127, 128, 131, 249.1, 255.14, 427/255.6; 118/500, 719, 724, 728, 729
See application file for complete search history.

(56) References Cited

U.S. PATENT DOCUMENTS 4,480,284 A * 10/1984 Tojo et al. ................. 361/234

(Continued)

FOREIGN PATENT DOCUMENTS

JP 55-143036 11/1980

(Continued)

OTHER PUBLICATIONS

U.S. Appl. No. 11/302,276, filed Dec. 14, 2005, Deguchi et al.

*Primary Examiner*—Rodney G. McDonald
(74) *Attorney, Agent, or Firm*—Oblon, Spivak, McClelland, Maier & Neustadt, P.C.

(57) ABSTRACT

In an optical disk substrate film-formation apparatus which prepared an optical disk by forming a thin film on a substrate, the optical disk substrate is held by a holder section. A contact support surface is provided to the holder section which closely contacts at least a portion of the surface of the optical disk substrate rear to the surface where the think film is formed.

30 Claims, 38 Drawing Sheets

U.S. PATENT DOCUMENTS

| | | |
|---|---|---|
| 4,675,096 A | 6/1987 | Tateishi et al. |
| 4,906,011 A * | 3/1990 | Hiyamizu et al. ............ 279/3 |
| 5,159,681 A | 10/1992 | Beck et al. |
| 5,267,607 A | 12/1993 | Wada |
| 5,324,012 A | 6/1994 | Aoyama et al. |
| 5,708,763 A | 1/1998 | Peltzer |
| 5,717,842 A | 2/1998 | Ambalavanar et al. |
| 5,857,667 A | 1/1999 | Lee |
| 5,923,820 A | 7/1999 | Cunnagin et al. |
| 5,930,466 A | 7/1999 | Rademacher |
| 6,181,835 B1 | 1/2001 | Hamill |
| 6,195,473 B1 | 2/2001 | Zable et al. |
| 6,295,133 B1 | 9/2001 | Bloomquist et al. |
| 6,336,991 B1 | 1/2002 | Tamura et al. |
| 6,387,809 B2 | 5/2002 | Toyoma |
| 6,391,418 B1 | 5/2002 | Ueda et al. |
| 6,463,177 B1 | 10/2002 | Li et al. |
| 6,559,958 B2 | 5/2003 | Motamed et al. |
| 6,651,116 B1 | 11/2003 | Ludwig et al. |
| 2002/0196467 A1 | 12/2002 | Delhoune et al. |
| 2004/0091163 A1 | 5/2004 | Anderson et al. |
| 2004/0262149 A1 | 12/2004 | Ito et al. |

FOREIGN PATENT DOCUMENTS

| | | |
|---|---|---|
| JP | 01-298162 | 12/1989 |
| JP | 2-273345 | 11/1990 |
| JP | 4-137526 | 12/1992 |
| JP | 06-143073 | 5/1994 |
| JP | 10-081964 | 3/1998 |
| JP | 10-162435 | 6/1998 |

* cited by examiner

FIG.8

| | THICKNESS OF SUBSTRATE | | | |
|---|---|---|---|---|
| | 0.3mm | 0.6mm | 0.7mm | 1.2mm |
| CONVENTIONAL TECHNOLOGY | MEASUREMENT IMPOSSIBLE | −550 | −540 | −100 |
| EMBODIMENT ① | −350 | −300 | −290 | −90 |
| EMBODIMENT ② | −340 | −290 | −280 | −85 |
| EMBODIMENT ③-1 | −340 | −290 | −280 | −85 |
| EMBODIMENT ③-2 | −350 | −300 | −290 | −90 |

MAXIMUM WARPING AMOUNT OF SUBSTRATE [μm]

FIG.21

| SUBSTRATE OR FILM-FORMED LAYER | MATERIAL | THICKNESS |
|---|---|---|
| REFLECTION LAYER | Al ALLOY | 160nm |
| UPPER BASE PROTECTION LAYER | ZnS·SiO$_2$ | 30nm |
| RECORDING LAYER | Ag-In-Sb-Te | 20nm |
| LOWER BASE PROTECTION LAYER | ZnS·SiO$_2$ | 180nm |
| SUBSTRATE | POLYCARBONATE | 0.6mm |

FIG.22

| TYPES OF SUBSTRATE HOLDER | WARPING RATE OF SUBSTRATE ($\mu$m) |
|---|---|
| SUBSTRATE HOLDER SHOWN IN FIG.18 | 100 |
| SUBSTRATE HOLDER SHOWN IN FIG.19 | >400 |
| SUBSTRATE HOLDER SHOWN IN FIG.20 | 100 |

FIG.23

| NO. | WIDTH Win FROM AN INNER MASK TO A SUBSTRATE HOLDER EDGE (mm) | WIDTH Wout FROM AN INNER MASK TO A SUBSTRATE HOLDER EDGE (mm) | WARPING AMOUNT OF THE SUBSTRATE ($\mu$m) | A NUMBER OF UNSUCCESSFULLY LOADED SUBSTRATES AMONG 100 SHEETS CONTINUOUSLY FORMED |
|---|---|---|---|---|
| 1 | 4 | 1 | 100 | 0 |
| 2 | 4 | 0 | 100 | 20 |
| 3 | 4 | 0.5 | 100 | 0 |
| 4 | 4 | 3 | 100 | 0 |
| 5 | 4 | 5 | 100 | 0 |
| 6 | 4 | 6 | 150 | 0 |
| 7 | 4 | 7 | 200 | 0 |
| 8 | 1 | 1 | 100 | 20 |
| 9 | 2 | 1 | 100 | 0 |
| 10 | 5 | 1 | 100 | 0 |
| 11 | 7 | 1 | 100 | 0 |
| 12 | 10 | 1 | 100 | 0 |
| 13 | 11 | 1 | 120 | 0 |
| 14 | 12 | 1 | 150 | 0 |

FIG.24

| NO. | TAPER ANGLE θ IN SUBSTRATE HOLDER EDGE (deg.) | WARPING AMOUNT OF THE SUBSTRATE (μm) | PRESENCE OF A DAMAGE ON A SUBSTRATE CAUSED BY SUBSTRATE HOLDER EDGE SECTION |
|---|---|---|---|
| 15 | 0 | 100 | YES |
| 16 | 0.5 | 100 | YES |
| 17 | 1.0 | 100 | NO |
| 18 | 1.5 | 100 | NO |
| 19 | 2.0 | 100 | NO |
| 20 | 2.5 | 150 | NO |
| 21 | 3.0 | 200 | NO |

FIG.26

| NO. | WIDTH H OF SILICON RUBBER IN SUBSTRATE HOLDER EDGE (mm) | WARPING RATE OF A SUBSTRATE ($\mu m$) | PRESENCE OF A DAMAGE ON A SUBSTRATE CAUSED BY SUBSTRATE HOLDER EDGE SECTION |
|---|---|---|---|
| 22 | 0 | 100 | YES |
| 23 | 0.1 | 100 | NO |
| 24 | 0.3 | 100 | NO |
| 25 | 0.5 | 100 | NO |
| 26 | 0.6 | 120 | NO |
| 27 | 0.7 | 150 | NO |

CROSS-SECTION A-B

OPTICAL DEVICE SUBSTRATE FILM-FORMATION APPARATUS, OPTICAL DISK SUBSTRATE FILM-FORMATION METHOD, SUBSTRATE HOLDER MANUFACTURE METHOD, SUBSTRATE HOLDER, OPTICAL DISK AND A PHASE-CHANGE RECORDING TYPE OF OPTICAL DISK

CROSS-REFERENCE TO RELATED APPLICATIONS

This application is a divisional of U.S. patent application Ser. No. 09/498,375, filed Feb. 4, 2000 now U.S. Pat. No. 6,841,049, the entire contents of which are hereby incorporated herein by reference.

FIELD OF THE INVENTION

The present invention relates to an optical disk manufacture technology. More specifically this invention relates to an optical disk substrate film-formation apparatus used for forming a film such as a recording layer by means of sputtering on a surface of an optical disk substrate, a film-formation method using the optical disk substrate film-formation apparatus, a method of manufacturing a substrate holder constituting the apparatus, a substrate holder constituting the apparatus, an optical disk manufactured with the apparatus, and a phase-change recording type of optical disk in which an Ag-based alloy is used for the reflection/heat-emission layer. This technology is applicable in the optical medium (such as a CD-ROM, a CD-R, a CD-RW, a DVD, a DVD-R, a DVD-RW, a DVD+RW, a DVD-RAM or the like).

BACKGROUND OF THE INVENTION

In the conventional technology, an optical disk is generally manufactured by alternately laminating a dielectric body layer and a recording layer on a substrate (optical disk substrate) made from such a material as thermoplastic resin. In most cases, the optical disk as described above is manufactured with a film-formation apparatus based on the so-called sheet system which can form a film on a plurality of optical disk substrates respectively in batch.

Some of film-formation apparatus based on the sheet system and used for manufacturing optical disk substrates have a plurality of film-formation chambers in each of which film-formation is performed. In that case the film-formation chambers are linked to each other with one substrate carriage chamber. In the film-formation apparatus as described above, optical disk substrates once carried into the apparatus are successively carried through the substrate carriage chamber to each film-formation chamber, where a different type of dielectric body layer or a recording layer is formed and laminated, and then the substrate each with a film formed thereon are taken out to outside of the apparatus. With the film-formation apparatus as described above, a plurality of dielectric body layers or recording layers can be formed, which contributes to through-put in a film-formation step.

The film-formation chamber and substrate carriage chamber each in a film-formation apparatus are separated from each other with a substrate holder for holding an optical disk substrate on which a film is being formed. FIG. 42 shows a cross section of the substrate holder as described above.

The substrate holder 100 shown in FIG. 42 has a round support plate 35 on which an optical disk substrate 101 is placed, and an arm section 37 for holding the support plate 35. Provided on the support plate 35 are an inner mask 38 which fixes an optical disk substrate 101 at a position close to its center (described as fixing section A) and an outer mask 39 which fixes the optical disk substrate 101 at a position close to its peripheral section (described as fixing section B). As shown in this figure, the optical disk substrate 101 is held and fixed between the inner mask 38 and outer mask 39.

The substrate holder 100 fixes the optical disk substrate 101 in such a way that the fixing section A and fixing section B contact the support plate 35 and there is a clearance a between other portion and the support plate 35. Thus, the optical disk substrate 101 can easily be removed from the support plate 35, which prevents the optical disk from being broken when removed from the support plate 35.

In recent years, there is the strong need for enlarging a recording capacity of an optical disk from 650 MB to 4.7 GB. To satisfy this need, there is the technology of adhering two optical disks to each other so that data can be recorded on both sides of the optical disk. In this type of optical disk based on the adhesion system, it is necessary to reduce the thickness of the optical disk from 1.2 mm like in the conventional technology to 0.6 mm. When the optical disk substrate is thin, naturally the mechanical and thermal strength decreases. When the thermal strength lower, the optical disk gets deformed during the film formation, and number of conceivably defective products which do not satisfy the requirements increases. This problem is especially serious when it is tried to maintain a through-put in the film formation step as that in the conventional technology.

In an optical disk (optical recording disk), a data recording section which can optically record and reproduce data is provided on a substrate, and the optical disk is used as a disk for filing documents or data therein. When the optical disk is used, the disk is rotated at a high speed, and a laser beam focused to a diameter of around 1 µm is irradiated thereon, and data is read out from the recording layer or data is recorded in the recording layer executing focus adjustment and positional detection.

When manufacturing various types of optical disk media, a step of forming a reflection layer, a recording layer, a dielectric body layer, or a protection layer by sputtering is indispensable. In film formation by sputtering, Ar plasma or the like is generated in a vacuum, a surface of a target is hit by ions in this plasma, and a film is piled up on an opposite substrate, so that heat is inevitably generated during film formation by sputtering. In the optical disk, generally a polymeric material such as polycarbonate is used as a material for a disk substrate, so that temperature increase in the film-formation chamber may sometimes cause deformation of the disk substrate. This problem becomes especially serious when film formation is continuously executed at a high speed, when a thick film is formed, or when two or more layers are repeatedly formed on the same substrate, and is still further series when the method is applied to manufacture a thin substrate with a thickness of 0.6 mm used in the DVD media.

To solve the problem described above, for instance, Japanese Patent Laid-Open Publication No. HEI 10-81964 (Title of the Invention: Sputter Holder for an Optical Recording Medium and Optical Recording Medium Manufacture Method) proposes a sputter device for manufacturing an optical recording medium, in which a sputter holder (substrate holder) for holding a substrate on which a film is to be formed having different heights in the outer section and inner sections each contacting a substrate is provided, a substrate is placed on this substrate holder, and deformation of the substrate is reduced by executing sputter film-formation in a state where the substrate is bent in a direction reverse to that in which the substrate is bent-during film-formation by sputtering.

Further in the conventional technology, when a plane substrate is loaded on a substrate holder of a vacuum film-formation apparatus (an optical disk substrate film-formation apparatus) for film formation to manufacture an optical disk, gas in a clearance between a rear surface of the substrate and the substrate holder is hardly evaluated to a vacuum state, and a time required to evaluate the gas down to a prespecified pressure level may be disadvantageously long. In addition, when a substrate with a film having been formed is carried out from the film-formation apparatus, sometimes the substrate is kept in a state where the substrate is vacuum-adsorbed to the substrate holder and is hardly separated from the substrate holder, which causes troubles in operations for taking out and carrying the substrate.

To solve the problem described above, for instance, Japanese Patent Laid-Open Publication No. HEI 2-273345 discloses a holder based on a structure in which an evacuation hole is provided in a recording medium substrate holder. Further, Japanese Utility Model Laid-Open Publication No. HEI 4-137526 discloses a holder based on a structure in which a gas evacuation hole is provided in a recording medium substrate holder as well as a substrate holder (opposite to a recording surface). In these conventional technologies, it is tried to evacuate gas on a rear surface of a substrate and to prevent adsorption of a substrate by providing a gas evacuation hole in a substrate holder.

In recent years, an optical disk making use of phase-change is often used as a rewritable optical disk. Generally the phase-change recording type of optical disk comprises a transparent plastic substrate on which convex and concave sections are provided at an arbitrary pitch, a lower dielectric body protection layer using ZnS—Si$_2$ as a dielectric material, a phase-change recording layer using a chalcogen-based recording material such as GeSbTe, InSbTe, or AgInSbTe, an upper dielectric body protection layer made from ZnS—SiO$_2$ like in the lower dielectric body protection layer, and a reflection/heat-emission layer using mainly an Al-based alloy, Au, or Ag, and each of the layers is also formed by sputtering.

In Japanese Patent Laid-Open Publication No. HEI 10-8964, however, warping in a radial direction of a substrate is taken into considerations, but there is no countermeasures against the mechanical characteristics of the substrate in a peripheral direction of the substrate, and when viewed totally, countermeasures against deformation of a substrate which occurs during film formation by sputtering is not always appropriate.

For instance, in production of DVD media, generally a film is formed by sputtering on a substrate having a thickness of 0.6 mm, and then a blank substrate having a thickness of 0.6 mm is adhered to the former substrate. As it is difficult to correct warping of a substrate in the peripheral direction in the adhesion step, it is essential to suppress warping of a substrate in the peripheral direction during film formation by sputtering, but this objective has not successfully been achieved in the conventional technology.

With the inventions disclosed in Japanese Patent Laid-Open Publication No. HEI 2-273345 or in Japanese Utility Model Laid Open Publication No. HEI 4-137526, although it is possible to prevent vacuum adsorption when taking out a substrate from a substrate holder, in a case of substrate made from a plastic material, when incident energy from particles sputtered during film formation is accumulated, temperature of the substrate easily rises due to accumulation of heat in the substrate made from the plastic material, and if a groove for preventing vacuum adsorption is formed on a surface of a holder closely contacting a rear surface of a substrate, difference between temperature in the closely contacting section and that in the groove section is generated, and a new problem of thermal deformation of a substrate occurs.

As described above, in the case of a substrate made from a plastic material, sometimes incident thermal energy may negatively affect the mechanical precision of the substrate. Especially when fine bits like those in an optical disk are formed on a surface, lowering of the mechanical precision due to deformation causes big troubles in recording, reading, or deleting data. Further, in production of various types of optical disk, a step of forming a reflection layer, a recording layer, a dielectric body layer, and a protection layer with a sputter device continuously and successively at a high speed is indispensable, so that the introduced thermal energy is easily accumulated. Especially, when a thin substrate having a thickness of 0.6 mm like a DVD media substrate is used, thermal deformation easily occurs, so that this problem is extremely serious in relation to maintenance of the mechanical precision.

When a trouble occurs due to thermal deformation of a substrate or for some other reasons while the substrate is being carried, it not only causes a failure of the device, but also extremely lowers the productivity of the production facility, which may in turn causes cost increase, and lowering of productivity or the like. Further, when the vacuum adsorption occurs in a step of taking out a substrate from a substrate holder, even if the substrate can be separated from the substrate holder in the carriage system side, scratches or other damages may be generated on a rear surface of the substrate, which in turns lowers the production yield, and further it may cause a serious problem in realization of a substrate carriage process at a higher speed.

In the case of phase-change recording type of optical disk, when it is tried to raise power for sputtering in film formation, temperature of the substrate remarkably rises, which causes warping of the substrate with reproduction of recorded data disabled. A recording disk based on a DVD system with a small thickness is especially weak to heat.

Japanese Patent Laid-Open Publication No. HEI 10-162435 discloses an invention relating to a reflection layer in a phase-change recording type of optical disk, and in this invention a mixture of Mg and Ag or the like is used for the reflection layer to improve the repetition performance.

SUMMARY OF THE INVENTION

It is an object of the present invention to provide an optical disk substrate film-formation apparatus and an optical disk substrate film-formation method which do not deform the optical disk substrate even when the optical disk with a thickness of 0.6 mm or less is used, nor lowers the through-put.

It is another object of the present invention to make it possible to take out and carry a substrate with a film having been formed by sputtering efficiently at a high speed in an apparatus used for forming a film by closely contacting at least one portion of a rear surface of a section of an optical disk substrate in which a thin film is formed during film formation by sputtering to a substrate holder.

It is still another object of the present invention to reduce deformation of a substrate during film formation by sputtering and realize stable carriage of the substrate.

It is still another object of the present invention to provide an optical disk substrate film-formation apparatus which can suppress deformation of a substrate and prevent vacuum adsorption between a substrate and a substrate holder when taking out the substrate from the substrate holder after a film has been formed by sputtering and thus can execute an stable operation for taking out substrates and also to provide a substrate holder used in the optical disk substrate film-formation apparatus described above.

It is still another object of the present invention to realize stable and high yield production of optical disks insuring the excellent mechanical characteristics of the substrate and media signal characteristics and to reduce troubles and further realize the high serviceability even when forming a film on a thick disk or on a thin disk at a high speed or when repetitively forming two or more layers on the same substrate in an optical disk substrate film-formation apparatus.

It is still another object of the present invention to reduce deformation of a substrate generated during film formation by sputtering and realize stable carriage of a substrate, and further to prevent generation of scratches on a surface of a substrate due to close contact between a substrate and a substrate holder.

It is still another object of the present invention to provide a phase-change recording type of optical disk in which the substrate is warped little even when a phase-change recording film is formed by sputtering at a high speed on such optical recording media as a CD-RW or DVD-RW, and also in which degradation of the Ag-based reflection/heat-emission layer is suppressed.

With the configuration according to the present invention, an area in which a substrate is held by a substrate holder increases, and loss of substrates during film formation due to thermal or plastic deformation is reduced. Further a rear surface of a film-formed area of a substrate can be adsorbed with vacuum chuck to a substrate holder.

With the configuration of the present invention, an area in which a substrate is held by a substrate holder increases, and also in a case of substrates with a thickness of 0.6 mm or less, loss of substrates during formation due to thermal or plastic deformation is reduced. Further, a rear surface of a film-formed area of a substrate can be adsorbed with vacuum chuck to a substrate holder.

With the configuration according to the present invention, it is possible to present a light beam incidence surface of an optical disk which is in the rear side during film formation from being damaged.

With the configuration according to the present invention, a portion of a contact holding surface of a substrate holder does not closely contact a substrate, so that an adhesion force between the contact holding surface and the substrate can be adjusted.

With the configuration according to the present invention, a substrate sucked to the contact holding surface with vacuum chuck can easily be removed.

With the configuration according to the present invention, it is possible to adsorb a substrate and a substrate holder to each other because of a pressure difference between a film formation chamber and a substrate carriage chamber, so that any specific mechanism for adsorbing the substrate and substrate holder to each other is not required.

With the present invention, by making rough a substrate holding surface of a substrate holder, it is possible to suppress warping of a substrate in the radial and peripheral directions, and a substrate does not closely contact a substrate holder, so that the efficiency in separating a substrate from a substrate holder is improved.

With the present invention, by making the surface roughness Rmax of at least a portion of a substrate holding surface to 10 μm or more and 500 μm or less, the efficiency in separating a substrate from a substrate holder is further improved. In this case, it is preferable to making rough the entire substrate holding surface within the numerical value range. When the surface roughness Rmax of the holding surface is less than 10 μm, the efficiency in separating a substrate from a substrate holder is not adequate, and when the roughness Rmax exceeds 500 μm, the substrate easily deforms along the rough surface.

With the present invention, to manufacture a substrate holder, a degree of the surface roughness of a substrate holding surface is shifted to a higher value than that in the range described above, and then the surface roughness Rmax is adjusted to the range described above after the prespecified lubrication processing is executed (the surface roughness is lowered after execution of the processing). To lubricate the rough surface, generation of damages on a rear surface of a substrate due to transfer of the substrate holding surface can be prevented. In the present invention, the lubrication processing may be carried out to both the roughed portion and plane surface portion of the holding surface, or only to the plane surface section.

With a substrate holder according to the present invention, generation of damages on a rear surface of a substrate can be suppressed. Such a material as PTFE (polytetrafluoroethylene) or POM (polyacetal) may be used as the self-lubricating plastic material. In the present invention, an area made from the self-lubricating plastic material may be the roughed portion and other sections of the substrate holding surface, or only sections other than the roughed portion.

With the functions according to the present invention, even when film formation is carried out closely contacting a rear surface of a substrate on which a film is to be formed to a substrate holder, by supplying gas from a gas supply section when the substrate is taken out after film formation by sputtering, it is possible to remove a substrate vacuum-adsorbed to a substrate holder via a step of film formation by sputtering in a vacuum. Further as the vacuum release phenomenon by gas is utilized, damages to a rear surface of a substrate when a substrate is taken out can be eliminated.

With the configuration according to the present invention, an area in which a substrate is held by a substrate holder increases, and loss of substrates during film formation due to thermal or plastic deformation is reduced. Further, it is possible to adsorb a rear surface of a film-formed area of a substrate to a substrate holder with vacuum chuck.

With the configuration according to the present invention, an area in which a substrate is held by a substrate holder increases, and loss of substrates during film formation due to thermal or plastic deformation is reduced even in the case of a substrate with a thickness of 0.6 mm or less. Further, it becomes possible to adsorb a rear surface of a film-formed area of a substrate to a substrate holder with vacuum chuck.

With the configuration according to the present invention, a substrate can be adsorbed to a substrate holder during film formation without providing any special mechanism for adsorbing a substrate to a substrate holder.

With the configuration according to the present invention, it is possible to adsorb a substrate to a substrate holder during film formation without providing any special mechanism for adsorbing a substrate to a substrate holder even in the case of substrate with the thickness of 0.6 mm or less.

With the configuration according to the present invention, an area in which a substrate is held by a substrate holder during film formation increases, and deformation of a substrate due to heat during film formation is reduced.

With the configuration according to the present invention, generation of damages on a light beam incidence surface of an optical disk which is in the rear side during film formation can be prevented.

With the configuration according to the present invention, a protection film can be formed without heating a substrate.

With the configuration according to the present invention, a protection film can be formed even when such a device as a coater is not available.

With the configuration according to the present invention, a film made from a material suited to a protection with the conditions for film formation well known can be selected.

With the film-formation method according to the present invention, warping of a substrate in the radial and peripheral directions thereof can be suppressed, and in addition, the substrate can easily and smoothly be separated from a substrate holder.

With complex plating according to the present invention, a coating film made from a carbon fluoride (CF)n or fluororesin is formed on a roughed portion on a surface of a substrate. As the fluororesin, for instance, PTFE, PFA (tetrafluoroethylene-perfluoroalkylvinyl ether copolymer), and FEP (tetrafluoroethylene-hexafluoropropylene copolymer) can be used.

With the organic plating according to the present invention, an organic thin film made from triazinthiole is formed a roughed portion on a surface of a substrate.

Other objects and features of this invention will become apparent from the following description with reference to the accompanying drawings.

BRIEF DESCRIPTION OF THE DRAWINGS

FIG. 8 shows effects due to the first to third embodiments of the present invention;

FIG. 21 is a table showing configuration of a substrate sample used for assessing a warping amount of a substrate and stability of the substrate during transportation;

FIG. 22 is a table showing types of substrate holder and a raping rate of a substrate;

FIG. 23 is a table showing a result of assessment of a warping amount of a substrate and stability in loading onto or unloading each substrate from a substrate holder changing a contact area between a substrate holder and a substrate in an optical disk substrate film-formation apparatus according to a tenth embodiment of the present invention;

FIG. 24 is a table showing a result of assessment of a warping amount of a substrate and damages generated on a surface of a substrate executed by changing a taper angle of an edge section in a substrate holding section of a substrate holder;

FIG. 26 is a table showing a result of assessment of a warping amount of a substrate and stability thereof during transportation executed by changing a width of a silicon rubber provided in an edge section of a substrate holder;

DESCRIPTION OF THE PREFERRED EMBODIMENTS

The optical disk substrate film-formation apparatus, optical disk substrate film-formation method, substrate holder manufacture method, and a phase-change recording types of optical disk according to first to seventeenth embodiments of the present invention are described in detail below with reference to the related drawings.

Figure 1:
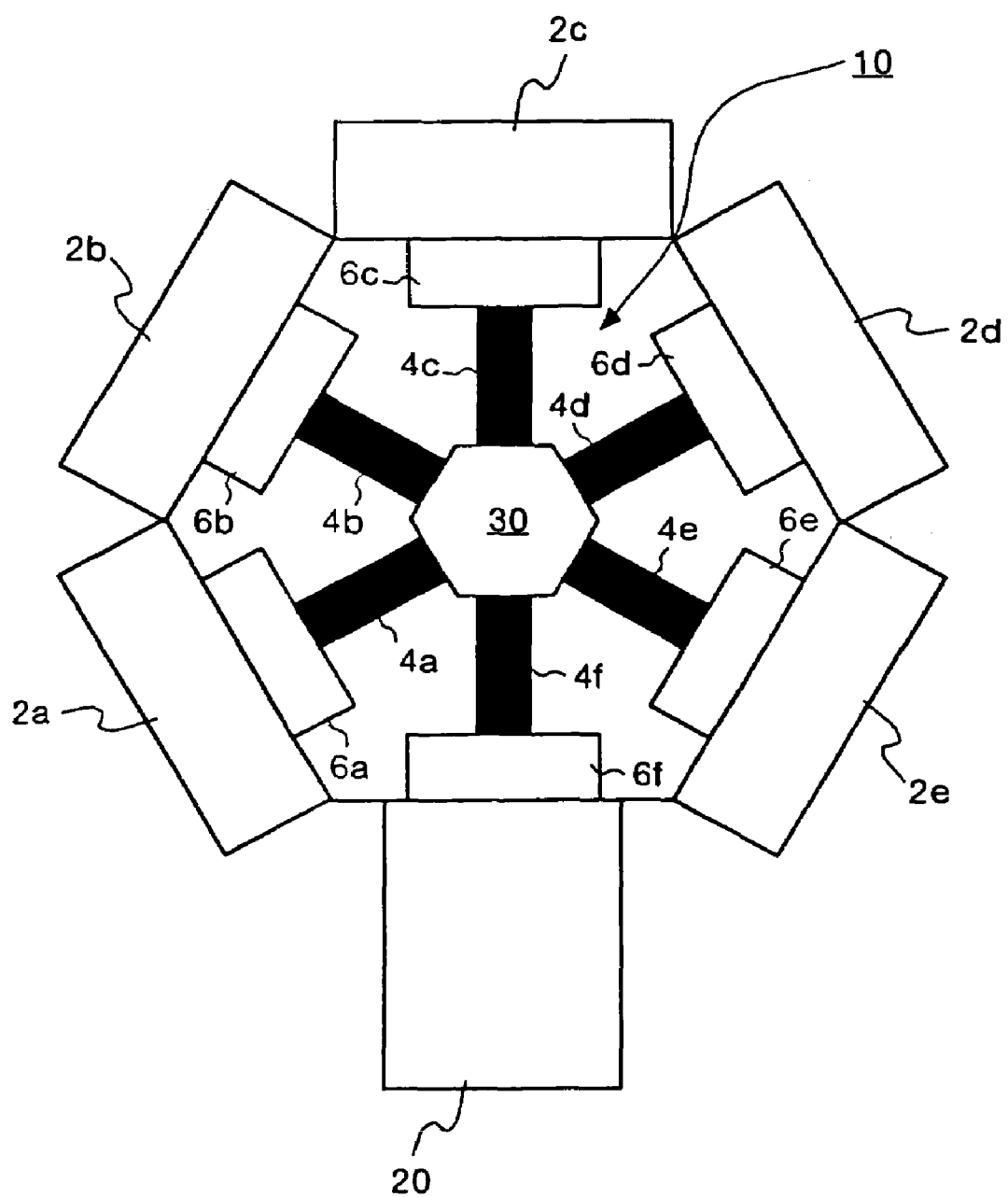
FIG. 1 shows a top surface of a substrate carriage chamber as well as of a film formation chamber common to first to third embodiments of the present invention.

FIG. 1 shows top views of a substrate carriage chamber and a film-formation chamber of an optical disk substrate film-formation apparatus according to the first embodiment of the present invention, and the basic configuration as described below is common to the first to third embodiments. In any of the first to third embodiments, it is assumed that the optical disk substrate with the thickness of 0.6 mm is used. The thickness of the substrate includes a nominal allowance of ±50 μm.

The configuration shown in the figure comprises a substrate carrier chamber 10, film-formation chambers 2a to 2e provided on an external peripheral surface of the substrate carriage chamber 10, and substrate holders 6a to 6f for fixing optical disks 1 (Refer to FIG. 2) in the film-formation chambers 2a to 2e. Vacuum is maintained in the substrate carriage chamber 10, and an optical disk substrate 1 is carried to each film-formation chamber without breaking the vacuum state. A carry-out/carry-in port 20 has a load lock mechanism between the vacuumed compartment and the atmospheric pressure, and has a function to load or unload the optical disk substrate 1 to and from a substrate holder f. The substrate holders 6a to 6f are described hereinafter.

Substrate carriage arms 4a to 4f are connected to the substrate holders 6a to 6f, and the substrate carriage arms 4a to 4f are fixed on a central section 30. The central section 30 is rotated by a driving section not shown herein. In association with this rotation, the substrate holders 6a to 6f can successively set one optical disk substrate in the film-formation chambers 2a to 2e.

In the first embodiment, the optical disk substrate film-formation apparatus having the configuration as described above forms three types of films made from AgInSbTe, $ZnS.SiO_2$, and Al by means of sputtering. Because of this feature, in the first embodiment, the film-formation chambers 2a and film-formation chambers 2b are used dedicatedly for formation of a $ZnS.SiO_2$ film (dielectric body layer), the film-formation chamber 2c is used dedicatedly for formation of an AgInSbTe film (storage layer), the film-formation chamber 2d is used dedicatedly for formation of an $ZnS.SiO_2$ film (upper dielectric body layer), and further the film-formation chamber 2e is used dedicatedly for formation of an Al film (reflection layer). By successively setting one optical disk 1 in the film-formation chambers 2a to 2e, the films described above are formed continuously, thus the optical disk being formed.

In any of the first to third embodiments, the total film thickness of films formed as described above is 370 nm. A tact time in the sputtering step is 25 sec.

Figure 2:
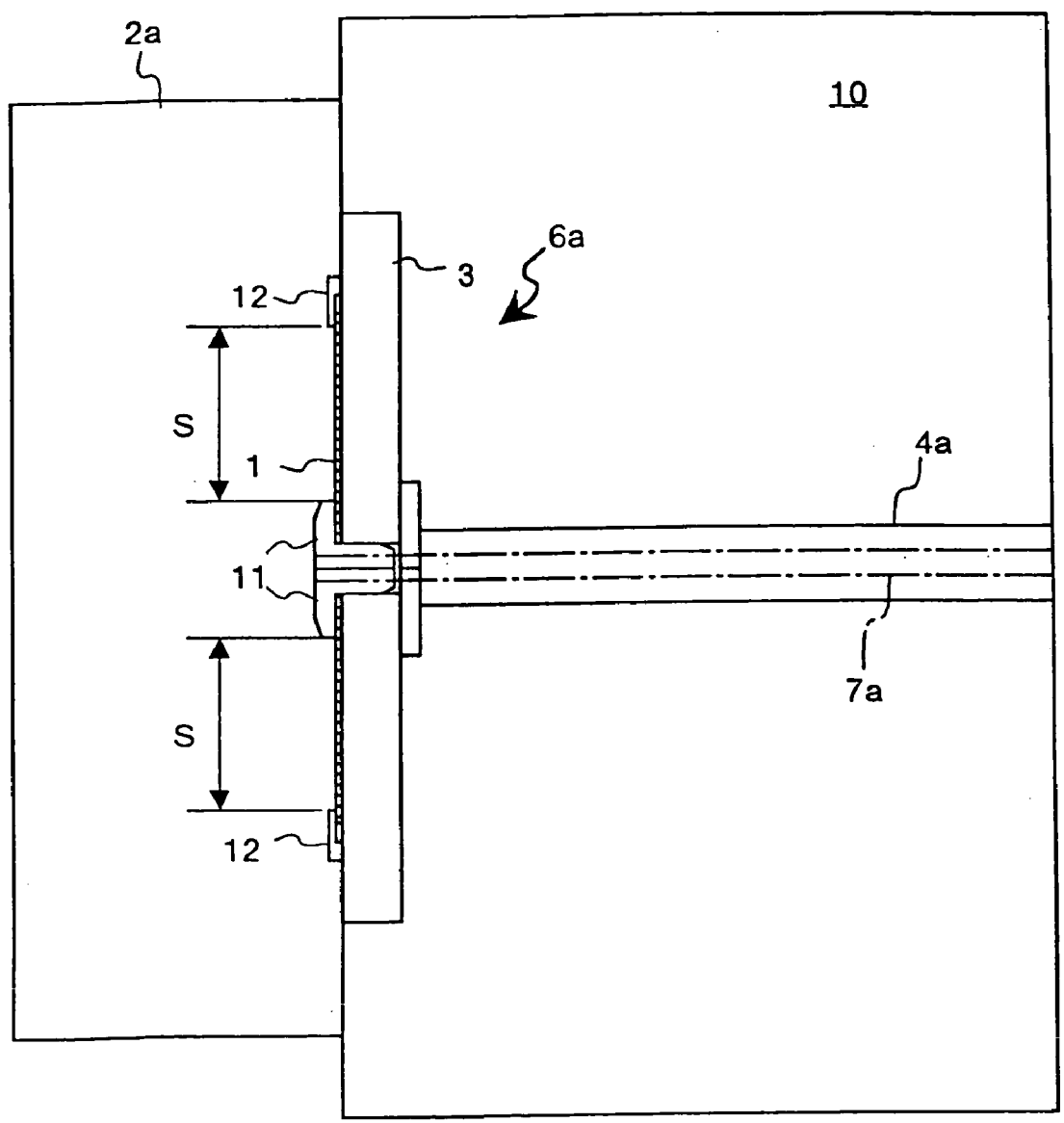
FIG. 2 shows a sideward cross-section according to the first embodiment of the present invention.

FIG. 2 is a lateral cross section of the substrate holder 6a shown in FIG. 1. The other substrate holders 6b to 6f are formed in the same way as the substrate holder shown in FIG. 2, so that description and illustration thereof are omitted herein. The substrate holder 6a has a holder section 3 which is a disk for fixing the optical disk 1, and an arm section 4a for supporting a holder section 3 at its center. This holder section 3 fixed the optical disk substrate 1 to the film-formation chamber 2a.

The optical disk substrate 1 is fixed by an inner mask 11 and an outer mask 12 to the holder section 3, and a film is formed only in an area S of the optical disk substrate exposing from the inner mask 11 as well as from the outer mask 12 (film-formed area).

In the first embodiment, a through-hole 7a (indicated by a dash and dot line) for vacuum chuck is provided in the arm section 4a, and vacuum chuck section is provided in the holder section 3. With the vacuum chuck section as described above, the optical disk substrate 1 is more tightly fixed to the holder section 3.

Figure 3:
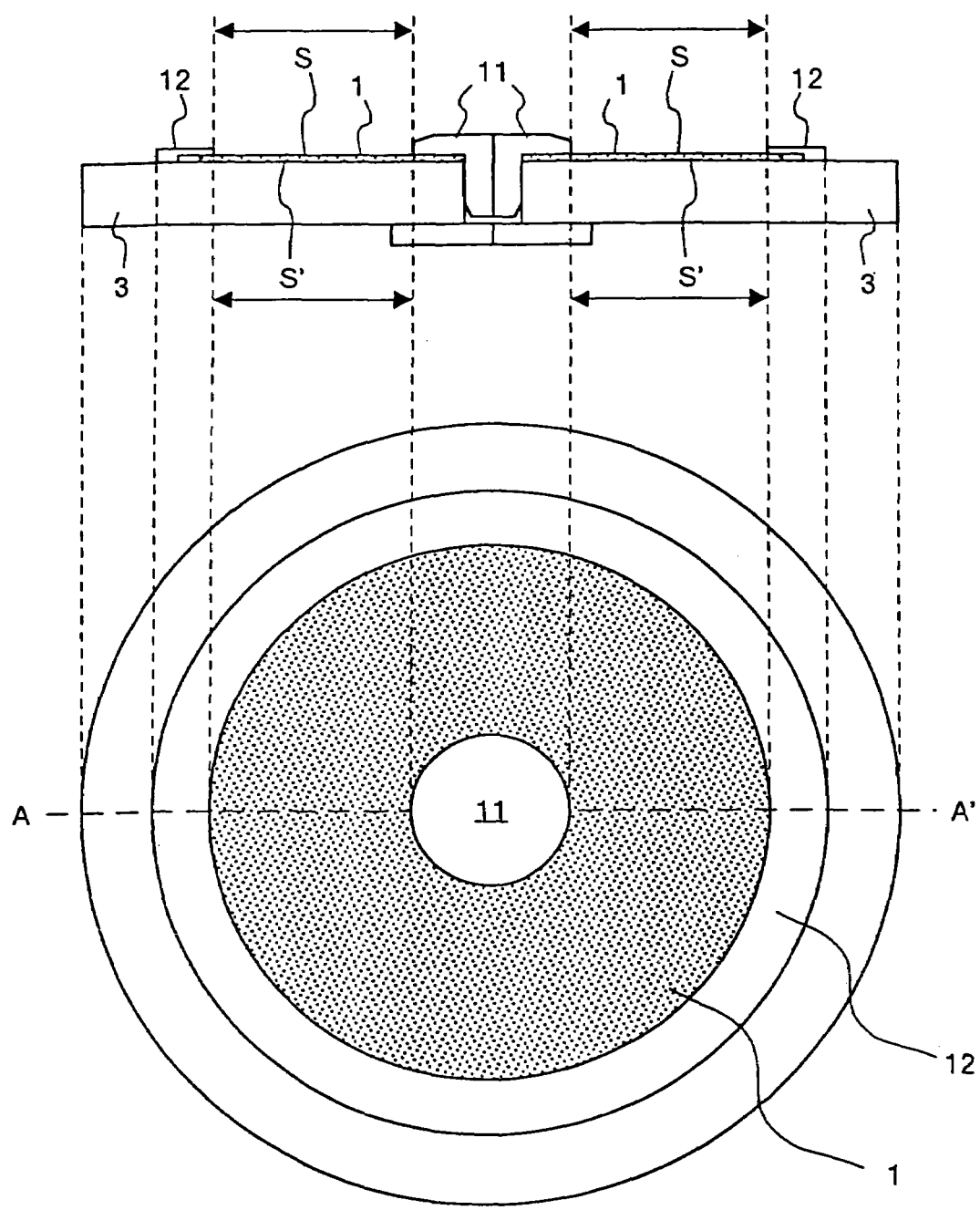
FIG. 3 is a view showing configuration of a holder section according to the first embodiment, and shows a top section of the holder section (lower) and a cross section (lower) taken along the dashed line A-A' shown in the upper view.

FIG. 3 shows a basic configuration of the holder section 3 described above. On the top is a cross-sectional view of the holder section 3, while on the bottom is a top view of the holder section 3. The cross-sectional view shown in FIG. 3 is taken along the dash line A-A' in the upper view. As shown in FIG. 3, the holder section 3 has the inner mask 11 for fixing the optical disk substrate 1 at a position close to a central point of the optical disk substrate 1 and the outer mask for fixing the optical disk substrate 1 at a position close to a periphery section of the optical disk substrate 1. Both the inner mask 11 and outer mask 12 cover a portion of the optical disk substrate 1, and fix the optical disk substrate 1 holding the optical disk substrate between it and an upper surface of the holder section 3. Because of this configuration, of a surface of the optical disk substrate 1, only portions not fixed by the inner mask 11 and outer mask 12 is a film-formed section S. In the first embodiment, the radius of the inner mask 11 is 20 mm, while the radius of the outer mask is 59 mm.

In the first embodiment, entire rear surface of the film-form section S and a top surface of the holder section 3 beneath the film-formed area S are closely contacted to each other, and the upper section of this holder section 3 is a contact support surface S'. Scopes of the film-formed area S and contact support surface S' are indicated by arrows close thereto respectively. A member (protection member) having hardness smaller than that of a rear surface of the area 1 of the optical disk substrate 1 is provided on the contact support surface S', and as the member is tightly contacted to a rear surface of the optical disk substrate 1, generation of damages to a rear surface of the optical disk substrate 1 is prevented. A surface which is in the rear side during film formation is a surface onto which a light beam is introduced when reading out data therefrom. Because of this feature, generation of damages to a light beam incidence surface of an optical disk is prevented with the quality improved.

Figure 4:
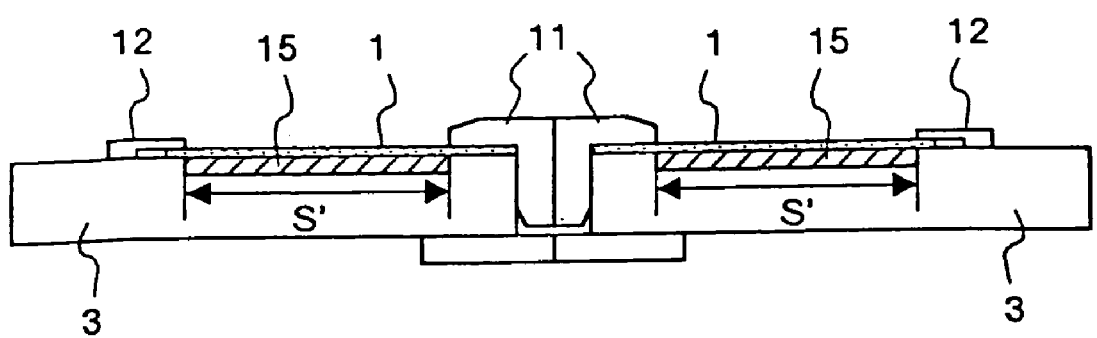
FIG. 4 shows a state in which a silicon rubber section is provided in a contact holding surface S' of the holder section according to the first embodiment.

At present, a polycarbonate substrate is often used as the optical disk substrate 1, so that conceivably a silicon member with the hardness smaller than that of polycarbonate is used. FIG. 4 shows a state in which a silicon rubber section 15 is provided on a contact support surface S' of the holder section 3.

The optical disk substrate film-formation apparatus according to the first embodiment having the configuration as described above forms an optical disk in the following manner. At first, the optical disk substrate 1 is fixed by the inner mask 11 and outer mask 12 of the substrate holder 6f as well as vacuum chuck onto an upper surface of the holder section 3. The fixed optical disk substrate 1 is carried through the carry-in/carry-out port 20 shown in FIG. 1 into the optical disk substrate film-formation apparatus. In this step, a rear surface of the optical disk substrate 1 is closely contacted to the contact support surface S'.

The substrate holder 6f is then set to the film-formation chambers 2a to 2e successively, and forms each layer such as a dielectric body layer, and a storage layer. The conditions for forming the film are as described below:

1. ZnS.SiO$_2$ film (dielectric body layer)
   Input power: 3 KW
   Air pressure in the film-formation chamber (Ar gas pressure): 0.27 Pa ($2 \times 10^{-3}$ Torr)
2. AgInSbTe film (storage layer)
   Input power: 0.4 KW
   Air pressure in the film-formation chamber (Ar gas pressure): 0.27 Pa ($2 \times 10^{-3}$ Torr)
3. ZnS.SiO$_2$ film (upper dielectric body layer)
   Input power: 0.4 KW
   Air pressure in the film-formation chamber (Ar gas pressure): 0.27 Pa ($2 \times 10^{-3}$ Torr)
4. Al film (Reflection layer)
   Input power: 9 KW
   Air pressure in the film-formation chamber (Ar gas pressure): 0.27 Pa ($2 \times 10^{-3}$ Torr)

The pressure in this substrate carriage chamber in this step is 0.013 Pa ($1 \times 10^{-4}$ Torr).

When film formation is finished, in the optical disk substrate film-formation apparatus according to the first embodiment, a magnetic member (not shown) for removing the inner mask 11 and outer mask 12 is moved above the optical disk substrate 1. The inner mask 11 and outer mask 12 are attracted to the magnetic member due to magnetism generated between the optical disk substrate 1 and the magnetic member, and is removed from the holder section 3. In this step, the optical disk substrate 1 is closely contacted by the vacuum chuck to the contact support section S'. A robot for sucking the optical disk substrate (not shown) goes closer to a central section of the optical disk substrate 1 with the inner mask 11 and outer mask 12 having been removed therefrom to such the optical disk substrate 1 and remove it from the contact support surface S'. With the operation described above, the processing sequence executed in the optical disk substrate film-formation apparatus is finished.

In the optical disk substrate film-formation apparatus and optical disk substrate film-formation method each according to the first embodiment of the present invention, the optical disk substrate 1 is closely contacted to the contact support surface S', so that deformation of the optical disk substrate 1 hardly occurs during film formation. Because of this feature, deformation of the optical disk substrate 1 can be suppressed.

The present invention is not limited to the first embodiment as described above. In the first embodiment, a protection member with the hardness smaller than that of the optical disk substrate 1 is provided. However, in place of the configuration as described above, for instance, a step of forming a protection film on a rear surface of the optical disk substrate 1 (rear surface protection film formation step) may be provided before the film formation step. As the rear surface protection film formation step, a step of spin-coating UV hardened resin on a rear surface of the optical disk substrate 1 may be considered.

Further, a step of previously forming a protection film by sputtering on a rear surface of the optical disk substrate 1 is conceivable. When forming a protection film in the way described above, the formed protection film is any one of a silicon nitride film, a silicon oxide film, a titanium nitride film, a film made from compounds of indium, titanium, or oxygen or a laminated film from some of the materials described above. As described above, when a protection film is formed on a rear surface of the optical disk substrate 1, it is not required to provide any specific protection member on the contact support surface S' of the holder section 3, and the mother stainless steel (such as a stainless) may be used as it is.

Figure 5:
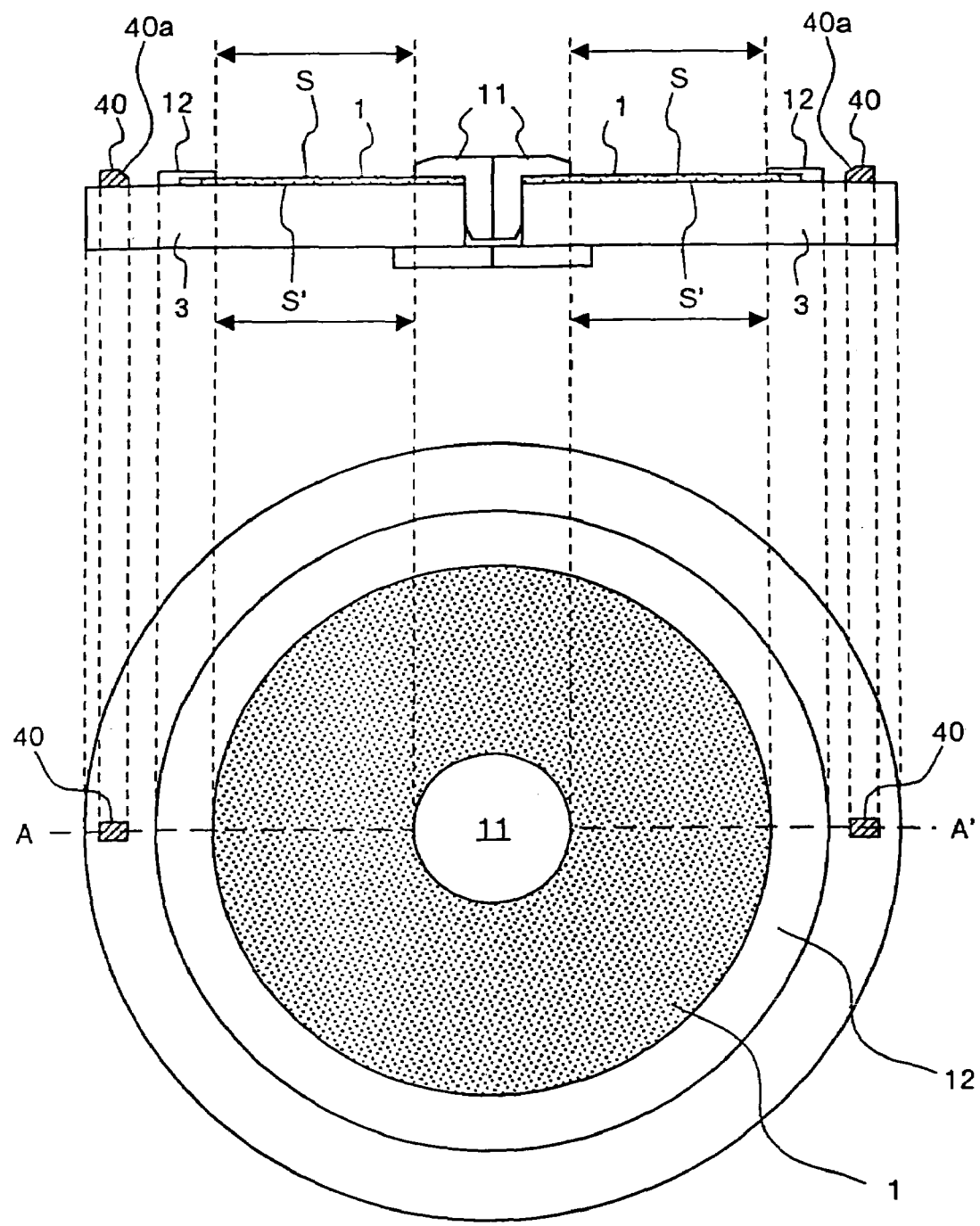
FIG. 5 shows configuration in which a claw is provided in the holder section shown in FIG. 2.

Further in the first embodiment, for instance, as shown in FIG. 5, a claw section 40 for peeling off the optical disk substrate 1 with the inner mask 11 and outer mask 12 having been removed therefrom from the contact support surface S' may be provided therein. FIG. 5 shows the same configuration as that shown in FIG. 3 excluding the claw section 40, so that the same reference numerals are assigned to the same components as those shown in FIG. 3, and description thereof is omitted herein. The claw section 40 moves toward a center of an optical disk substrate as shown in the figure. This movement range is, for instance, from the position shown in the upper cross-section view in FIG. 5 up to 2 mm inner from a peripheral section of the optical disk substrate 1 (up to 58 mm on the diameter in the case of an optical disk with a diameter of 60 mm).

The claw section 40 moves up to by 2 mm inside toward the optical disk substrate 1 with the inner mask 11 and outer mask 12 having been removed therefrom. In association with this movement, an inclined section 40a of the claw section 40 goes into a section between a rear surface of the optical disk substrate 1 and a top surface of the holder section 3, and functions to mechanically peel off the optical disk substrate 1 from the contact support surface S'. Because of this feature, a robot for removing an optical disk substrate can suck the optical disk substrate 1 with a relatively weak sucking force.

With the configuration as described above, it is possible to weaken the sucking force sufficiently adsorbing the optical disk substrate 1 during film formation in the removal step, and even when a thinner optical disk substrate 1 is used, it is possible to prevent the optical disk substrate from being broken in the removal step.

Figure 6:
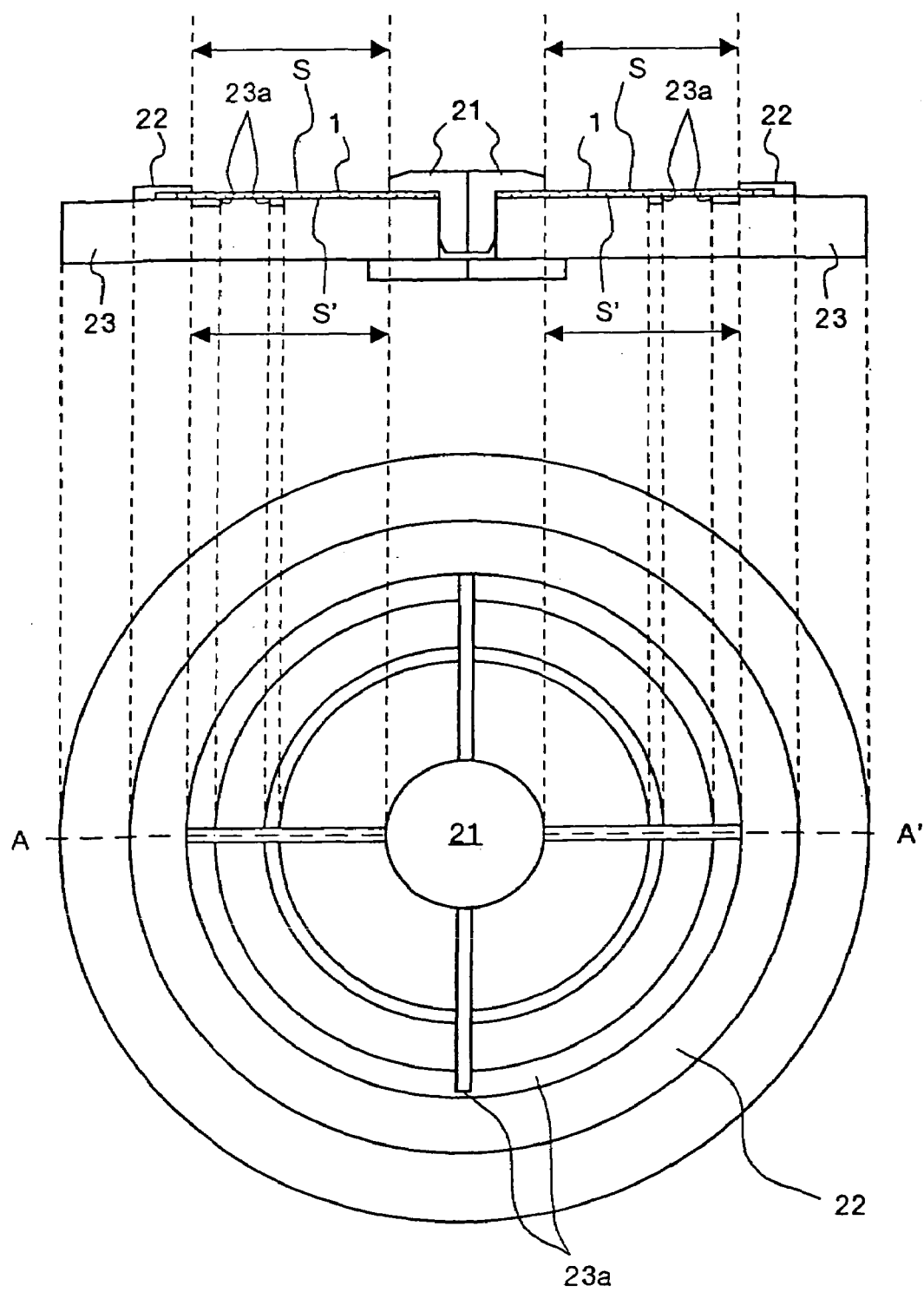
FIG. 6 shows a top section of a holder according to the second embodiment (upper), and a cross section (lower section) taken along the line A-A' shown in the lower view.

A second embodiment of the present invention is described below. In the second embodiment, a groove section is provided in the contact support surface S' of the holder section 3 described above. FIG. 6 shows a cross section of a holder 23 having a groove section according to the second embodiment (upper view) a top surface thereof (lower view). The cross section shown in FIG. 6 is taken along the line A-A' in the lower view in FIG. 6. The cross-sectional view in FIG. 6 shows a state where the optical disk substrate 1 is fixed, and the top view shows, now the optical disk substrate film-formation apparatus 1, but an upper section of the holder section 23.

As shown in FIG. 6, the holder section 23 has an inner mask 21 and an outer mask 22 like the holder section 3. A groove section 23a is provided on a contact support surface S' of this holder section 23. The groove section 23a according to the second embodiment has a form in which two straight lines crossing each other at right angles at a center of the holder section 23 and two concentric circles having the same center as that of the holder section 23.

With the configuration as described above, in the second embodiment, the contact support surface S' and optical disk substrate 1 are partially and closely contacted to each other, and the vacuum-chucked optical disk substrate 1 can be removed with a relatively weak force. Because of this feature, the sucking force of the robot for removing an optical disk substrate can be set to a relatively lower level, and even when the optical disk substrate 1 is thin, it is possible to prevent the optical disk substrate 1 from being broken in the removal step.

The present invention is not limited to the second embodiment described above. For instance, any form of the groove section 23 provided on the holder section 23 is allowable on the condition that a proportion between an area where the optical disk substrate 1 is closely contacted to the contact support surface S' and an area in which the optical disk substrate 1 is off from the latter is appropriate.

The optical disk substrate film-formation apparatus according to the third embodiment of the present invention has, like the optical disk substrate film-formation apparatus according to the first embodiment described above, a substrate carriage chamber 10 and at least a film-formation chamber 2a, and a substrate holder is positioned between the substrate carriage chamber 10 and film-formation chamber 2a. Further, a through-hole communicating to the substrate carriage chamber 1o as well as to the film-formation chambers 2a to 2e is provided (Description of the third embodiment assumes that the optical disk substrate film-formation apparatus has film-formation chambers 2a to 2e, and through-holes are provided in all of this substrate holders). Further, a pressure in each of the film-formation chambers 2a to 2e in which film formation is being executed is kept higher than that in the substrate carriage chamber.

Figure 7:
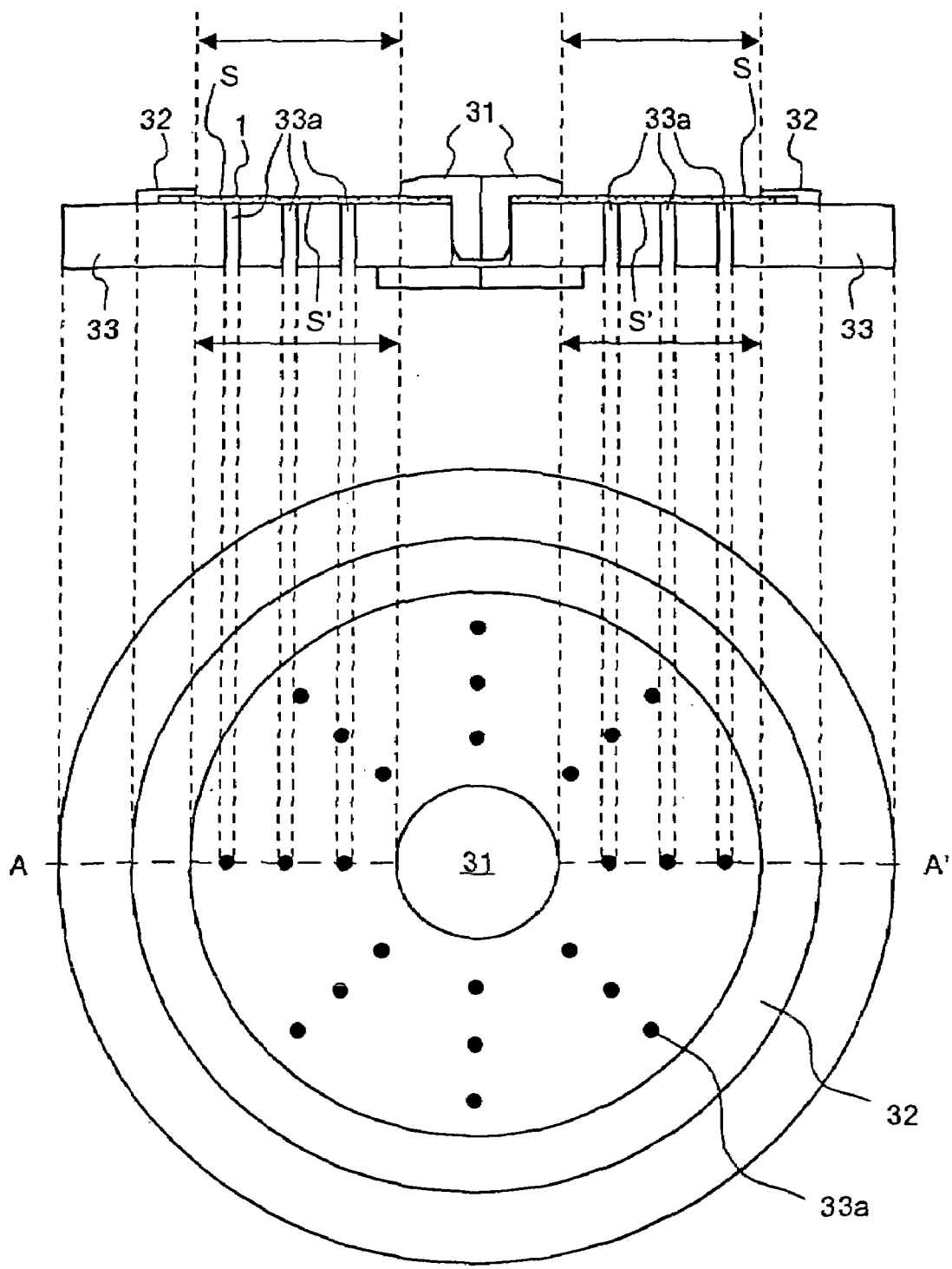
FIG. 7 shows a top section of a holder section (lower) according to the third embodiment, and a cross section (upper) taken along the dashed line A-A in the lower view.

The third embodiment of the present invention is described below. FIG. 7 shows a cross section of the holder section 33 having a through-hole 33a according to the third embodiment (upper view) and a top section thereof (lower view). The cross section shown in the lower view is taken along the line A-A' in the lower view. In FIG. 7, the cross-sectional view shows a state in which the optical disk substrate 1 is fixed, and the top view shows not the optical disk substrate 1, but a top section of the holder section 33.

As shown in FIG. 7, the holder section 33 has an inner mask 33 and an outer mask 32. Through-holes 33a are provided in the contact support surface S' of the holder section 33. The through-holes 33a according to the third embodiment are provided in the radial directions as shown in the top view in FIG. 7, and edges in one side thereof are connected to the film-formation chambers 2a to 2e, while the other edges thereof are connected to the substrate carriage chamber 10.

In the optical disk substrate film-formation apparatus according to the third embodiment having the configuration as described above, the optical disk is formed in the following manner. At first, the optical disk substrate 1 is fixed with the inner mask 31 and outer mast 32 of the substrate holder 6f to a top surface of the holder section 33. The optical disk substrate is then carried into the optical disk substrate film-formation apparatus from the carry-in/carry-out port 20 shown in FIG. 1. In this step, portions of the optical disk substrate 1 excluding the through-holes 33a are tightly contacted to the contact support surface S' of the holder section 33.

In the next step, the substrate holder 6f is successively set to the film-formation chambers 2a to 2e, and each film is formed on the optical disk substrate 1 fixed to the substrate holder 6f under the conditions for film formation as described in the first embodiment. The film-formation conditions described in the first embodiment include a pressure in each of the film-formation chambers 2a to 2e of 27 Pa ($2 \times 10^{-3}$ Torr). On the other hand, a pressure in the substrate carriage chamber 10 is 0.013 Pa ($1 \times 10^{-4}$ Torr). Therefore, the optical disk 1 is tightly contacted to the contact support surface S' excluding the through-holes 33a due to the pressure difference during the film formation.

With the configuration as described above, in the third embodiment, the optical disk substrate 1 can tightly be contacted to the holder section 33 during film formation without using vacuum chuck. Because of this feature, even in the environment not using a vacuum chuck, the optical disk substrate film-formation apparatus according to the present invention can be used, which improves convenience in use of the optical disk substrate film-formation apparatus. In addition, there is no need of providing a dedicated vacuum chuck so that the configuration of the optical disk substrate film-formation apparatus is simplified.

Because of the features as described above, vacuum chuck for the optical disk substrate 1 disappears without the need of controlling for release of vacuum chuck immediately when film formation is finished. Therefore, even when the optical disk substrate 1 is thin, it is possible to prevent the optical disk substrate 1 from being broken in the removal step.

The present invention is not limited to the third embodiment described above. For instance, any location and form of the through-holes 33a provided in the holder section 33 are allowable on the condition that a proportion of an area where the optical disk substrate 1 closely contact the contact support surface S and an area where the former is off from the latter is acceptable.

Examination of Results in the First to Third Embodiments

Inventors of the present invention carried out testing for film formation using the optical disk substrate film-formation apparatuses and the optical disk substrate film-formation method as described above. The inventors measured the maximum warping amount of each substrate to verify the effect obtained in each of the embodiments. The maximum warping amount as defined herein indicates a warping amount of a portion which warps most in an optical disk substrate on which a film has been formed. The warping amount is defined in some cases with an angle between an ideal surface of an optical disk substrate and a tangent to a surface of the actual optical disk substrate (described as the maximum warping angle), and in other cases with a positional difference as expressed in term of length between an ideal surface of an optical disk substrate and a surface of the actual optical disk substrate (described as maximum warping amount hereinafter).

1. EXAMPLES OF THE MAXIMUM WARPING ANGLE

Optical disk substrate on which a film is formed with the optical disk substrate film-formation apparatus and method based on the conventional technology: 4 degrees Optical disk substrate on which a film is formed with the optical disk substrate film-formation apparatus and method according to the first embodiment: 0.6 degree (Contact support surface: Silicon rubber, nor protection film on a rear surface thereof), or 0.5 degree (Contact support surface: stainless, Protection film on a rear surface thereof: UV hardened resin)

Optical disk substrate on which a film is formed with the optical disk substrate film-formation apparatus and method according to the first embodiment: 0.5 degree (Contact support surface: stainless, protection film on a rear surface thereof: UV hardened resin)

Optical disk substrate on which a film is formed with the optical disk substrate film-formation apparatus and method according to the third embodiment: 0.5 degrees (Contact support surface: stainless, protection film on a rear surface thereof: UV hardened resin)

2. EXAMPLES OF THE MAXIMUM WARPING AMOUNT

Figure 9:
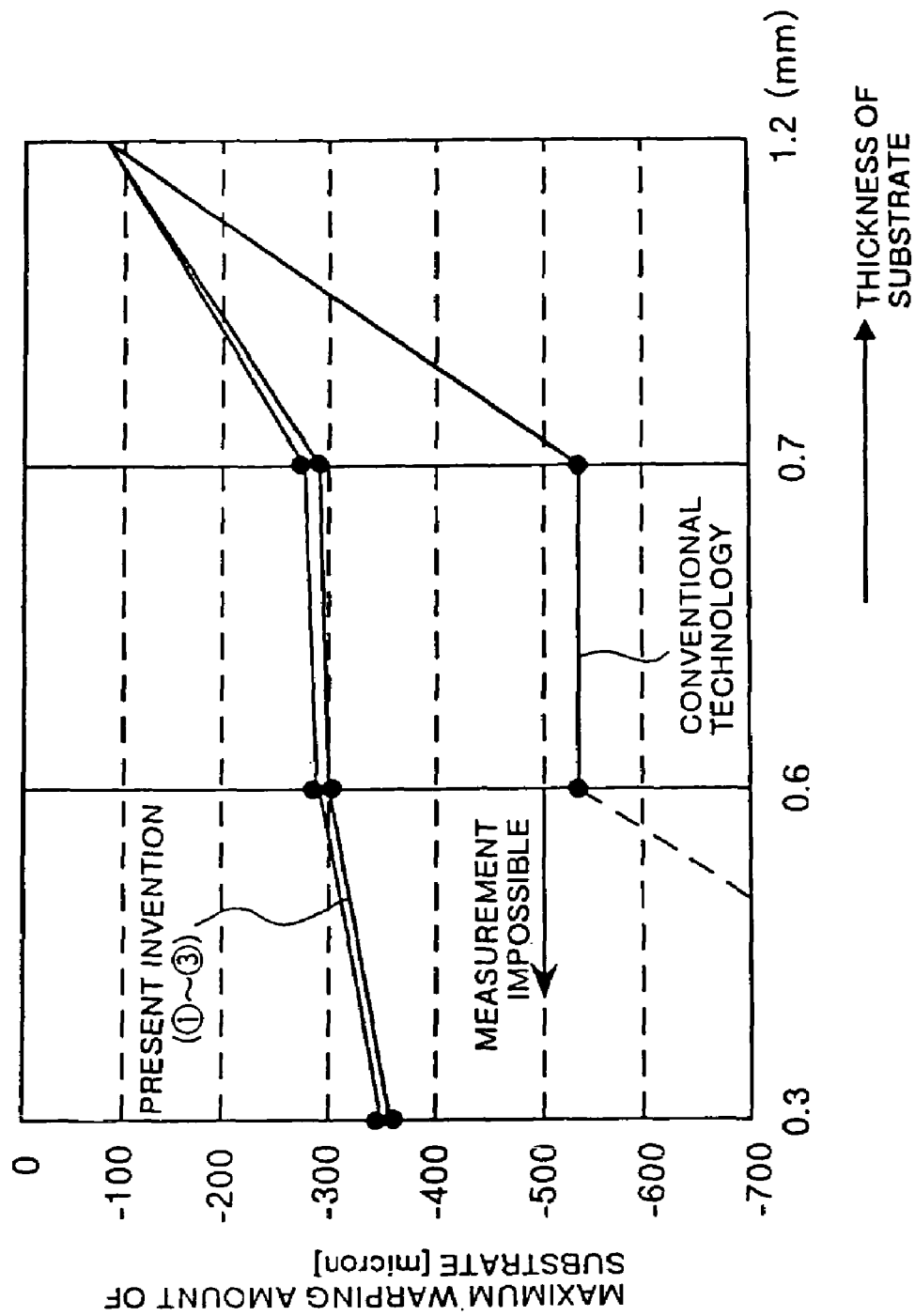
FIG. 9 is a view showing contents shown in FIG. 8 in a form of graph.

FIG. 8 shows a result of testing on film formation on optical disk substrates having thickness of 1.2 mm, 0.7 mm, and 0.3 mm with the optical disk substrate film-formation apparatuses and methods according to the first to third embodiments of the present invention to compare the maximum warping amount obtained in the testing to that obtained when film formation is performed on optical disk substrates having the same thickness with optical disk substrate film-formation apparatus and method based on the conventional technology. FIG. 9 is a graph showing the relation between the maximum warping amount and thickness of each optical disk substrate shown in FIG. 8. The third embodiment ③-1 is different from the third embodiment ③-2 in its shape of a holder, and the third embodiment ③-1 corresponds to a case where the holder section 23 shown in FIG. 6 is used, and the third embodiment ③-2 shows a case where the holder 33 shown in FIG. 7 is used.

In FIG. 8 and FIG. 9, the maximum warping amount in an optical disk substrate with the thickness of 0.6 mm used for an adhesion type of optical disk is 500 μm, and that when film formation is performed with the present invention is in a range from 290 to 300 μm , so that the maximum warping amount clearly decreases to one half. In the process of manufacturing the adhesion type of optical disks, a substrate with a film having been formed thereon is adhered to another one in the post-processing step to correct the warp. In the case of a substrate with the maximum warping amount of 550 μm, it is difficult to reduce the warp to a level required to satisfy the requirements for the product. With the present invention, the maximum warping amount is in a range from 290 to 300 μm, and it is fully possible to reduce the warping amount by means of adhesion to the allowable range.

Further, with the first to third embodiments of the present invention, even in the case of a substrate having thickness of 0.6 mm or less, it is possible to reduce the maximum warping amount to less than 400 μm. As described above, with the present invention, it is possible to realize an adhesion type of optical disks using a substrate having the thickness of 0.6 mm or less.

Figure 10:
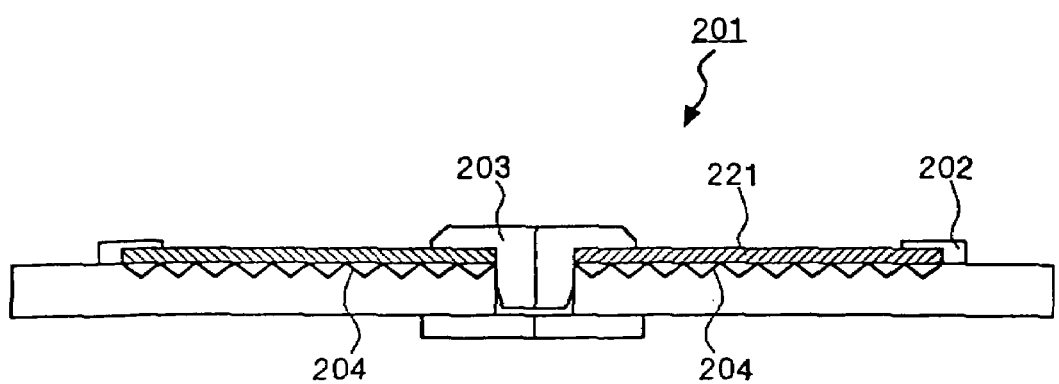
FIG. 10 is a cross-sectional view showing a substrate holder according to a fourth embodiment of the present invention, and shows a state in which the substrate holder is holding a substrate.
Figure 11:
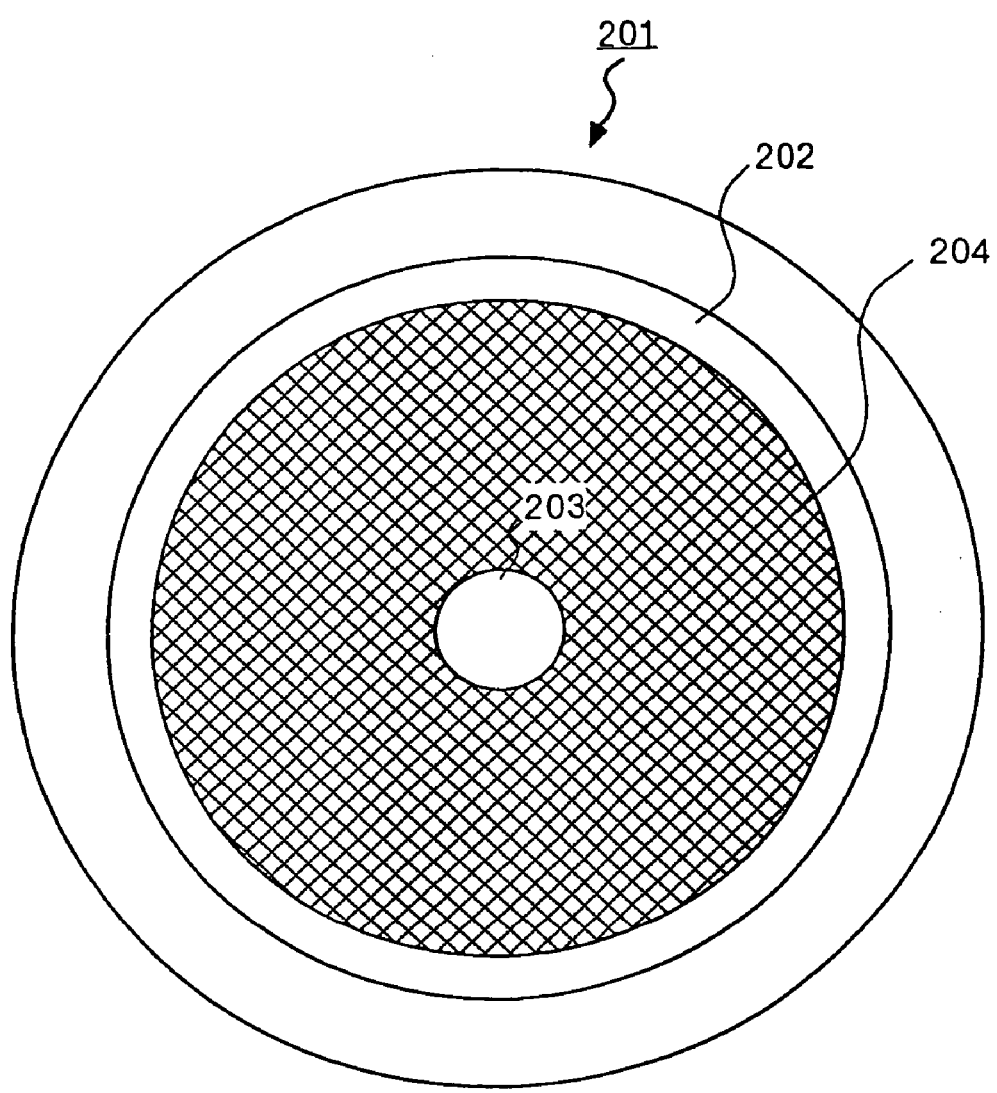
FIG. 11 is a flat view showing the substrate holder shown in FIG. 10, and shows a state before a substrate is held thereon.

FIG. 10 shows a cross section of a substrate holder 201 according to the fourth embodiment in a state where the substrate holder 201 is holding an optical disk substrate 221. FIG. 11 is a top view of the substrate holder shown in FIG. 10, and shows a state before the substrate holder 201 holds the optical disk substrate 221. In FIG. 10 and FIG. 11, the reference numeral 202 indicates an outer mask, while the reference numeral 203 indicates an inner mask. Entire surface of this substrate holder 202 contacting a rear surface of the substrate 221 is subjected to the processing for roughing by sand blast machining, and the surface roughness Rmax of this roughed section (rough surface section) is in a range from 40 μm to 50 μm.

A polycarbonate substrate with the thickness of 0.6 mm obtained by means of injection molding is used as the optical disk substrate 221 and is held with the substrate holder 201. This holder is set in a sputtering film-formation apparatus and a $ZnS.SiO_2$ layer, AgInSbTe layer, and Al layer are formed as a dielectric body layer, a recording layer, and a reflection layer respectively.

When forming a film, the substrate 221 is placed on the substrate holder 221, a central portion of the substrate 221 is fixed with the inner mask 203, a peripheral portion of the substrate 221 is fixed with the outer mask 202, and thus a desired thin film is formed by sputtering. In this testing, a total film thickness after film formation is in a range from 350 to 400 μm.

EXAMPLES 1, 2 FOR COMPARISON

Figure 12:
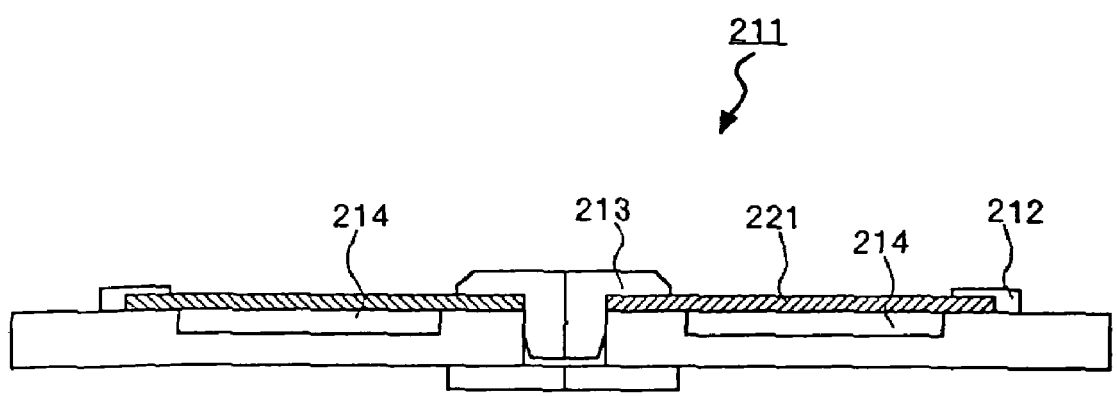
FIG. 12 is a cross-sectional view showing a substrate holder based on the conventional technology, and shows a state where a substrate is loaded thereon.

As substrate holders for comparison, (1) a substrate holder 211 based on the conventional technology shown in FIG. 12, and (2) a substrate holder (not shown) with the entire surface of the substrate holding surface machined to a flat plane (not subjected to the roughing processing) which holds a substrate in a state where the substrate holder closely contacts the entire rear surface of the substrate 221 are prepared as substrate holders for comparison, and a desired thin film is formed by sputtering under the same conditions as those in the fourth embodiment. The result of comparison between the fourth embodiment and the examples 1, 2 for comparison is shown in Table 1. In FIG. 12, designated at the reference numeral 212 is an outer mask, at 213 an inner mask, at 214 a groove, and at 221 an optical disk substrate.

TABLE 1

| Structure of a holder | Warp of a substrate (Inclination angle) | Situation of taking out a substrate |
|---|---|---|
| Substrate holder based on the conventional technology (Refer to FIG. 12) | Measurement impossible (Large deformation) | A substrate can smoothly be taken out. |
| Substrate holder contacting a substrate (Contacting an entire surface) | 0.5 to 1 degree | A substrate is tightly adhered to a holder, and can not be taken out smoothly. |

TABLE 1-continued

| Structure of a holder | Warp of a substrate (Inclination angle) | Situation of taking out a substrate |
|---|---|---|
| Substrate holder according to the present invention (Refer to FIG. 10 and FIG. 11) | 0.5 to 1 degree | A substrate can smoothly be taken out. |

As clearly shown in Table 1, deformation of a substrate can be suppressed by applying the present invention, and in addition a substrate can smoothly be carried out from a substrate holder. As a result, with the present invention, high quality film-formed substrates (without any warp) can be manufactured at high productivity (excellent adaptability for being carried out). On the contrary, in the case of substrate holders in the examples 1 and 2, a substrate is largely deformed, or can not smoothly be carried out from a substrate holder. A large warp is observed, although the adaptability for being taken out from a substrate holder is excellent, in the substrate holder shown in FIG. 12 because a groove is provided thereon.

A substrate holder with the surface roughness Rmax in a range from 40 μm to 50 μm is prepared by roughing a portion of or entire surface of the substrate holding surface by means of sand blasting and further by executing organic plating with triazinethiol to this roughed surface. The organic plating is executed, like in the ordinary plating with metal, in an electrolytic solution, and in this process not a metallic film, but a triazinethiol organic film is formed. In this processing with triazinethiol, it is possible to control only a thickness of the film with high precision, and in addition the adaptability for lubrication and water-repelling performance which can not be achieved in a metallic film can be obtained. Therefore, with a facility similar to that used for metallic plating, an organic film made from triazinethiol can easily be prepared. With this feature, there are provided the advantages not only that it can be manufactured with relatively low cost, but that it can hardly be peeled off even at a high temperature.

The fifth embodiment is explained below. The substrate holder according to the fifth embodiment of the present invention is subjected to the roughing processing and the processing for lubricating a surface thereof with a triazinethiol organic film, in addition to the effect of preventing warping of a substrate, the following effects are obtained; (1) the adaptability for being smoothly taken out (stability and easiness in the removal step) is further improved as compared to a holder subjected to the roughing processing, and (2) damages to a rear surface of a substrate taken out are reduced. It is conceivable that the effects (1) and (2) are realized because the adaptability for being lubricated is given to a substrate holding surface of the substrate holder.

The sixth embodiment is explained below. A portion of a substrate holding surface of a substrate holder is made from PTFE like in the fourth embodiment. For that purpose, a PTFE plate with one surface thereof previously roughed by sand blasting is manufactured, and the PTFE plate is adhered to a specified portion of the substrate holder. Although a substrate holder and a mask used in a sputter device are generally made from metallic material, in this embodiment, by forming only a portion contacting a substrate with a plastic material having the excellent self-lubricating capability, it is possible to prevent damages to the substrate. As a result, the effects of preventing warping of a substrate, improving the adaptability when being taken out, and reducing the possibility of damage of the substrate are obtained like in the fourth embodiment. POM (polyacetal) resin or the like may be used in the PTFE. Further, by using a self-lubricating plastic material in a portion of a substrate holder, desired effects can be obtained without largely changing structure and specification of the substrate holder. Namely by using an expensive material only in a required portion of a substrate holder and also by using a metallic material in other sections thereof, a holder according to the present invention can be realized without causing const increase.

The fourth and fifth embodiments of the present invention are described above, but no problem occurs even when such parameters as surface roughness are made larger within a range where no deformation of a substrate occurs. Application of the present invention is not limited to a substrate holder for a device to process an optical disk substrate by sputtering, and the present invention can successfully be applied also a substrate holder for executing the sputtering processing to various types of substrate with a small thickness which are easily deformed.

Figure 13:
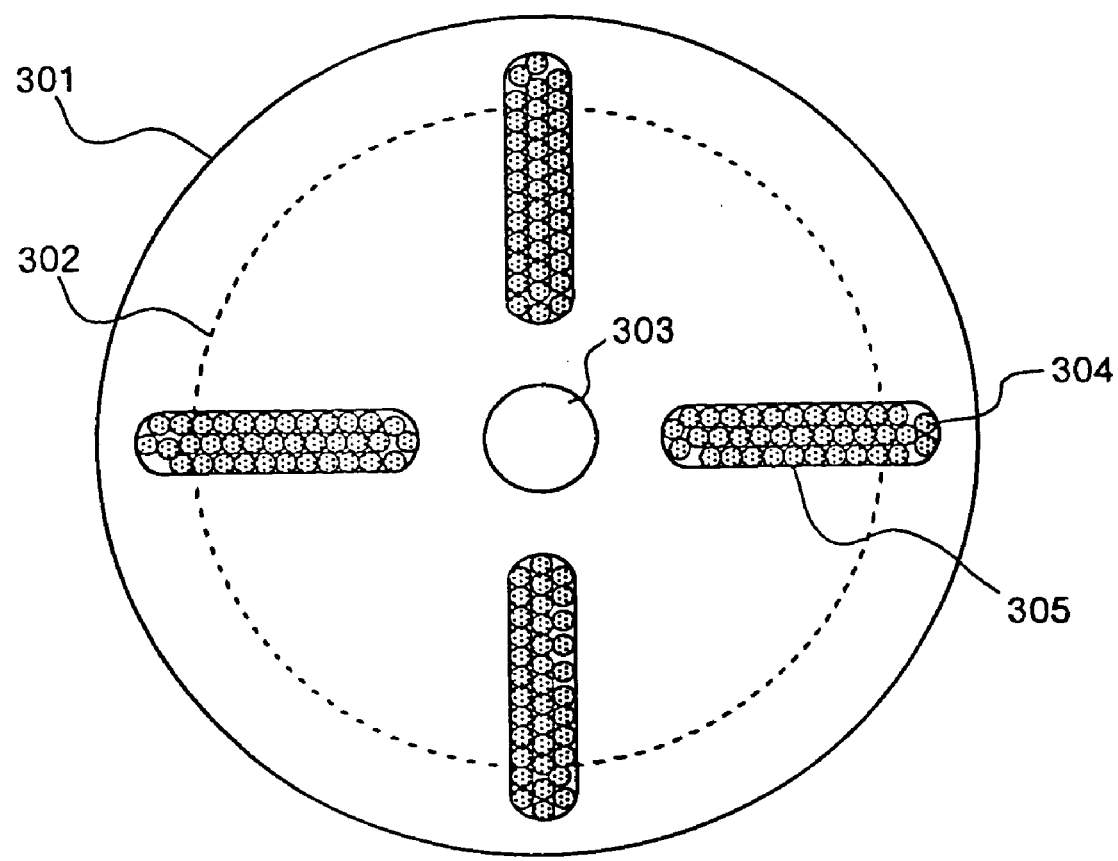
FIG. 13 is a general flat view showing a key section in a seventh embodiment of the present invention.
Figure 14:
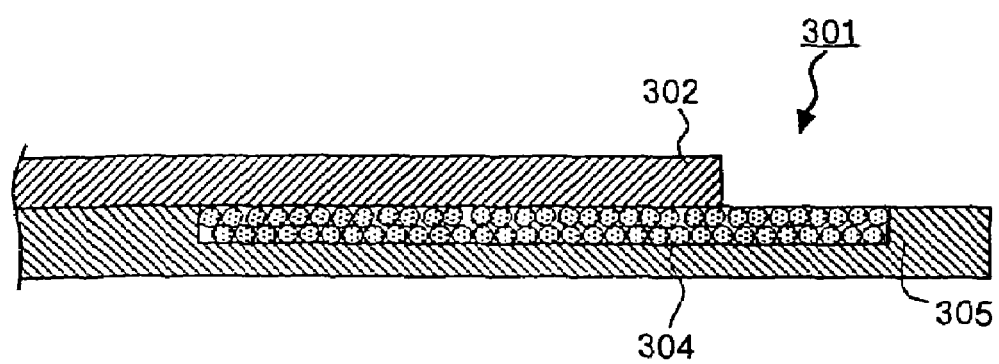
FIG. 14 is a general cross-sectional view showing the substrate holder according to the seventh embodiment and an optical recording medium substrate loaded on the substrate holder.
Figure 15:
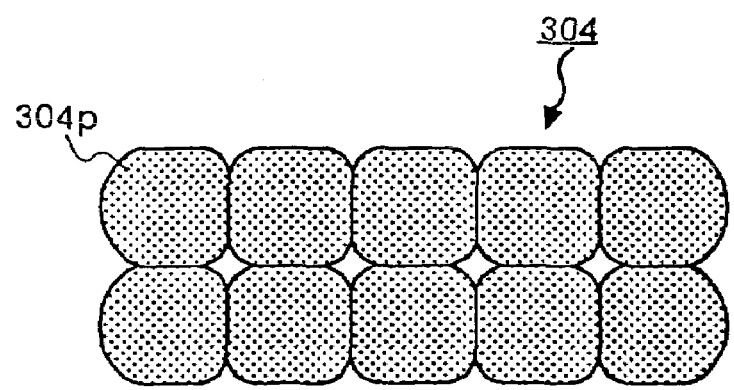
FIG. 15 shows an example of a form of a porous member used in the substrate holder according to the present invention.

FIG. 13 is a general flat view showing the seventh embodiment of the present invention. Reference numeral 301 indicates a substrate holder, reference numeral 302 indicates a substrate for an optical recording medium, reference numeral 303 indicates a center hole section, reference numeral 304 indicates a porous section, and reference numeral 305 indicates a groove section. FIG. 14 is a partial view showing a general cross sections of the substrate holder 301 and a substrate 302 of an optical recording medium set in the substrate holder 301 in the seventh embodiment. FIG. 15 is a view showing an example of a form of the porous member 304 used in a substrate holder according to the present invention, and the reference numeral 304p in the figure indicates a plane section thereof.

In this seventh embodiment, the groove section 305 is provided in the substrate holder 305, and the gas-permiable porous member 304 is provided in the groove section 305. The groove section 305 extends from inside of an area where the substrate holder 305 contacts a substrate 302 to an area in which the substrate holder 305 does not contact the substrate, and the porous member 304 has an area where the member contacts the substrate 302 and an area in which the member is exposed in a space in a vacuum vessel. In this step, a surface of the porous member 304 is adjusted to the same level as a surface of the substrate holder 301.

Figure 16:
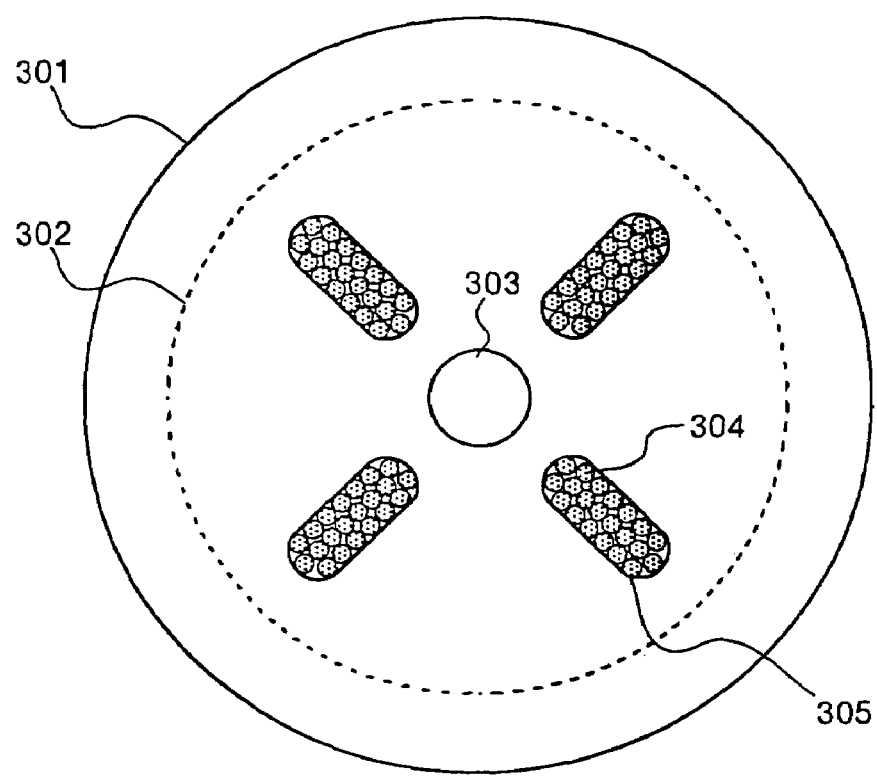
FIG. 16 is a general flat view showing a key section in an eighth embodiment of the present invention.
Figure 17:
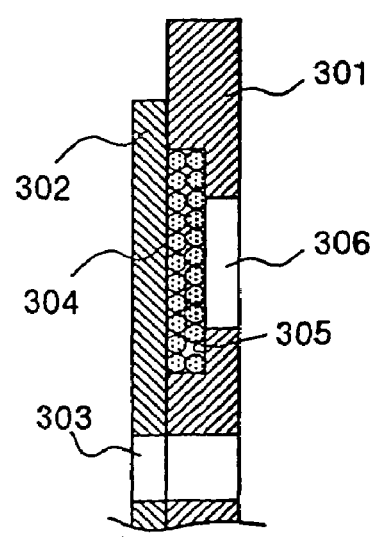
FIG. 17 is a general partial cross-sectional view showing a substrate holder according to the eighth embodiment of the present invention, and a optical recording medium substrate loaded on the substrate holder.

FIG. 16 is a flat view showing a general configuration of a key section in the eighth embodiment of the present invention. FIG. 17 is a partial cross-sectional view showing a general configuration of the substrate holder 301 and the substrate 302 of an optical recording medium loaded on the substrate holder 301.

In this eighth embodiment, the groove section 305 is provided in a portion contacting a surface of the plastic substrate 302 in which a film is not formed thereon, and the porous member 304 is positioned in the groove section 305. In addition, a through-hole 306 having a smaller area than that of the porous member 304 is provided on a rear surface of the porous member 304. The area of this through-hole 306 is smaller than the area of the porous member 304 so as to insure a surface for stabling holding the porous member 304.

In the seventh and eighth embodiments, a surface of the porous member 304 has the same height as that of a surface of the substrate holder 301 in which the substrate holder 301 contacts a substrate. With the configuration as described above, deformation of the plastic substrate 302 is prevented, further, air can easily pass through the member because it is porous, so that it is possible to prevent troubles in carriage (such as failure of a transport robot in taking up the substrate 302 or deformation of the robot arm associated with the failure) air-tight contact (vacuum adsorption) between the substrate holder 3-1 and substrate 302 in the step of taking out a substrate.

Preferably the porous member 304 is made from a material with high conductivity so that temperature distribution will not occur inside the substrate holder 301 due to thermal energy received by the substrate holder 301. Further, it is preferable to prevent the generation of minute damages on the surface of the substrate. Therefore, the porous material is formed from a material with a polymeric material coated on the surface thereof or from an elastic material.

The porous member 304 can be obtained by molding particles by means of hot forming or press forming under the room temperature, and the gas-permeability is realized because of a continuous space between particles. A material with high thermal conductivity which can be used as a material for this porous member 304 is preferably a relatively soft metal ball with a small diameter and having excellent thermal conductivity made from such metals as Ag, Au, Cu, Al, Mg, or brass. When the metal ball is used as it is, contact between the metal balls and the substrate 302 is a point contact because of the shape of ball, and the contact is not stable. Therefore, it is preferable to mold the metal balls by pressing (under the room temperature) or by hot pressing for forming a flat section 304p in a portion of every ball. The flat portion should be formed only on a surface contacting the substrate 302; and the porous member 304 may be cut to form a flat section thereon.

As a polymeric material or an elastic material used for the porous member 304, when uniformity of temperature distribution in the substrate holder 301 can be maintained (for instance, within ±5 degree centigrade, a single material may be used, but when the uniformity can not be maintained, it is better to use a mixture of several materials with high electric conductivity or excellent thermal conductivity for the porous member 304. The materials with high electric conductivity or excellent thermal conductivity suited for mixing include inorganic conductive materials such as fine particles of Ag, and powder of black lead, and organic conductive materials such as tetrafluoroborate or tetra-n-butyl ammonium.

Example of substrate holder according to the seventh and eighth embodiments of the present invention are described below.

EXAMPLE 1

Spherical copper particles each having a diameter of about 0.5 to 1 mm are molded to prepare the porous material 304 by loading a pressure thereon so that a void will be formed by 10 to 40 volumetric percent and also so that the molded member will place itself into a rectangular groove section 305 with the depth of 2.0 mm, width of 10 mm, and length of 30 mm formed on a plastic plane substrate set surface of the substrate holder 301. This porous member 304 is set in the groove section 305 so that a surface thereof is included in the same plane as the substrate set surface of the substrate holder 301. A polycarbonate substrate 302 for an optical disk with the size of 120 $\phi$ and thickness of 0.6 mm is set on the substrate holder 301 obtained as described above. The rectangular groove section 305 is positioned so that a length of an area contacting a rear surface of the substrate 302 is around 20 mm and a length of an area off from the substrate 302 is around 10 mm. A stainless-steel mask is positioned in the front surface side of the porous member 304 in the area off from the substrate 302 so that the substance used for film formation will not directly be deposited thereon.

Using the substrate holder 301 described above, a first dielectric body layer with the thickness of around 150 nm, a recording layer with the thickness of around 30 nm, a second dielectric body with the thickness of around 20 nm, and a reflection layer with the thickness of around 60 nm are successively formed in a vacuum. Temperature of the substrate 302 for an optical disk increases on its film-formation surface to a range from 110 to 125 degree centigrade, but temperature distribution in the substrate holder 301 is within ±2 to 3 degree centigrade even after 1000 sheets of substrate are manufactured, and mechanical deformation of the substrate 203 does not occur. No trouble occurs during carriage of a substrate in the vacuum device. Further, a result of assessment of performance of the optical disk showed that degree of tilt in the radial direction and in the tangential direction are ±0.40 degree, ±0.15 degree respectively, and no signal fault is observed when data is deleted.

EXAMPLE 2

Spherical copper particles each having a diameter of about 0.5 to 1 mm are molded to prepare the porous material 304 by loading a pressure thereon so that a void will be left by 10 to 40 volumetric percent and also so that the molded member will place itself into a rectangular groove section 305 with the depth of 1.5 mm, width of 10 mm, and length of 20 mm formed on a plastic plane substrate set surface of the substrate holder 301. This porous member 304 is set in the groove section 305 so that a surface thereof is included in the same plane as the substrate set surface of the substrate holder 301. Dimensions of the rectangular groove sections 305 are set in such a manner that, when the substrate holder 301 for an optical disk is set on the substrate holder 301, the groove section 305 is completely covered with the substrate 302. In addition, a rectangular through-hole 306 with the width of 5 mm and length of 10 mm is formed at a center of the groove section in the substrate holder 301. When films made from various materials are formed on a substrate for an optical disk in the completely same operating sequence as that in Example 1, an excellent result similar to that in Example 1 can be obtained.

EXAMPLE 3

A small quantity of adhesive polymeric material with black lead powder mixed therein (For instance, an alkyl-based coating agent containing a carbon filler: Dotite XC12 produced by Fujikura Kasei) is coated on a surface of cupper particles or plastic particles each having a diameter of about 0.5 to 1 mm to form the porous member 304, and then testing is executed like in Examples 1 and 2 using the porous member 304 solidified to the same dimensions as those in Examples 1 and 2. A result of assessment of thermal deformation and performance thereof as an optical disk is excellent like in Example 1.

EXAMPLE FOR COMPARISON 3

Using a holder with four through-holes each with the size of 10 $\phi$, films made from various materials are formed on a substrate for an optical disk under the same conditions for film formations as those in the examples described above. Temperature of the substrate rises up to a range from 110 to 125 degree centigrade. In this step, mechanical deformation is observed. However, as the through-holes are provided, failure in taking out a substrate after film formation does not occur. Further the performance as an optical disk is assesses, and degrees of tilt in the radial direction or in the tangential direction is in a range from ±1.20 to 2.50 degree or more, and ±0.70 to 2.50 degree or more, and no abnormality is observed in deleting recorded data.

EXAMPLE FOR COMPARISON 4

Using a substrate holder with four through-holes each with the size of 10 φ, films from various types of material are formed on a substrate for an optical disk under the same conditions for film formation as those employed in the examples described above. Temperature of the substrate similarly rises to a range from 110 to 125 degree centigrade. Mechanical deformation of a substrate is observed in this step. However, through-holes are provided in the substrate, no failure occurs in taking out a substrate after film formation. Further the performance as an optical disk is assessed, and degrees of tilt in the radial direction and tangential directions are ±1.20 to 2.50 degree or more, and ±0.70 to 2.50 degree or more respectively, and no failure occurs in deleting recorded data.

EXAMPLE FOR COMPARISON 4

A plane holder not having any through-hole nor a groove section therein is used as a substrate holder, and films made from various types of material are formed on a substrate for an optical disk under the same conditions for film formation like those in the examples described above. Increase of temperature is like that in the Example 3 for comparison, but in this step, mechanical deformation is not observed. In the assessment of performance as an optical disk, the same result as that in Example 1 is obtained. However, failure in taking up a substrate occurs at the probability of around 10% because air-tight adsorption occurs on a substrate.

Figure 18:
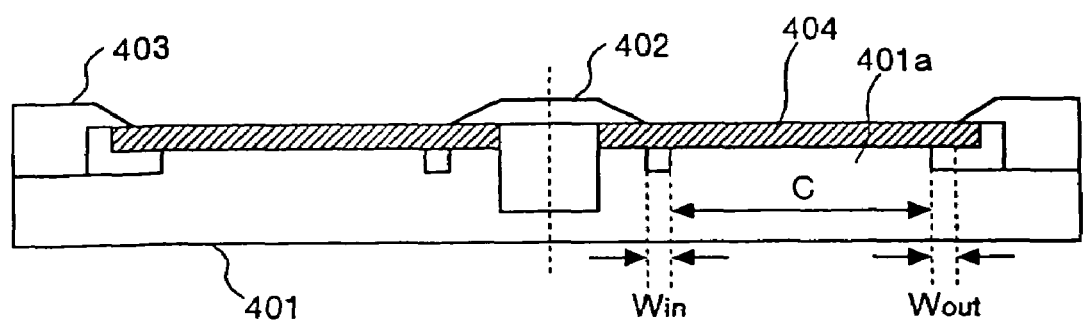
FIG. 18 is a general block diagram showing a key section of an optical disk substrate film-formation apparatus according to a ninth embodiment of the present invention.

FIG. 18 shows general configuration of a key section of an optical disk substrate film-formation apparatus according to the ninth embodiment of the present invention. In FIG. 18, designated at the reference numeral 401 is a substrate holder, designated at 401a is a substrate holding section which is a portion of a rear surface of a substrate where a film is formed thereof and the substrate holder contacts the substrate, designated at 402 is an inner mask, designated at 403 is an external mask, designated at 404 is a substrate, and the sign Win indicates a width from an outer-side edge of the internal mask 402 to an inner side edge of the substrate holding section 401a, while the sign Wout indicates a width from an inner-side edge of the outer mask 403 to an outer-side edge of the support holding section 401a. The inner mask 402 having a diameter of 41 mm is used. Further, the outer mask 403 covering from the utmost outer periphery of the substrate 404 up to 0.5 mm inner therefrom is used. A range C in which a rear surface of the substrate 404 contacts the substrate holder 401 is from a position by 4 mm outer from an outer edge of the inner mask 402 to a position by 1 mm inner from an inner edge of the outer mask (namely, Win=4 mm, and Wout=1 mm).

Figure 19:
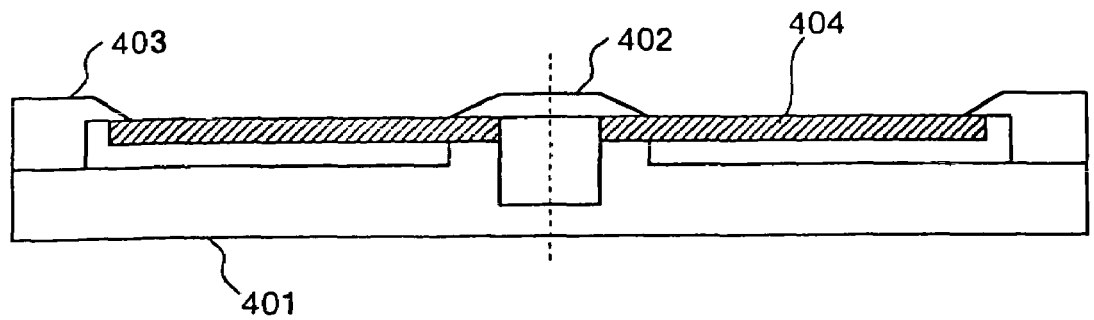
FIG. 19 is a general block diagram showing a key section of an example for comparing a difference in the film-formation performance from that in the optical disk substrate film-formation apparatus according to the ninth embodiment due to a different in construction thereof.

Optical disks each having the configuration shown in FIG. 21 are prepared by using the structure as described above. Any of the optical disks is manufactured by the RF magnetron sputter method, and the so-called sheet type of sputter device is used. For comparison, an optical disk is manufactured with a substrate holder having the structures shown in FIG. 19 and FIG. 20 under the same conditions. The substrate holder shown in FIG. 20 has the configuration like that in the conventional technology, and as the substrate holder 401 contacts an entire rear surface of the substrate 404, influence over warping of a substrate is small, but a trouble may easily occur during transportation of the substrate.

Figure 20:
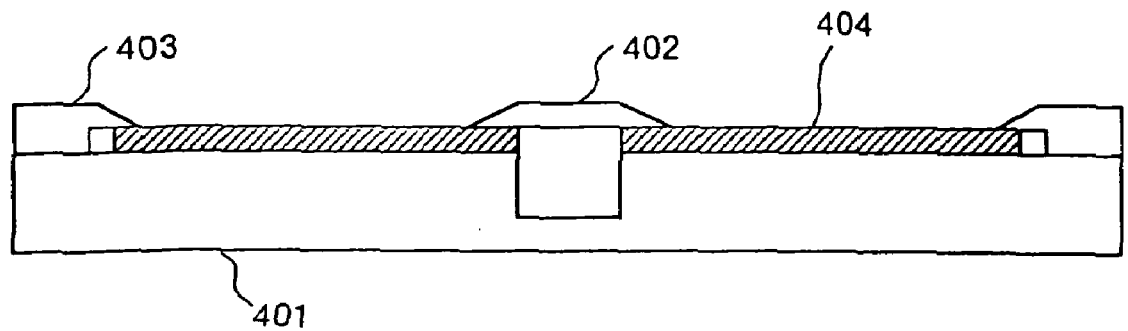
FIG. 20 is a general block diagram showing a key section of another example for comparing a difference in the film-formation performance from that in the optical disk substrate film-formation apparatus according to the ninth embodiment due to a different in construction thereof.

A result of comparison of warping amounts of these disks is shown in FIG. 22. The warping amount is shown as a positional difference at 58 mm in the radial direction between before and after film formation. As a result, in the present invention, a disk showing the same warping amount as that in the configuration shown in FIG. 20 is obtained.

Samples No. 1 to No. 14 are prepared not by changing the form of the substrate holder shown in FIG. 18, but by changing the dimensions of Win and Wout as shown in FIG. 23. Film formation is carried out on the samples (sample No. 1 has the same configuration as that in the ninth embodiment) under the same conditions as those in the ninth embodiment, and a warping amount of each substrate and a number of substrates which are not loaded on or off to and from a substrate holder when film formation is executed continuously. From the result shown in FIG. 23, it is understood that, to suppress the warping amount of the substrate to a level of around 100 µm and also to smoothly execute operation of loading on or off the substrate, the substrate holding section of the substrate holder has to be contacted to the substrate under the condition that Win is between 2 to 10 mm and Wout is between 0.5 to 5 mm.

Figure 25:
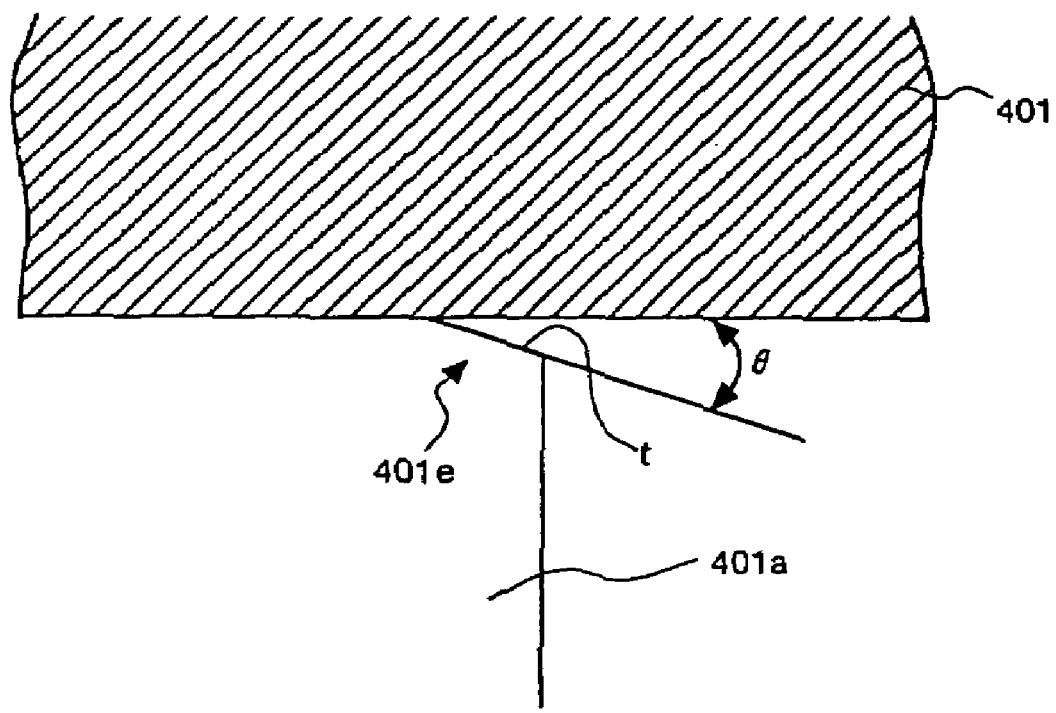
FIG. 25 is a partial view showing a form of taper at an edge section in a substrate holding section of a substrate holder according to an eleventh embodiment of the present invention.

FIG. 25 is a partial view showing a general configuration in the eleventh embodiment of the present invention. In this embodiment, an edge section 401e of a substrate holding section 1a of the substrate holder used in the ninth embodiment and shown in FIG. 18 is tapered. As samples of substrate holder having the tapered form as described above, samples No. 15 to No. 21 are formed as shown in FIG. 24, and each of the samples is assessed by executed film formation thereon under the same conditions as those in the ninth embodiment. Further, a surface of the substrate in which the substrate 404 and edge section 401e contact to each other is observed with a microscope. The taper angle θ of the tapered section is defined herein as an angle between a surface of the substrate holder 401 contacting a substrate and a tapered surface t of the tapered section.

As understood from the result shown in FIG. 24, when the taper angle θ of the edge section is between 0 to 0.5 degree, generation of damages in a portion of a substrate with a film formed thereon is observed, and when the angle is 1.0 degree or more, no damage is observed. As for deformation (warping amount) of a substrate, when the taper angle θ is between 0.5 to 2.0 degree, the warping amount is 100 µm like that when a tapered form is not introduced (when the taper angle is 0 degree), but when the taper angle is 2.5 degree, the warping amount increase to 150 µm, and when the taper angle is 3.0 degree, the warping amount further increases to 200 µm. Therefore, by giving a taper angle θ in a range from 1.0 to 2.0 degree, a warping amount of a substrate can be reduced, and further generation of damages to a substrate caused by the edge section 401e of the substrate holder can be prevented.

Figure 27:
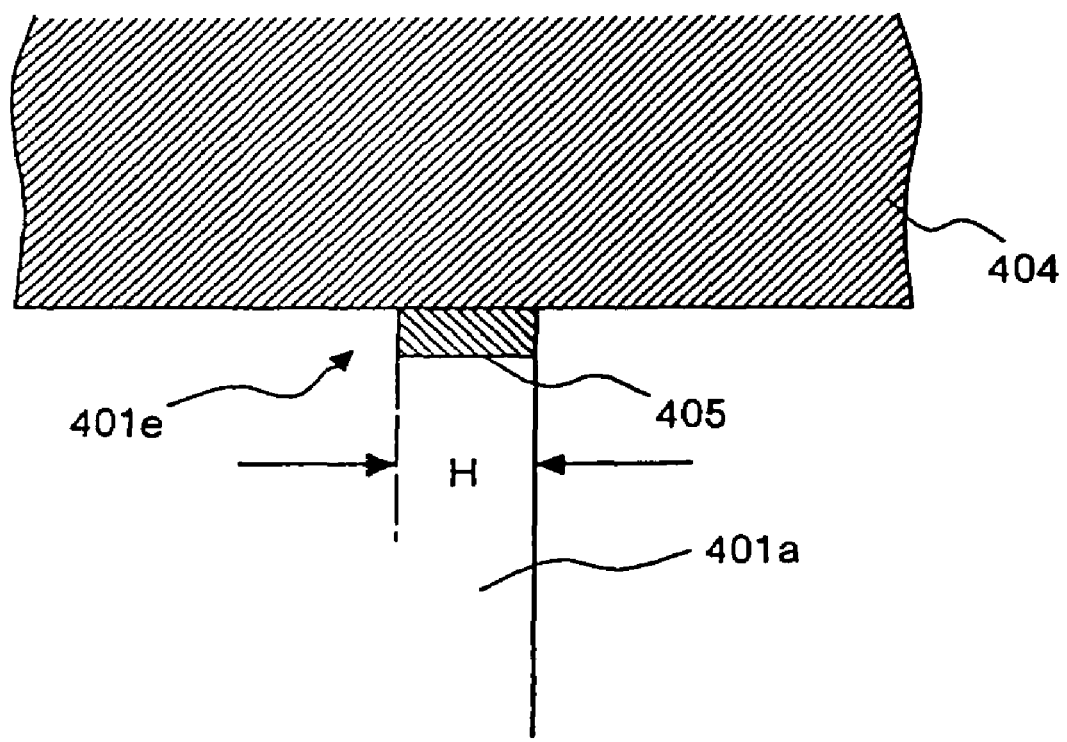
FIG. 27 is a block diagram showing a portion of the silicon rubber provided in an edge section of a substrate holder according to a twelfth embodiment of the present invention.

FIG. 27 shows a general configuration in the twelfth embodiment of the present invention. In this embodiment, a silicon rubber member 405 with a width H is provided in the edge section 401e having the configuration used in the ninth embodiment described above and shown in FIG. 18. The width H is defined herein as a length of the silicon rubber member 405 in the radial direction of the substrate 404 as shown in FIG. 27. With the configuration shown in FIG. 27, samples of substrate holder No. 22 to No. 27 are manufactured as shown in FIG. 26, and firm formation is performed on each of the samples under the same conditions as those in the eleventh embodiment, and assessment is carried out. As shown in FIG. 26, with the configuration according to this embodiment, a warping amount of a substrate can be suppressed to around 100 m, and also damages to a substrate by the edge section 401e of the substrate holder can be prevented. When the width H of the silicon rubber member is less than 0.1 mm, mechanical load to the edge section 401e due to deformation of a substrate can not be evaded, and when the width H is 0.5 mm or more, suppression of deformation of a substrate can not be expected. Although a silicon rubber member is used for the edge section 401e in this embodiment, the effects obtained in this embodiment are not limited to the one obtained when the silicon rubber is used, and any material such as a molded resin body may be used so far as the hardness is lower than that of a substrate.

Figure 28:
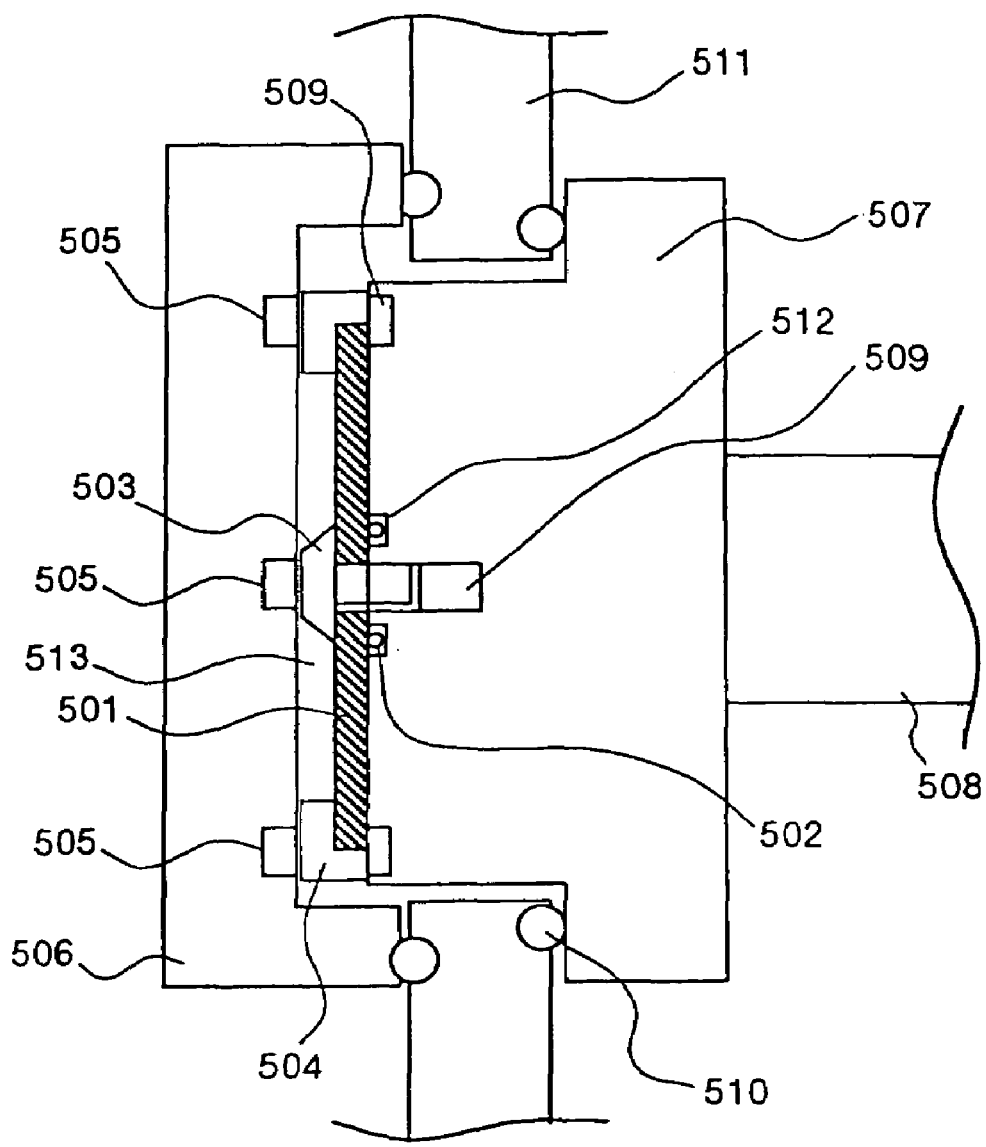
FIG. 28 is a general cross-sectional view showing an optical disk substrate film-formation apparatus.

FIG. 28 shows a cross section of a load lock chamber in a general optical disk substrate film-formation apparatus according to the thirteenth embodiment. Designated at the reference numeral 501 is a substrate, designated at 502 is a stack ring, designated at 503 is an inner mask, designated at 504 is an outer mask, designated at 505 is an electric magnet. Designated at 506 is a substrate holder for carrying a substrate to outside of an optical disk substrate film-formation apparatus (described as a substrate for outward carriage hereinafter). Designated at 507 is a substrate holder for carrying a substrate to inside of the optical disk substrate film-formation apparatus (described as a substrate holder for inward carriage). Designated at 508 is an arm for carrying a substrate into an optical disk substrate film-formation apparatus. Designated at 509 is a magnet, 501 is an O-ring, and 511 is a load lock chamber. In this thirteenth embodiment, an optical disk substrate film-formation apparatus having the configuration as shown in the figure is described, but the present invention is not limited to this configuration.

Figure 29:
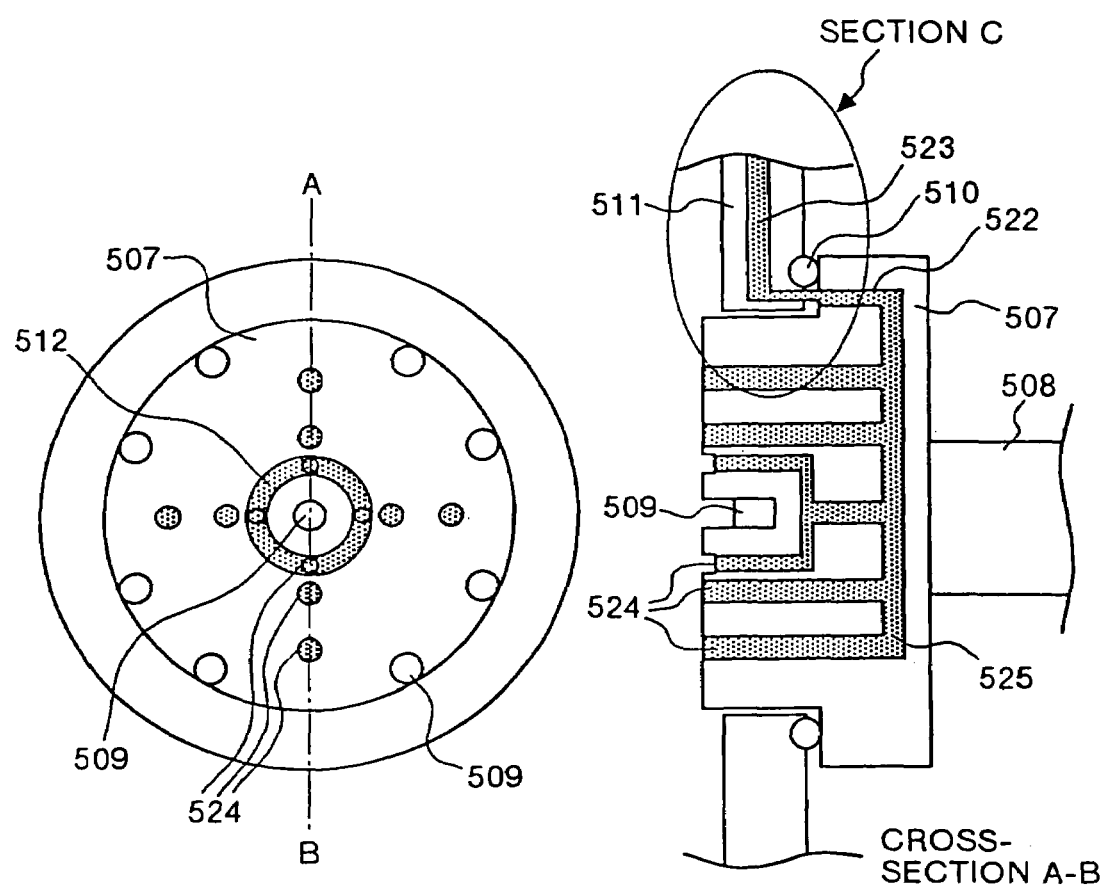
FIG. 29 shows an example of a substrate holder section used in an optical disk substrate film-formation apparatus according to a thirteenth embodiment of the present invention.

With respect to the optical disk substrate film-formation apparatus according to the present invention, a substrate holder section in which the present invention is applied is shown in FIG. 29. Designated at the reference numeral 522 is a gas supply port in the side of a frame of the optical disk substrate film-formation apparatus (described as frame-side gas supply port hereinafter). Designated at 523 is a gas supply path in the side of a frame of the optical disk substrate film-formation apparatus (described as frame-side gas supply path), designated at 524 is a substrate holder-side gas supply port, and designated at 525 is a substrate holder-side gas supply path.

At first, the step of carrying into or out a substrate from an optical disk substrate film-formation apparatus is described below with reference to FIG. 28. The substrate 501 is placed on an inner mask 503 and an outer mask 504 magnetically attached to an electric magnet 505 in a substrate holder 506 for outward carriage, and is carried to a load lock chamber 513. In this step, a closed space for the load lock chamber 513 is formed by the substrate holder 506 for outward carriage, substrate holder 507 for inward carriage, and frame 511 of the optical disk substrate film-formation apparatus. The electric magnet 505 for the substrate holder 506 for outward carriage is then turned OFF, and the inner mask 503, outer mask 504, and substrate 501 are magnetically fixed by the magnet 509 provided on the substrate holder 507 for inward carriage, and are carried out from the optical disk substrate film-formation apparatus.

By making a substrate holder based on the structure shown in FIG. 29, the problem of vacuum adsorption between a substrate and a substrate holder in carrying out a substrate from an optical disk substrate film-formation apparatus can be solved.

In FIG. 29, in a state where the substrate holder 507 for inward carriage is located at a specified position in the load lock chamber 513, the frame-side gas supply path 523 is communicated to the substrate holder-side gas supply path 525. This linkage is realized by linking the frame-side gas supply path 523 and the substrate holder-side gas supply path 525 with the O-ring or the like for insuring air-tightness, or by linking the two sections without air-tightness. As the method to insure the air-tightness, in addition to the method described above, various methods including a method of giving a taper are available. The difference between communication with air-tightness and communication without air-tightness is described later.

FIG. 29 shows communication without air-tightness. The configuration is described below. Substrate holder-side gas supply ports 524 are holes each having a diameter of 2 mm, and three holes are provided in the radial direction in each quadrant, and one of the three holes is provided in the stack-ring preventing groove 512. Positions of the substrate holder-side gas supply ports are limited within an area where a substrate covers a substrate holder. There is no restriction over a form, location, size, and a number of the substrate holder-side gas supply ports 524, nor is restriction over a form of the substrate holder-side gas supply path 525. R machining of 0.5 mm is provided on an edge section of each substrate holder-side gas supply port 524. The value of R machining is not limited to that described above, and an appropriate value may be employed according to size, position, or other parameters of the substrate holder-side gas supply port 524. By providing the R machining, damages caused by contact between the substrate holder-side gas supply port 624 and a rear surface of a substrate can be reduced. In addition, by lubricating a surface of a substrate holder, damages to a rear surface of a substrate can further and substantially be reduced.

In this thirteenth embodiment, triazine is used for lubrication of a surface of a substrate holder, the material for lubrication is not limited to triazine, and complex plating with water-repelling powder of carbon fluoride (CF)n or fluororesin (PTFE, PFE, FEP) or the processing for water repulsion using a chlorosilane-based chemical adsorbent is also effective.

With the configuration described above, after film formation by sputtering is finished, when the substrate holder 507 for inward carriage returns to a specified position in the load lock chamber 513, the frame-side gas supply path 523 and substrate holder-side gas supply path 525 are communicated to each other. In the next step, inside of the load lock chamber is ventilated, and the substrate is vacuum-chucked to the substrate holder, but by supplying nitrogen from the frame-side gas supply path 523 via the substrate holder-side gas supply path 525 to the substrate holder-side gas supply port 524, the substrate is easily separated from the substrate holder, and can be carried by the substrate holder 506 for outward carriage to outside of the optical disk substrate film-formation apparatus. In this step, a pressure of supplied gas is $1.1 \times 10^5$ Pa (1.1 bar), but any level of pressure may be used so long as the pressure is higher than the atmospheric pressure. Further, the supplied gas is not limited to nitrogen gas, and any gas may be used on the condition that the gas is not dangerous.

In this testing, the gas supplied from the frame-side gas supply path 523 via the substrate holder-side gas supply path 525 to the substrate holder-side gas supply port 524 was also used for ventilating inside of the load lock chamber 513, and in that case, the substrate was not vacuum-chucked to a substrate holder, and could be carried out by the substrate holder 506 for outward carriage to outside of the optical disk substrate film-formation apparatus. The pressure of supplied gas used in this step is set to $0.1 \times 10^5$ Pa (0.1 bar) in the initial stage, and then to $1.1 \times 10^5$ Pa (0.1 bar) in 0.5 second, but the pressure level is not limited to these values. As compared to a case where the gas is not used for ventilation of inside of the load lock chamber, the sufficient effect of separating a substrate from a substrate holder can be obtained even at a low pressure level of supplied gas, which is specific to this method.

A difference between a case where the frame-side gas supply port 522 and substrate holder-side gas supply path 525 are communicated with air-tightness and a case where the two sections are communicated to each other without air-tightness is described below.

Figure 30:
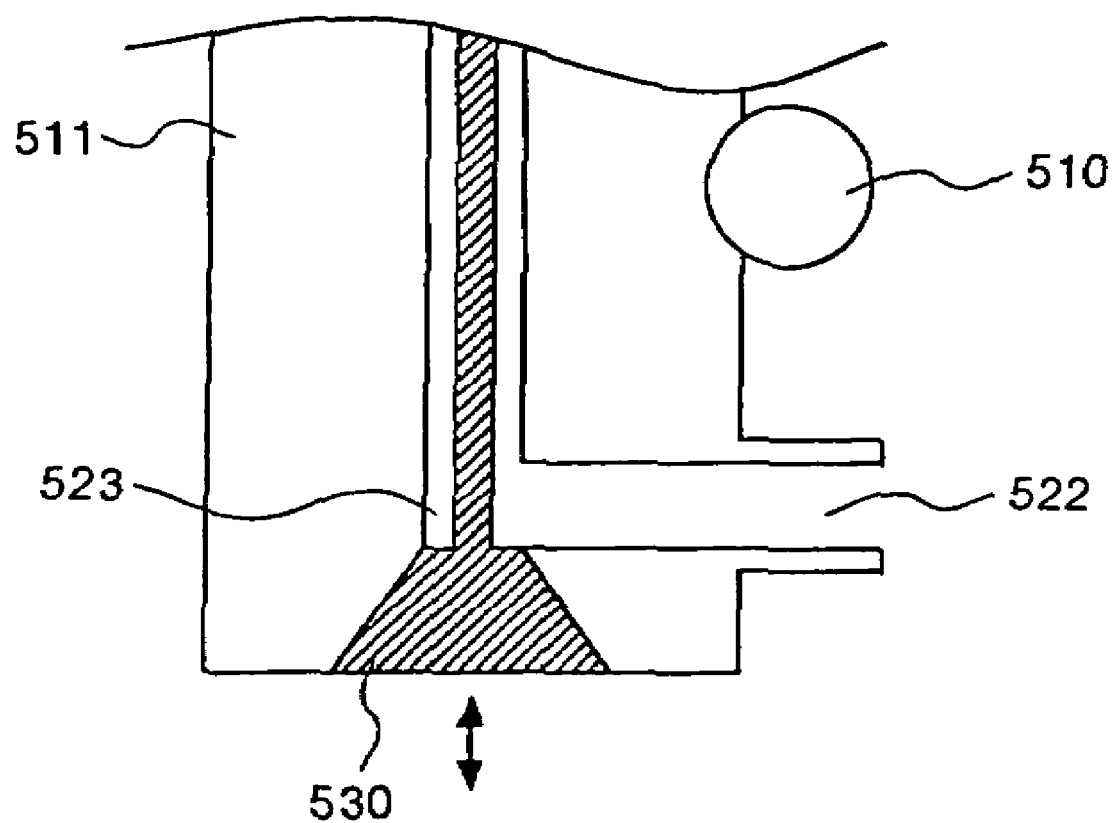
FIG. 30 is an enlarged view showing a gas supply path section in the frame shown in FIG. 29.

At first, the case where the two sections are communicated with air-tightness is explained. When the load lock chamber 513 is evacuated, the frame-side gas supply path 523 and substrate holder-side gas supply path 525 can not be evacuated with a pump for evacuating the load lock chamber, so that another mechanism for evacuation is provided for ventilating the gas supply paths. FIG. 30 shows one example of such configuration, and shows only a section corresponding to the section C in FIG. 29. The reference numeral 530 indicates a bypass valve.

By opening the bypass valve 530 provided between the frame-side gas supply path 523 and load lock chamber 513 when the load lock chamber is to be evacuated, not only the load lock chamber 513, but also the frame-side gas supply path 523 and substrate holder-side gas supply path 525 are simultaneously evacuated. After the evacuation, the bypass valve 530 is closed, and a substrate with a film having been formed thereon by sputtering is carried to the load lock chamber 513, when the frame-side gas supply path 525 and substrate holder-side gas supply path 525 are communicated to each other with air-tightness and gas for releasing vacuum check of the substrate to the substrate holder is supplied from the air-tight flow path.

Figure 31:
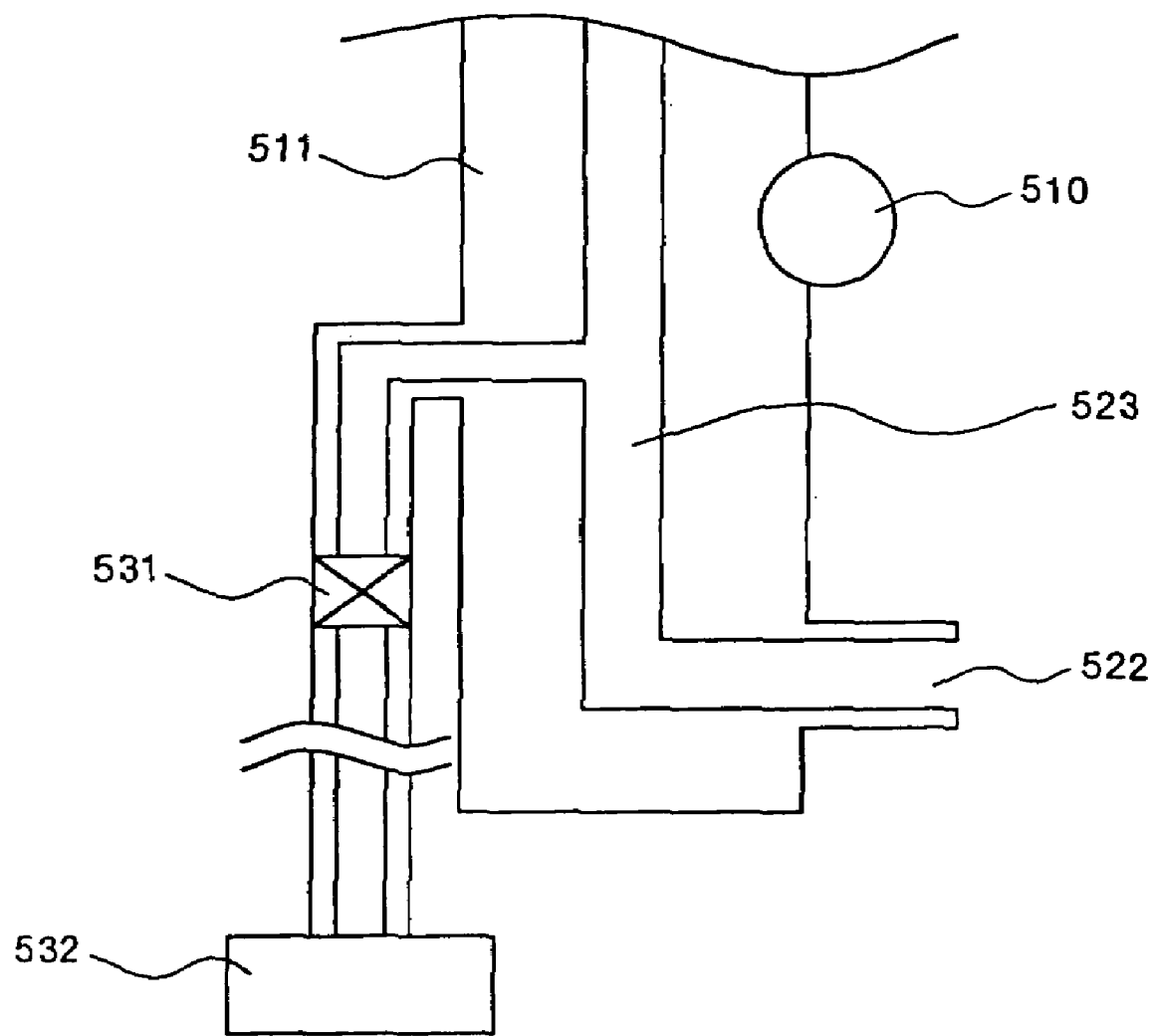
FIG. 31 is an enlarged view showing another gas supply path section in the frame shown in FIG. 29.

Another method is to provide a separate evacuation path for the frame-side gas supply path 523 as shown in FIG. 31. FIG. 31 shows only a portion of the evacuation path corresponding to the section C in FIG. 29. Designated at the reference numeral 531 is an evacuation valve for a gas supply path, and designated at 532 is a vacuum pump. Operations of this evacuation valve for a gas supply path are the same as those of the bypass valve 530 described above. A vacuum pump 532 may be used in combination with a pump for evacuation of the load lock chamber 513. With such a configuration, mechanism of the apparatus becomes complicated, but the frame-side gas supply path 523 and substrate holder-side gas supply path 525 are used also as a shielded flow path communicating to a rear surface of a substrate, and a large effect can be obtained in vacuum-chucking a substrate to a substrate holder.

When the communication is realized without air-tightness, when the load lock chamber is evacuated, sufficient evacuation is carried out from a linkage section between the frame-side gas supply port 522 and the substrate holder-side gas supply path 525, so that it is not necessary to provide a separate evacuation system for the frame-side gas supply path 523 and substrate holder-side gas supply path 525, which makes it possible to simplify the configuration of the apparatus. On the contrary, it is required to raise the pressure of supply gas for separating a substrate from a substrate holder, but this problem can easily be solved, and causes no trouble in achieving the effect specific to the present invention.

Although not shown in the figure, a valve which closes when the load lock chamber is evacuated is required in the upstream section from the frame-side gas supply path 523 regardless of whether the communication is realized with or without air-tightness. When an evacuation speed in the load lock chamber is taken into considerations, it is preferable to locate the valve at a position as close to the frame-side gas supply path 523 as possible.

Figure 32:
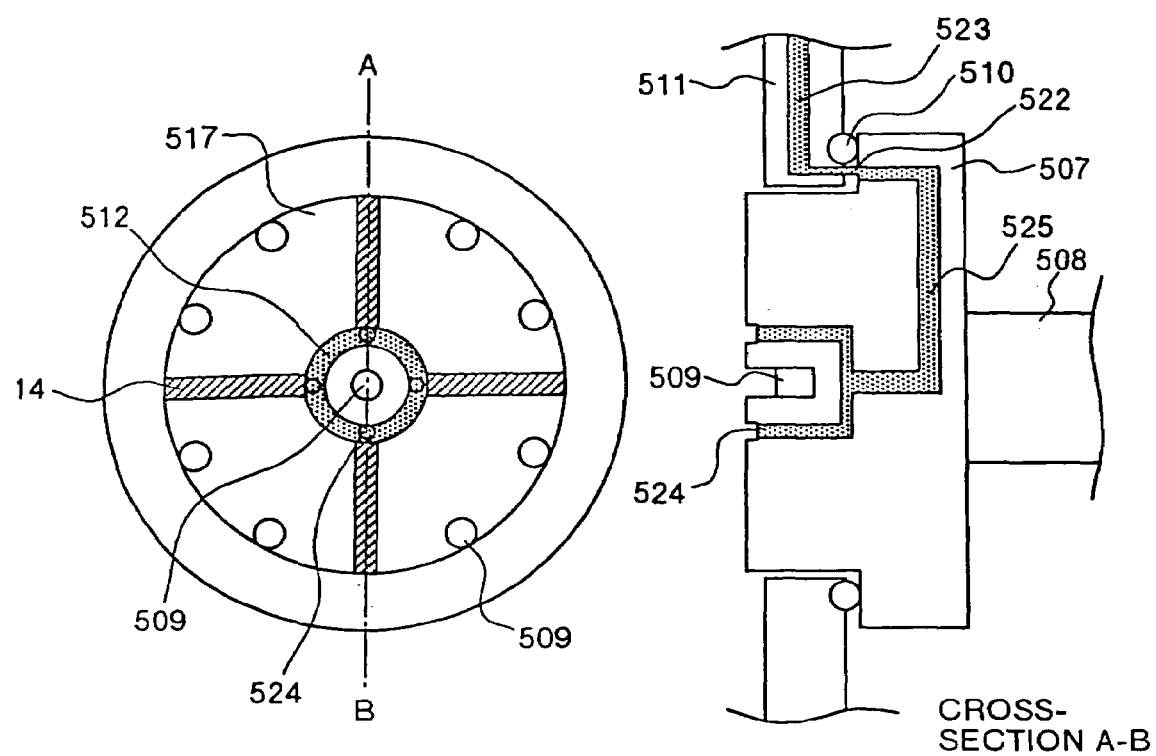
FIG. 32 shows configuration of a substrate holder section used in an optical disk substrate film-formation apparatus according to a fourteenth embodiment of the present invention.

FIG. 32 shows configuration of a substrate holder section used in an optical disk substrate film-formation apparatus according to the fourteenth embodiment of the present invention. Reference numeral 514 indicates a groove section. In FIG. 29, a flow path for gas to be flown from the substrate holder-side gas supply port 524 is terminated in a closed space formed by a substrate and a substrate holder, but in FIG. 32, the substrate holder-side gas supply port 524 is provided in an open space between a substrate and a substrate holder. The basic configuration is the same as that shown in FIG. 29, so that detailed description thereof is omitted herein, and only operations specific to this embodiment are described herein.

In the example shown in FIG. 32, like in FIG. 29, when film formation by sputtering is finished and the substrate holder 507 for inward carriage returns to a specified position in the load lock chamber 507, the frame-side gas supply path 523 and substrate holder-sided gas supply path 523 are communicated to each other. When inside of the load lock chamber 513 is ventilated, a substrate is vacuum-chucked to a substrate holder, but by supplying nitrogen gas from the frame-side gas supply path 523 via the substrate holder-side gas supply path 525 to the substrate holder-side gas supply port 524, the substrate is easily separated from the substrate holder, and can be carried out by the substrate holder 506 for outward carriage to outside of the optical disk substrate film-formation apparatus.

Different from FIG. 29, FIG. 30 shows a case in which the mechanism shown in FIG. 30 and FIG. 31 for evacuating the frame-side gas supply path 523 and substrate holder-side gas supply path 525 is not required for evacuation of the load lock chamber even when the frame-side gas supply port 522 and substrate holder-side gas supply path 525 are communicated to each other with air-tightness, which makes it possible to simplify configuration of the apparatus. In FIG. 32, the substrate holder-side gas supply port 524 is formed in the groove 512 for protection from a stack ring, but the configuration according to the present invention is not limited to this one, and the substrate holder-side gas supply port 524 may be provided in the groove 514, and further there is no specific restriction over a form, a position, a number of this substrate holder-sided gas supply port 524, nor over a width and a form of the groove section.

With respect to a groove section on a surface of a substrate holder, it is needless to say that attachment of R machined edge section contacting a rear surface of a substrate is effective for preventing damages to a rear surface of a substrate. The effect of the lubrication processing to a surface of a substrate holder is the same as that shown in FIG. 29.

Figure 33:
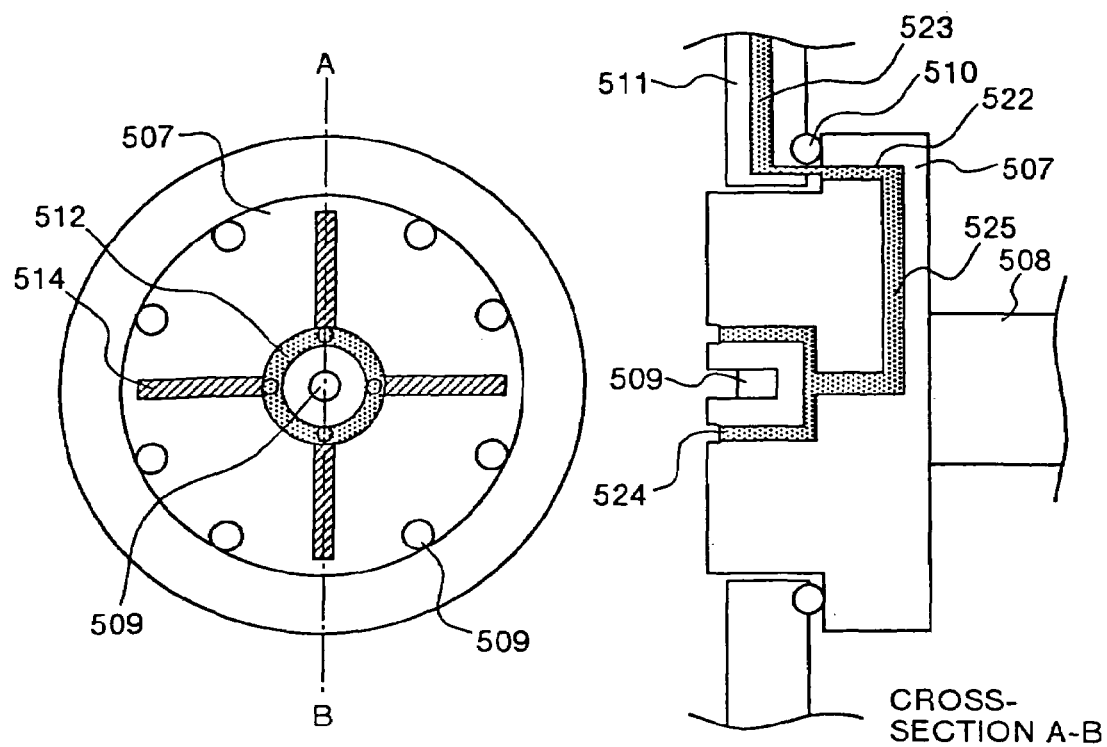
FIG. 33 shows configuration of a substrate holder used in an optical disk substrate film-formation apparatus according to a fifteenth embodiment of the present invention.

FIG. 33 shows configuration of a substrate holder section used in an optical disk substrate film-formation apparatus according to the fifteenth embodiment of the present invention. The groove section 514 is provided within a range of a substrate holder covered by a substrate when the substrate is placed on the substrate holder. Operations and configuration in this embodiment are the same as hose shown in FIG. 29, so that detailed description thereof is omitted herein. Although the substrate holder-side gas supply port 524 is provided in the groove 512 for protection from a stack-ring, the configuration according to the present invention is not limited to this one. The substrate holder-side gas supply port 524 may be provided in the groove 514. Further, there is no specific restriction over the shape, position, and number of substrate holder-sided gas supply ports 524, nor on the width and shape of the groove section.

With respect to a groove section on a surface of a substrate holder, it is needless to say that attachment of an R machined edge section contacting a rear surface of a substrate is effective for preventing damages to a rear surface of the substrate. The effect of the lubrication processing to a surface of a substrate holder is the same as that shown in FIG. 29.

Figure 34:
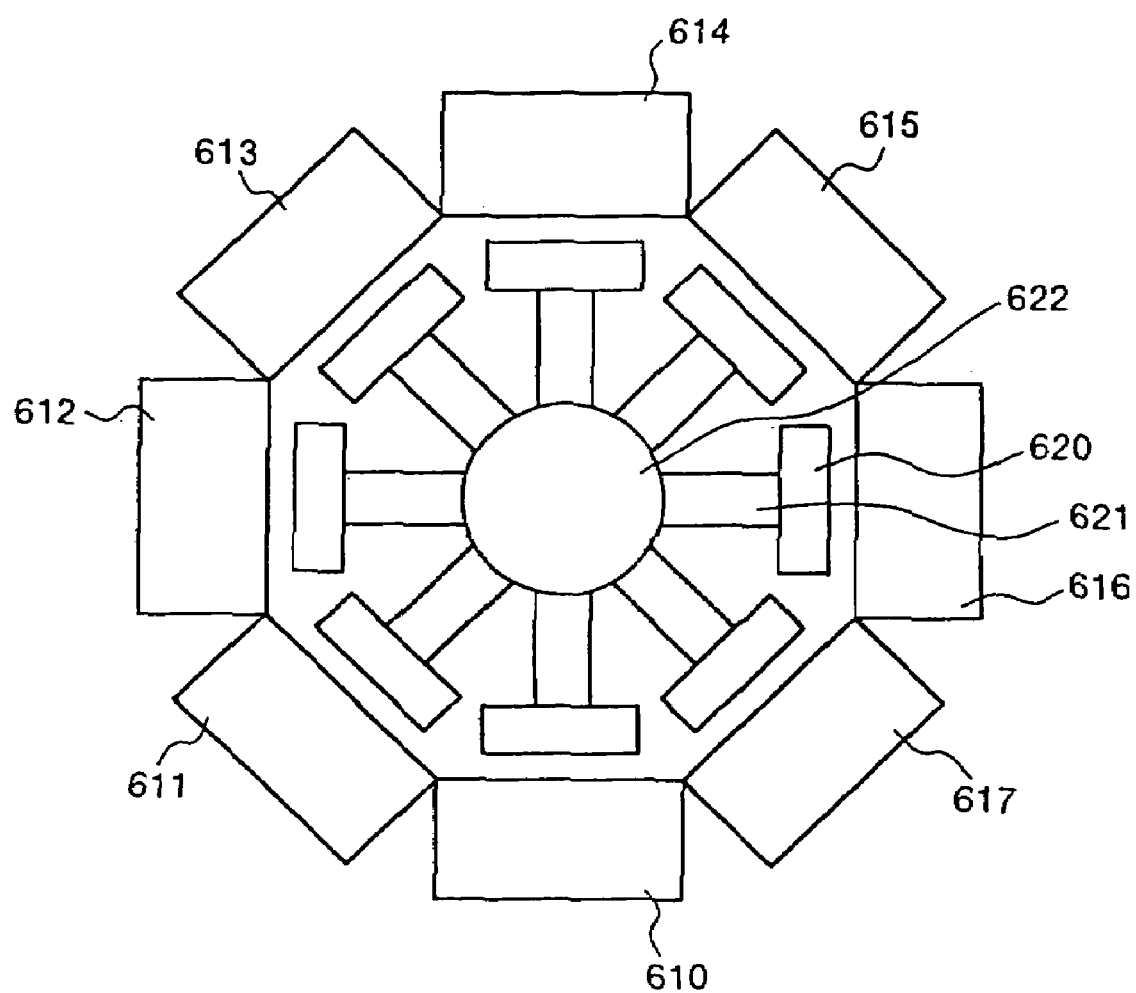
FIG. 34 is a general top view showing a sheet type of optical disk substrate film-formation apparatus for forming a multi-layered film.

FIG. 34 is a top view showing a general configuration of a general sheet type optical disk substrate film-formation apparatus for forming a multi-layered film according to the sixteenth embodiment. Designated at the reference numeral 610 is a substrate carry-in/carry-out chamber, designated at 611 to 617 are film-formation chambers, designated at 620 is a substrate holder, designated at 621 is an arm, and designated at 622 is a rotation shaft.

Figure 35:
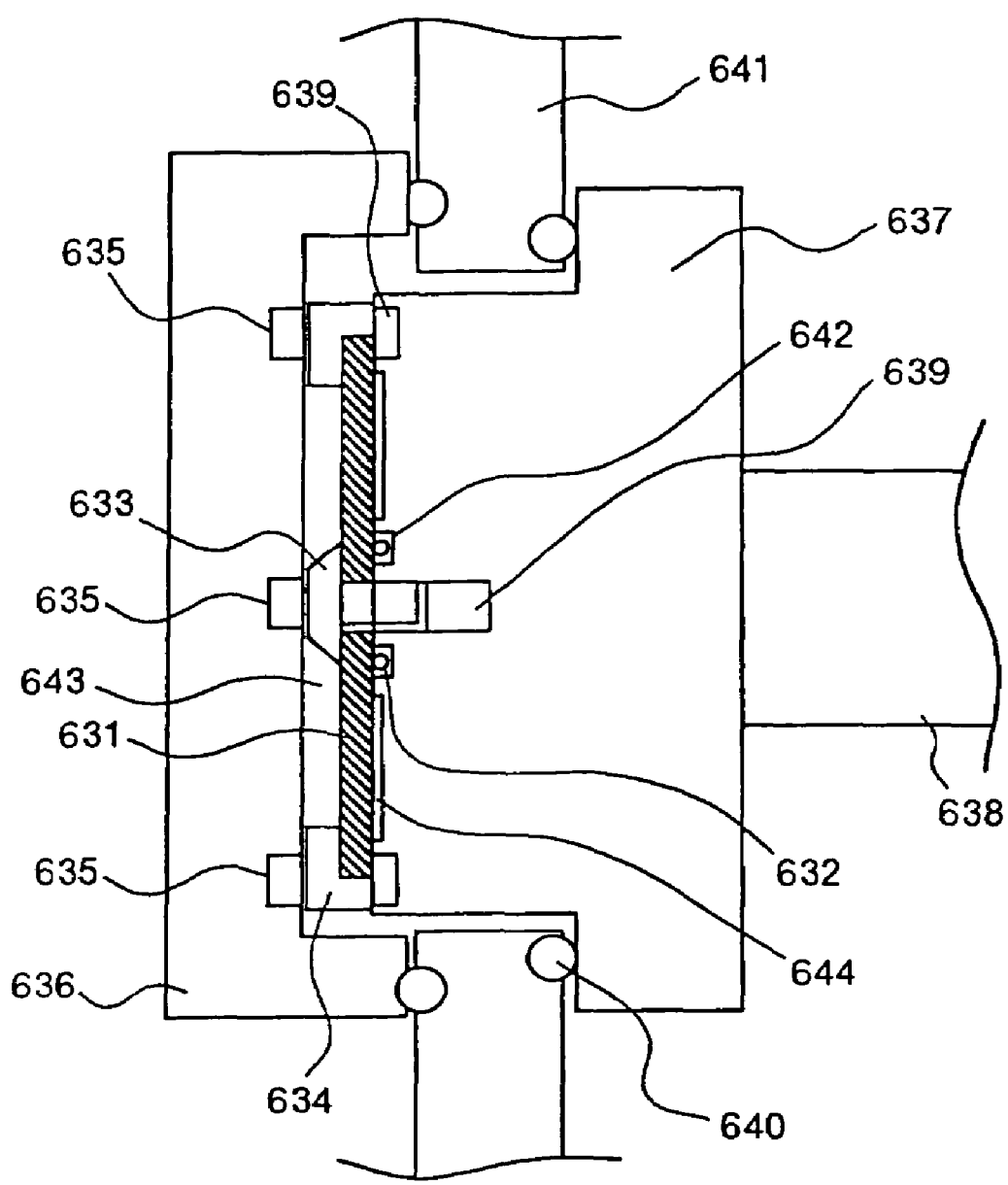
FIG. 35 shows a cross section of a substrate holder based on the conventional technology.

FIG. 35 shows a cross-sectional structure of a substrate holder based on the conventional technology in a case where the substrate holder is positioned in the substrate carry-in/carry-out chamber. Designated at the reference numeral 631 is a disk substrate, and designated at 632 is a stack ring. Designated at 6.33 is an inner mask, and designated at 634 is an outer mask. Designated at 635 is an electric magnet, and designated at 636 is a substrate holder for outward carriage. Designated at 637 is a substrate holder for inner carriage, and designated at 638 is an arm for inward transport. Designated at 639 is a magnet, and designated at 640 is a O-ring. Designated at 641 is a frame of an optical disk substrate film-formation apparatus, and designated at 624 is a groove for protection from a stack ring. Designated at 643 is a load lock chamber, and designated at 644 is a lightening section.

Figure 36:
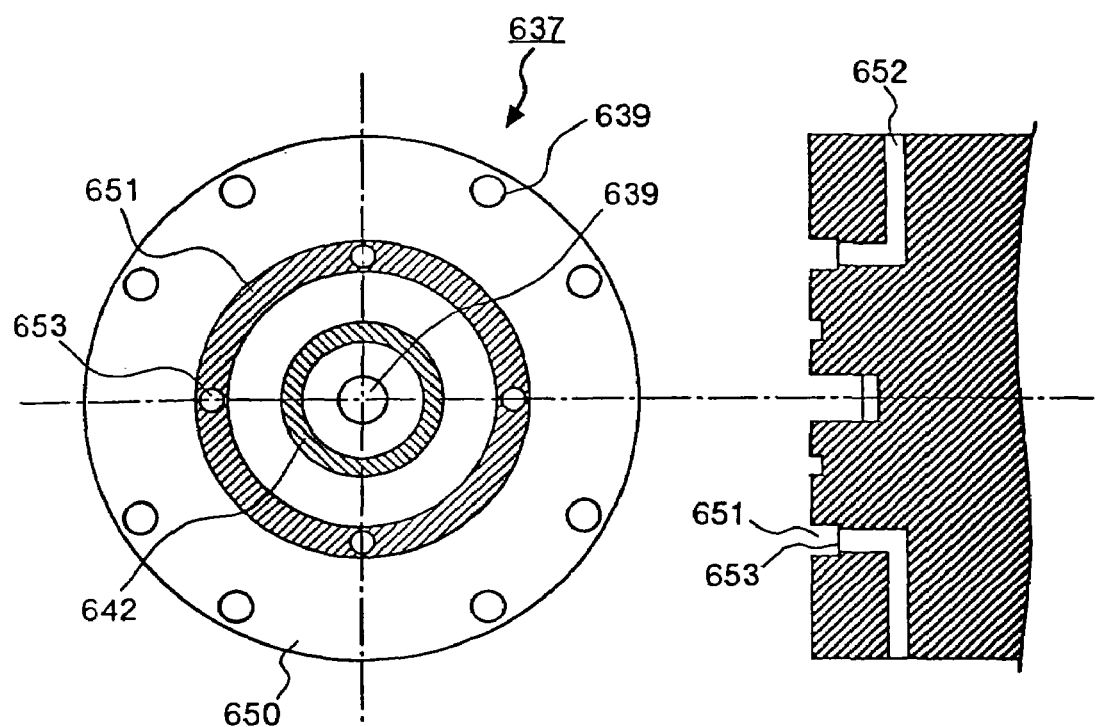
FIG. 36 shows an example of a substrate holder used in the apparatus according to the present invention.

FIG. 36 shows a case where the present invention is applied to the substrate holder for inward carriage. Designated at the reference numeral 650 is a substrate holder, and designated at 651 is a groove section. Designated at 652 is a flow path, and designated at 653 is a ventilation port for evacuating inside of the groove. In this embodiment, a groove 651 having an inner diameter of 28 mm and an outer diameter of 38 mm is formed around a center of an area where a disk substrate is placed on a surface of a substrate holder. The depth of the groove section is 0.5 mm. A portion other than the groove section closely contact the disk substrate.

Using this substrate holder, a dielectric body layer is formed in film-formation chambers 611, 612, 613, a recording layer in a film-formation chamber 614, a dielectric body layer in a film-formation chamber 615, and a reflection chamber in film-formation chambers 616 and 617 successively. As a material for film-formation, ZnS.SiO$_2$ is used for the dielectric body layer, AgInSbTe for the recording layer, and Al for the reflection layer. The total film thickness is 400 nm. A polycarbonate substrate with the thickness of 0.6 mm for DVD media is used as the disk substrate. There is no specific restriction over configuration of a film-formation chamber, a material for film formation, a thickness of a film, and a disk substrate.

Figure 38:
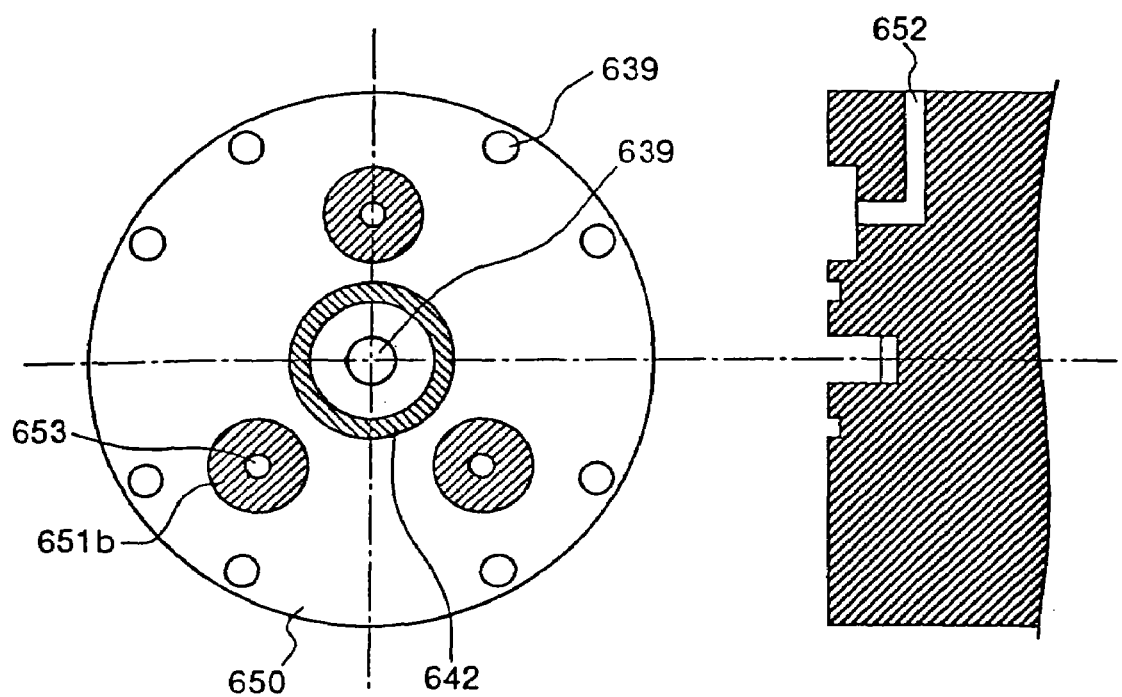
FIG. 38 shows another example of a substrate holder based on the conventional technology.

For comparison, the substrate holder shown in FIG. 38 was used as an example of the substrate holder based on the conventional technology, and testing for film formation was executed. On a surface of this substrate holder, at a position 33 mm away in the radial direction from a center of an area where a disk substrate is placed, three circular groove sections 651b each of diameter 15 mm are formed at three positions in the peripheral direction, and the depth of each of the groove sections is 0.5 mm. A portion other than the groove section closely contacts the disk substrate.

The multi-layered film is formed on the disk substrate through a series of steps including those for carrying a substrate into the substrate carry-in/carry-out chamber, forming a film in the film-formation chambers 1 to 7, and carrying out the substrate from the carry-in/carry-out chamber. In both of the substrate holders, the groove section formed on a surface of the substrate holder functions as a bent-gas inlet port to a section between a disk substrate and a substrate holder, so that stable carriage of a substrate is realized and the effect can be achieved.

However, with the substrate holder based on the conventional technology, although a substrate is closely contacted to a substrate holder, faults in the mechanical characteristics of the substrate and in media signal characteristics are generated, and a cause for this faults is a groove section formed on a surface of the substrate holder. With the substrate holder according to the present invention, however, the excellent mechanical characteristics of a substrate and excellent signal characteristics are obtained. The result is shown in FIG. 39 and FIG. 40.

Figure 39:
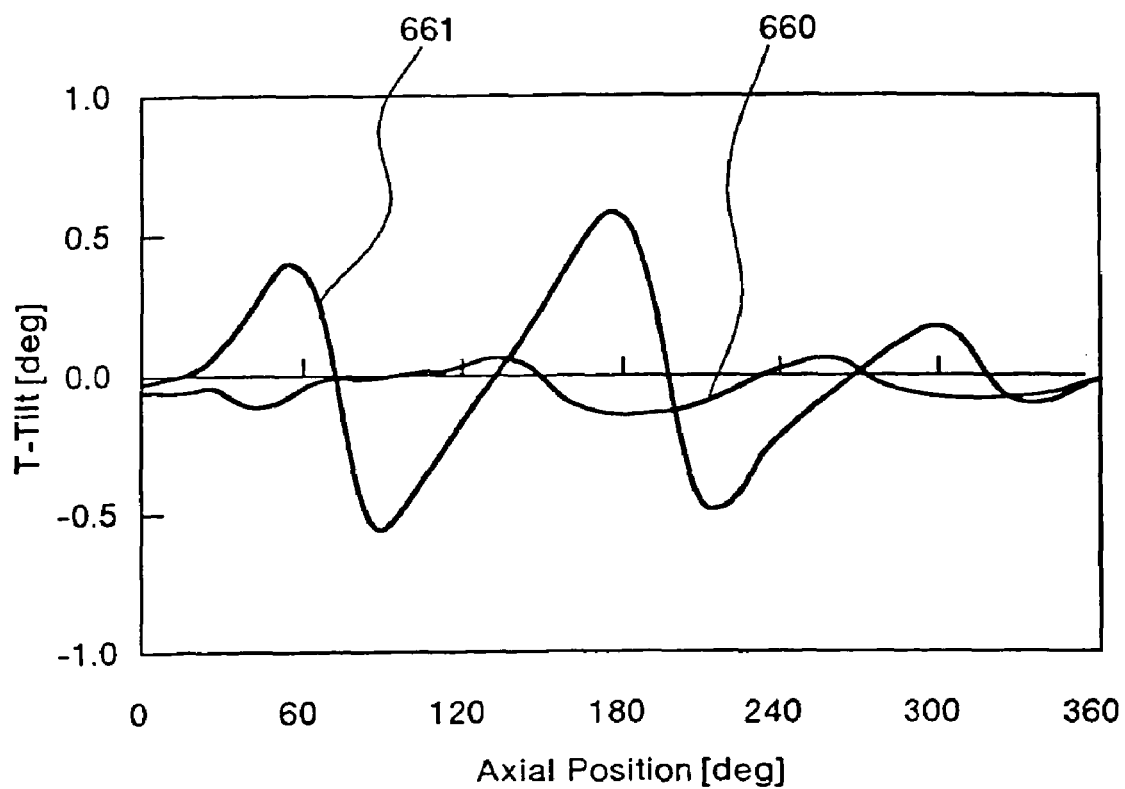
FIG. 39 shows a result of measurement of mechanical characteristics of a substrate.
Figure 40:
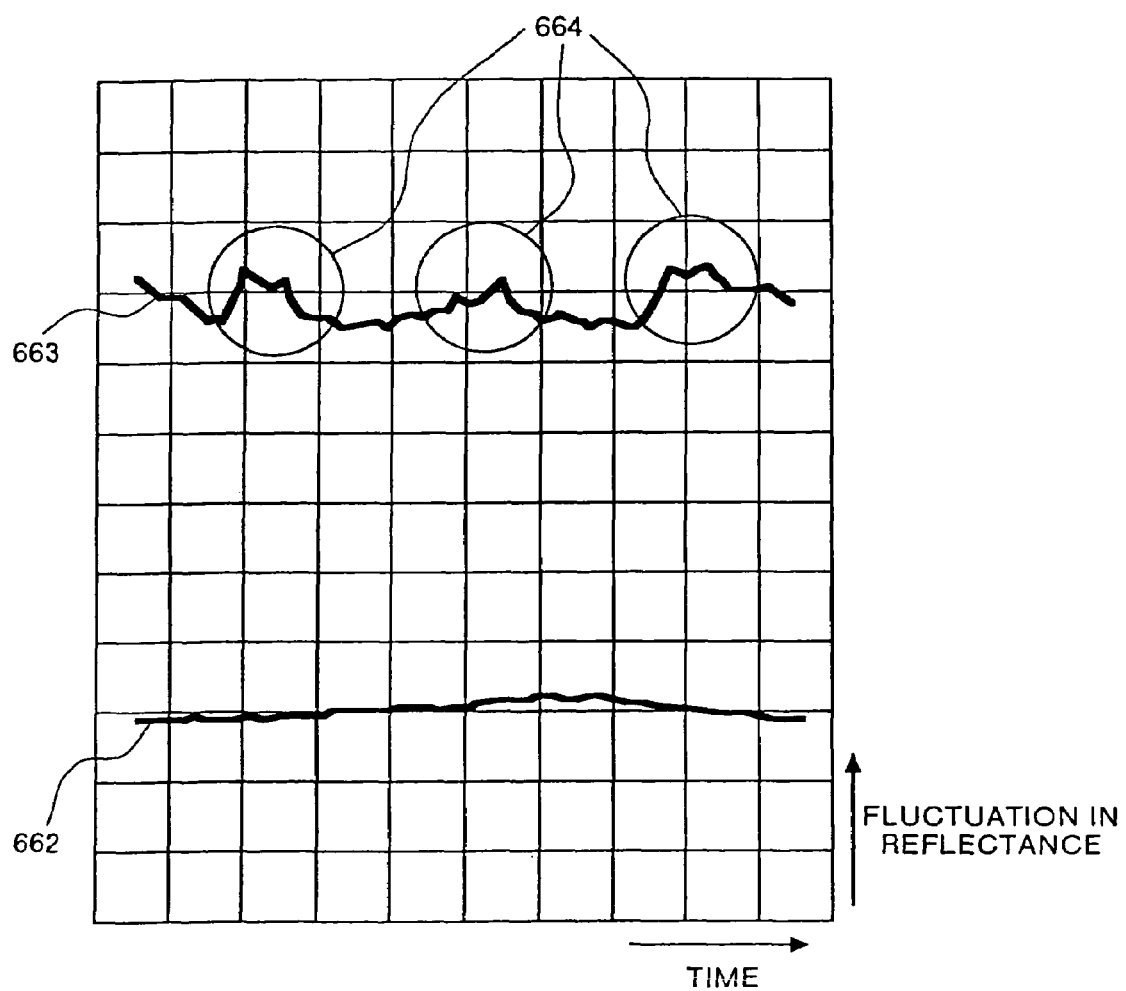
FIG. 40 shows a result of measurement of media signal characteristics.

FIG. 39 shows a result of testing executed at a position of T-tilt of 33 mm representing the mechanical characteristics of a substrate. Line 660 represents a result when the holder according to the present invention is used, and line 611 represents a result when the holder based on the conventional technology is used. FIG. 40 shows a result at the position of 33 mm for fluctuation in the reflectance as a representative parameter for the media signal characteristics. Line 662 represents a result when the holder according to the present invention is used, and line 663 represents a result when the holder based on the conventional technology is used. The representative characteristics for change in the characteristics is shown in this figure, but no remarkable change is observed in other parameters.

In the substrate holder based on the conventional technology, due to influence of the groove section formed on a surface of a substrate holder, the T-tilt is largely disturbed, and also signal fluctuation 664 corresponding to the groove section and also indicating fluctuation of a reflection factor is observed. Disturbance of the characteristics is also observed in an area outer from the position of 33 mm in the groove section. On the contrary, in the substrate holder according to the present invention, the T-tilt little changes from the characteristics before execution of film formation, and the excellent mechanical characteristics of a substrate is provided, and no disturbance in the reflectance is observed. A result at the position of 33 mm corresponding to a central position of the groove section is described, but the same result is obtained at positions of 28 mm and 33 mm on a rim of the groove section, and at all of other positions on the inner and outer peripheries.

As described above, in the configuration in which a disk substrate is closely contacted to a substrate holder, only the configuration of substrate holder according to the present invention insures stable carriage of a disk substrate and realization of excellent mechanical characteristics of a substrate as well as of excellent media signal characteristics, and can satisfy the two requirements simultaneously. When a substrate is closely contacted to a substrate holder, damages may be given to a rear surface of the substrate holder, but in this embodiment, by employing the method of providing a taper in an edge section forming a rim of a groove section, damages caused by contact between a rim of the groove section and a disk substrate can be reduced. In this case, the taper is provided by beveling by C 0.3 mm. However, the taper form is not limited to this one.

By executing R machining to the edge section, damages can further be reduced. In this case, the depth of the groove is 1.5 mm, and R machining of 1.0 m is executed. The R-machining form is not limited to this one. In the present invention, when complex plating with PTFE water-repelling powder is executed to a surface where the substrate holder contacts a disk substrate, damages generated in the area where the disk substrate contacts a substrate holder can be reduced. The same effect can be obtained also when the substrate holder itself is made from PTFE.

Figure 37:
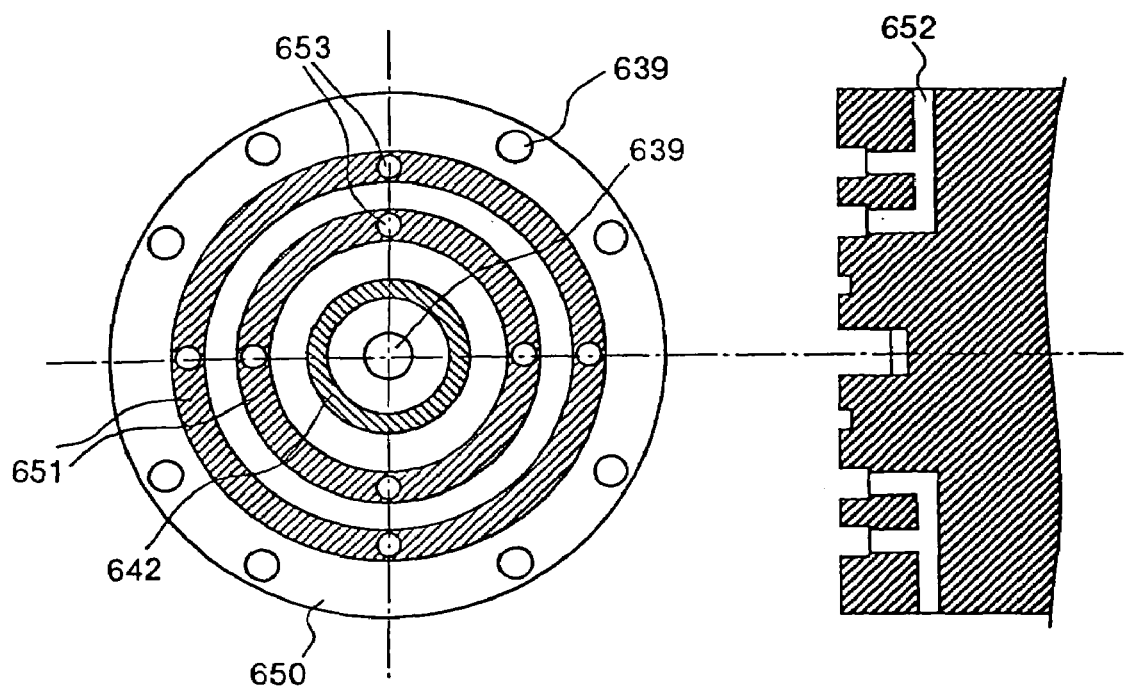
FIG. 37 shows another example of substrate holder used in the apparatus according to the present invention.

FIG. 37 shows another example in which the present invention is applied to a substrate holder for inward carriage in the optical disk substrate film-formation apparatus having the configuration as described above. In this example a groove section with an inner diameter of 30 mm and an outer diameter of 35 mm and that with an inner diameter of 45 mm and an outer diameter of 50 mm are formed around a center of an areas of the substrate holder where a disk substrate is placed. In this case the depth of the groove section is 0.5 mm. Further, portions other than the groove section closely contacts the disk substrate. When testing for film formation by sputtering is executed using this substrate holder, the same excellent mechanical characteristics and media signal characteristics as those described above are obtained at all positions of the substrate. The result of testing for other parameters is also excellent.

Figure 41:
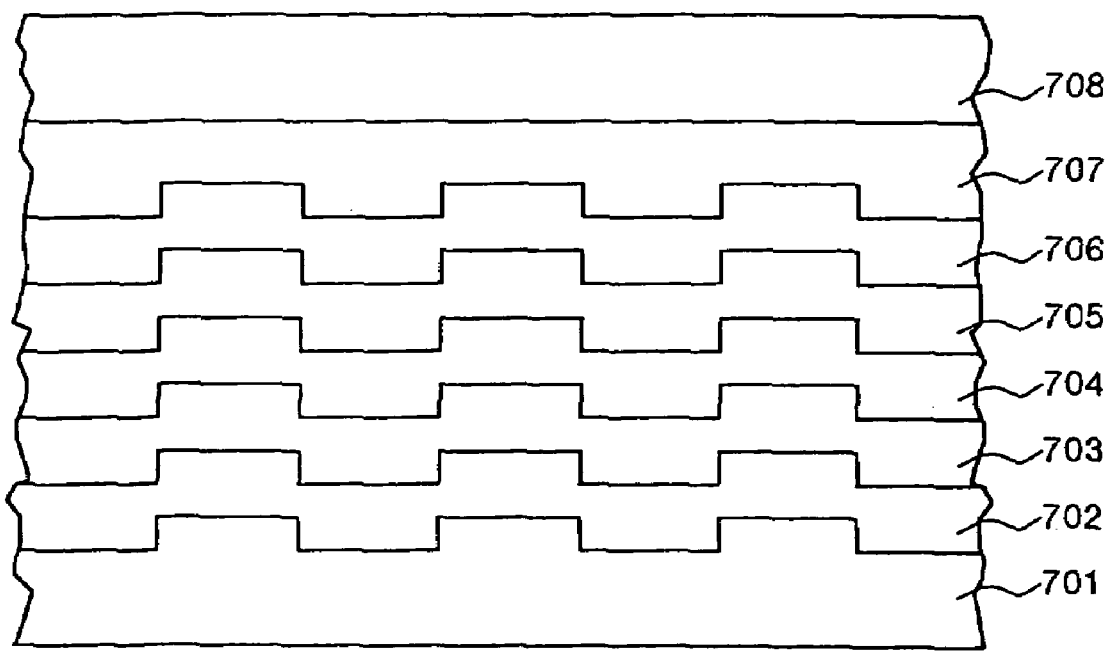
FIG. 41 is a general block diagram showing an example of a phase-change recording type of optical disk according to a seventeenth embodiment of the present invention.
Figure 42:
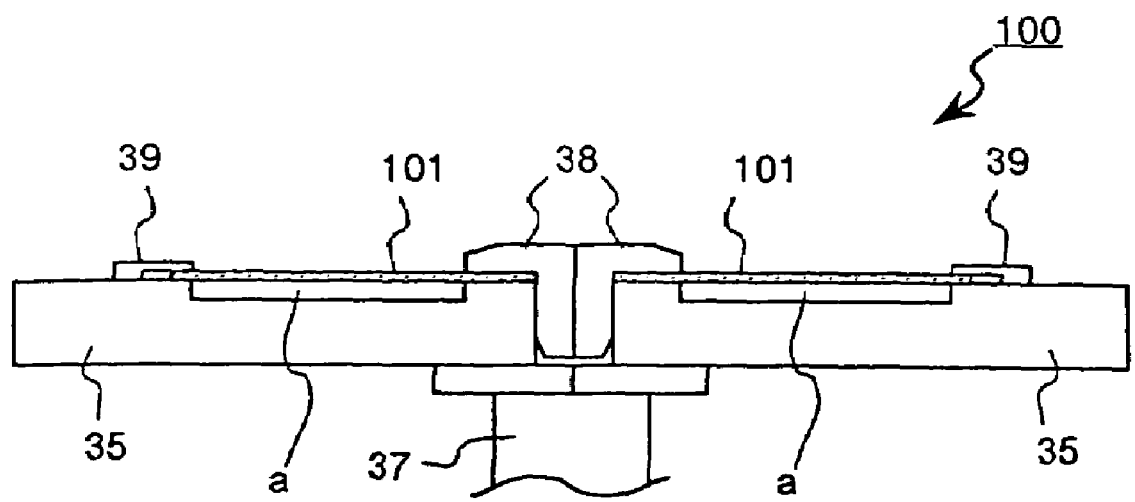
FIG. 42 shows an example of a cross section of a substrate holder based on the conventional technology.

FIG. 41 is a cross-sectional view showing basic configuration of a phase-change recording type of optical disk according to the seventeenth embodiment. As shown in this figure, the optical disk comprises a lower dielectric body protection layer 702, a phase-change recording layer 703, an upper dielectric body protection layer 704, a sulfidization-preventing conductive layer 705, an Ag-based reflection/heat-emission layer 706, a resin adhesion layer 707, and a dummy substrate 708 for adhesion successively formed on a substrate 701. The lower and upper dielectric body protection layers are made from ZnS—SiO$_2$. As clearly shown in this figure, the present invention is characterized in that the reflection/heat-emission layer is a multi-layered one, that the sulfidization-preventing conductive layer 705 is provided in the side of the dielectric body protection layer, and that the reflection/heat-emission layer 706 is based on an Ag alloy. Because of this feature, a time required for forming the reflection/heat-emission layer is around one third of that required for forming a single layer based on an Al-based alloy.

The sulfidization-preventing conductive layer in the laminated body is made from a material having a reaction force with sulfur smaller than that of Ag, and fluctuation in reflectance of the material is extremely small even when it is contacting ZnS.

The thickness of each of the layer is optimized according to thermal characteristics of the layer. In a DVD media using a 635 nm light beam, the thickness of the lower dielectric body protection 702 made from a dielectric body having a refraction index of around 2 such as ZnS—SiO$_2$ is between 50 to 250 nm, and preferably between 50 to 80 nm or between 160 to 220 nm. In the case of phase-change recording layer 703, a marking is clearly formed for a thermal reason when cooled rapidly, so that, as far as a chalcogen-based film, the film thickness is in a range from 8 to 30 nm, and preferably in a range from 13 to 22 nm regardless of whether the material is AgInSbTe or GeSbTe. The upper dielectric body protection layer 704 is required to conduct heat to the heat-emission layer, so that the film thickness can not be large. The thickness is between 7 to 60 nm, and preferably between 10 to 30 nm. It is better that the sulfidization-preventing conductive layer is thicker from a viewpoint of protection of sulfidization of Ag in the upper layer. However, to improve the reliability in repetitively rewriting data by improving the heat-emission capability, it is better that the sulfidization-preventing conductive layer is thinner than the upper Ag-based protection/heat-emission layer. The thickness of the reflection/heat-emission layer in a range from 80 nm or less is preferable for saturation in reflectance, but the thickness in a range from 100 to 200 nm is preferable for improving the reliability in repetitively rewriting data by improving the heat-emission capability.

Examples 5 and 6 are described in more detail below.

EXAMPLE 5

Two types of plastic substrate, namely a polycarbonate substrate and a polyolefin substrate each with the thickness of 0.6 mm are prepared. Films are formed on the recording medium (optical disks) shown in Table 2 and Table 3 using a magnetron sputter device. The reflection/heat-emission layer is made from pure Ag. The resultant phase-change recording type of optical disk is maintained in 85% RH for 1000 hours under the temperature of 80 degree centigrade, and the bit error rate (BER) is measured. The time point when the BER drops to a half of the initial value is regarded as an end of the life.

In Table 2 and Table 3 the film thickness is fixed. Namely, lower dielectric body protection layer is 150 nm thick, phase-change recording layer is 20 nm thick, upper dielectric body protection layer is 20 nm thick, sulfidization-preventing conductive layer is 20 nm thick, and reflection/heat-emission layer is 100 nm thick.

The symbol ○ in the 'life' row indicates a case where the time until a bit error rate on the entire surface of a substrate is doubled as compared to the initial value is 1000 hours or more under the conditions including relative humidity of 85% and temperature of 80 degree centigrade. The symbol Δ indicates a case where the time is around 800 hours, and the symbol × indicates a case where the time is less than 800 hours.

Conditions for assessment are 635 nm; Na: 0.60; linear velocity: 3.5 m/s; recording density: 0.4 μm/bit.

Film formation speed on the reflection layer: ○ indicates a case two times faster speed than that for Al.

Substrate: PC indicates polycarbonate, and PO indicates polyolefin, and "PC/PC" indicates that the assessment is performed by using these two types of substrate.

Recording layer: "AgInSbTe/GeSbTe" indicates that the assessment is performed for AgInSbTe recording layer and GeSeTe recording layer respectively.

TABLE 2

| Reflection/ heat-emission layer | Sulfidization-preventing dielectric body protection layer | Upper dielectric body protection layer | Phase-change recording layer | Lower dielectric body protection layer | Substrate | Life | Linear film formation velocity for reflection layer |
|---|---|---|---|---|---|---|---|
| Al | nothing | ZnS—SiO$_2$ | AgInSbTe/GeSbTe | ZnS—SiO$_2$ | PC/PO | ○ | X |
| Ag | nothing | ZnS—SiO$_2$ | AgInSbTe/GeSbTe | ZnS—SiO$_2$ | PC/PO | X | ○ |
| Ag | AlCu$_{0.05}$ | ZnS—SiO$_2$ | AgInSbTe/GeSbTe | ZnS—SiO$_2$ | PC/PO | ○ | ○ |
| Ag | AlSi$_{0.01}$ | ZnS—SiO$_2$ | AgInSbTe/GeSbTe | ZnS—SiO$_2$ | PC/PO | ○ | ○ |
| Ag | AlSi$_{0.01}$Cu$_{0.05}$ | ZnS—SiO$_2$ | AgInSbTe/GeSbTe | ZnS—SiO$_2$ | PC/PO | ○ | ○ |
| Ag | AlSc$_{0.01}$ | ZnS—SiO$_2$ | AgInSbTe/GeSbTe | ZnS—SiO$_2$ | PC/PO | Δ | ○ |
| Ag | AlTi$_{0.01}$ | ZnS—SiO$_2$ | AgInSbTe/GeSbTe | ZnS—SiO$_2$ | PC/PO | ○ | ○ |
| Ag | AlSi$_{0.01}$Ti$_{0.05}$ | ZnS—SiO$_2$ | AgInSbTe/GeSbTe | ZnS—SiO$_2$ | PC/PO | Δ | ○ |
| Ag | Ti | ZnS—SiO$_2$ | AgInSbTe/GeSbTe | ZnS—SiO$_2$ | PC/PO | ○ | ○ |
| Ag | Zr | ZnS—SiO$_2$ | AgInSbTe/GeSbTe | ZnS—SiO$_2$ | PC/PO | ○ | ○ |
| Ag | Hf | ZnS—SiO$_2$ | AgInSbTe/GeSbTe | ZnS—SiO$_2$ | PC/PO | ○ | ○ |
| Ag | TiN | ZnS—SiO$_2$ | AgInSbTe/GeSbTe | ZnS—SiO$_2$ | PC/PO | ○ | ○ |

TABLE 3

| Reflection/ heat-emission layer | Sulfidization-preventing dielectric body protection layer | Upper dielectric body protection layer | Phase-change recording layer | Lower dielectric body protection layer | Substrate | Life | Linear film formation velocity for reflection layer |
|---|---|---|---|---|---|---|---|
| Ag | TiSi$_2$ | ZnS—SiO$_2$ | AgInSbTe/GeSbTe | ZnS—SiO$_2$ | PC/PO | ○ | ○ |
| Ag | ZrN | ZnS—SiO$_2$ | AgInSbTe/GeSbTe | ZnS—SiO$_2$ | PC/PO | ○ | ○ |
| Ag | ZrSi$_2$ | ZnS—SiO$_2$ | AgInSbTe/GeSbTe | ZnS—SiO$_2$ | PC/PO | ○ | ○ |
| Ag | HfN | ZnS—SiO$_2$ | AgInSbTe/GeSbTe | ZnS—SiO$_2$ | PC/PO | ○ | ○ |
| Ag | HfSi$_2$ | ZnS—SiO$_2$ | AgInSbTe/GeSbTe | ZnS—SiO$_2$ | PC/PO | ○ | ○ |
| Ag | Ta | ZnS—SiO$_2$ | AgInSbTe/GeSbTe | ZnS—SiO$_2$ | PC/PO | ○ | ○ |
| Ag | TaN | ZnS—SiO$_2$ | AgInSbTe/GeSbTe | ZnS—SiO$_2$ | PC/PO | Δ | ○ |
| Ag | TaSi$_2$ | ZnS—SiO$_2$ | AgInSbTe/GeSbTe | ZnS—SiO$_2$ | PC/PO | ○ | ○ |
| Ag | W | ZnS—SiO$_2$ | AgInSbTe/GeSbTe | ZnS—SiO$_2$ | PC/PO | ○ | ○ |
| Ag | WN | ZnS—SiO$_2$ | AgInSbTe/GeSbTe | ZnS—SiO$_2$ | PC/PO | ○ | ○ |
| Ag | WSi | ZnS—SiO$_2$ | AgInSbTe/GeSbTe | ZnS—SiO$_2$ | PC/PO | ○ | ○ |

EXAMPLE 6

Two types of plastic substrate, namely a polycarbonate substrate and a polyolefin substrate each with the thickness of 0.6 mm are prepared. The recording media (optical disks) shown in Table 4 to Table 6 are formed on each on the substrates using a magnetron sputter device. The sulfidization-preventing conductive layer is made from AlTi$_{0.01}$. The resultant phase-change recording type of optical disk is maintained in 85% RH for 1000 hours under the temperature of 80 degree centigrade, and the bit error rate (BER) is measured. The period of time until the BER is doubled as compared to the initial value or more is defined as the life.

In Table 4 to Table 6, the film thickness is fixed. Namely, lower dielectric body protection layer is 150 nm thick, phase-change recording layer is 20 nm thick, upper dielectric body protection layer is 20 nm thick, sulfidization-preventing conductive layer is 20 nm thick, and reflection/heat-emission layer is 100 nm thick.

The symbol ○ in 'life' row indicates a case where the time until a bit error rate on the entire surface of a substrate is doubled as compared to the initial value is 1000 hours or more under the conditions including relative humidity of 85% and temperature of 80 degree centigrade. The symbol Δ indicates a case where the time is around 800 hours, and the symbol × indicates a case where the time is less than 800 hours.

Conditions for assessment: 635 nm; Na: 0.60; linear velocity: 3.5 m/s; recording density: 0.4 μm/bit.

Film formation speed on the reflection layer: ○ indicates a case two times faster speed than that for Al.

Substrate: PC indicates polycarbonate, and PO indicates polyolefin, and "PC/PC" indicates that the assessment is performed by using these two types of substrate.

Recording layer: "AgInSbTe/GeSbTe" indicates that the assessment is performed for AgInSbTe recording layer and GeSeTe recording layer respectively.

Reflection/heat-emission layer: For instance, "Ag26% Cu2% Ni" indicates that a content of Cu is 26%, Ni 2%, and Ag 72%.

TABLE 4

| Reflection/heat-emission layer | Sulfidization-preventing dielectric body protection layer | Upper dielectric body protection layer | Phase-change recording layer | Lower dielectric body protection layer | Substrate | Life | Linear film formation velocity for reflection layer |
|---|---|---|---|---|---|---|---|
| Al | nothing | ZnS—SiO$_2$ | AgInSbTe/GeSbTe | ZnS—SiO$_2$ | PC/PO | ◯ | X |
| Ag | nothing | ZnS—SiO$_2$ | AgInSbTe/GeSbTe | ZnS—SiO$_2$ | PC/PO | X | ◯ |
| Ag 26% Cu 2% Ni | AlTi$_{0.01}$ | ZnS—SiO$_2$ | AgInSbTe/GeSbTe | ZnS—SiO$_2$ | PC/PO | ◯ | ◯ |
| Ag 65% W | AlTi$_{0.01}$ | ZnS—SiO$_2$ | AgInSbTe/GeSbTe | ZnS—SiO$_2$ | PC/PO | ◯ | X |
| Ag 2% Pd | AlTi$_{0.01}$ | ZnS—SiO$_2$ | AgInSbTe/GeSbTe | ZnS—SiO$_2$ | PC/PO | ◯ | ◯ |
| Ag 1% Cu 1% Ti | AlTi$_{0.01}$ | ZnS—SiO$_2$ | AgInSbTe/GeSbTe | ZnS—SiO$_2$ | PC/PO | Δ | ◯ |
| Ag 5% Pd 1% Cu | AlTi$_{0.01}$ | ZnS—SiO$_2$ | AgInSbTe/GeSbTe | ZnS—SiO$_2$ | PC/PO | ◯ | ◯ |
| Ag 20% Al | AlTi$_{0.01}$ | ZnS—SiO$_2$ | AgInSbTe/GeSbTe | ZnS—SiO$_2$ | PC/PO | Δ | ◯ |
| Ag 10% In | AlTi$_{0.01}$ | ZnS—SiO$_2$ | AgInSbTe/GeSbTe | ZnS—SiO$_2$ | PC/PO | ◯ | ◯ |
| Ag 5% Ir | AlTi$_{0.01}$ | ZnS—SiO$_2$ | AgInSbTe/GeSbTe | ZnS—SiO$_2$ | PC/PO | ◯ | ◯ |

TABLE 5

| Reflection/heat-emission layer | Sulfidization-preventing dielectric body protection layer | Upper dielectric body protection layer | Phase-change recording layer | Lower dielectric body protection layer | Substrate | Life | Linear film formation velocity for reflection layer |
|---|---|---|---|---|---|---|---|
| Ag 5% Zr | nothing | ZnS—SiO$_2$ | AgInSbTe/GeSbTe | ZnS—SiO$_2$ | PC/PO | ◯ | ◯ |
| Ag 5% Ru | nothing | ZnS—SiO$_2$ | AgInSbTe/GeSbTe | ZnS—SiO$_2$ | PC/PO | ◯ | ◯ |
| Ag 5% Cr | AlTi$_{0.01}$ | ZnS—SiO$_2$ | AgInSbTe/GeSbTe | ZnS—SiO$_2$ | PC/PO | ◯ | ◯ |
| Ag 5% V | AlTi$_{0.01}$ | ZnS—SiO$_2$ | AgInSbTe/GeSbTe | ZnS—SiO$_2$ | PC/PO | ◯ | ◯ |
| Ag 5% Ti | AlTi$_{0.01}$ | ZnS—SiO$_2$ | AgInSbTe/GeSbTe | ZnS—SiO$_2$ | PC/PO | ◯ | ◯ |
| Ag 5% Y | AlTi$_{0.01}$ | ZnS—SiO$_2$ | AgInSbTe/GeSbTe | ZnS—SiO$_2$ | PC/PO | ◯ | ◯ |
| Ag 5% Ce | AlTi$_{0.01}$ | ZnS—SiO$_2$ | AgInSbTe/GeSbTe | ZnS—SiO$_2$ | PC/PO | ◯ | ◯ |
| Ag 5% Pr | AlTi$_{0.01}$ | ZnS—SiO$_2$ | AgInSbTe/GeSbTe | ZnS—SiO$_2$ | PC/PO | ◯ | ◯ |
| Ag 5% Nd | AlTi$_{0.01}$ | ZnS—SiO$_2$ | AgInSbTe/GeSbTe | ZnS—SiO$_2$ | PC/PO | Δ | ◯ |
| Ag 5% Sm | AlTi$_{0.01}$ | ZnS—SiO$_2$ | AgInSbTe/GeSbTe | ZnS—SiO$_2$ | PC/PO | ◯ | ◯ |
| Ag 5% Eu | AlTi$_{0.01}$ | ZnS—SiO$_2$ | AgInSbTe/GeSbTe | ZnS—SiO$_2$ | PC/PO | ◯ | ◯ |
| Ag 5% Gd | AlTi$_{0.01}$ | ZnS—SiO$_2$ | AgInSbTe/GeSbTe | ZnS—SiO$_2$ | PC/PO | ◯ | ◯ |

TABLE 6

| Reflection/heat-emission layer | Sulfidization-preventing dielectric body protection layer | Upper dielectric body protection layer | Phase-change recording layer | Lower dielectric body protection layer | Substrate | Life | Linear film formation velocity for reflection layer |
|---|---|---|---|---|---|---|---|
| Ag 5% Pt | $AlTi_{0.01}$ | $ZnS—SiO_2$ | AgInSbTe/GeSbTe | $ZnS—SiO_2$ | PC/PO | ○ | ○ |
| Ag 5% Rh | $AlTi_{0.01}$ | $ZnS—SiO_2$ | AgInSbTe/GeSbTe | $ZnS—SiO_2$ | PC/PO | △ | ○ |
| Ag 5% Ta | $AlTi_{0.01}$ | $ZnS—SiO_2$ | AgInSbTe/GeSbTe | $ZnS—SiO_2$ | PC/PO | ○ | ○ |

As shown in Table 4 to Table 6, durability of the disk according to the present invention in which the reflection/heat-emission layer is of a multi-layered type, namely the disk in which a sulfidization-preventing conductive layer is used between an Ag-based alloy film and an upper dielectric body protection layer is better than the disk having a single reflection/heat-emission layer made from Ag. In the description above, the sulfidization-preventing conductive layer is expressed by a general formula of, for instance, $TiN_x$, but the composition is not always identical to the stoichiometric one. A good result can be obtained with a composition close to the stoichiometric composition which is chemically stable.

Further it is understood from Table 4 to Table 6 that the durability is further improved by adding Pd or Rh, Ru, Ni, Cu or the like. Warping of a substrate is small when an Ag-alloy based reflection/heat-emission film is used, while the warping is large when an Al-based reflection/heat-emission film is used.

As described above, in the phase-change recording type of optical disk according to the seventeenth embodiment, the dielectric body protection layer is made from $ZnS—SiO_2$, and the reflection/heat-emission layer is a laminated structure of Ag-based alloy/sulfidization-preventing conductive layers. Namely a lower dielectric body protection layer, a phase-change recording layer, an upper dielectric body protection layer, a sulfidization-preventing conductive layer, and an Ag-based alloy reflection/heat-emission layer are laminated on a plastic substrate.

The Ag-alloys described above include, for instance, AgCuNi, AgW, AgPd, AgPdTi, AgPdCu, AgAl, AgIn, AgIr, AgZn, AgRu, AgCr, AgV, AgTi, AgY, AgCe, AgPr, AgNd, AgSm, AgEu, AgGd, AgPt, AgRh, and AgTa. As Ag has better thermal conductivity than Al, a thickness of Ag film may be thinner as compared to that of an Al film to achieve the same heat-emission effect. Further, the sputter rate of Ag with the same power is 3 times higher than that of Al. Because of this feature, a heat/emission layer with a small film thickness can be formed at a faster speed, and increase of temperature in the substrate during film formation can be suppressed. As Ag is sulfidized and changes when it contacts sulfur, a thin sulfidization-preventing conductive layer is provided between the Ag-based reflection/heat-emission layer and $ZnS—SiO_2$ protection layer to prevent direct contact between Ag and sulfur, and with this configuration, sulfidization of Ag is sulfidized.

The thickness of the sulfidization-preventing conductive layer should preferably be smaller than that of the reflection/heat-emission layer to improve the heat-emission capability and reliability in repetitively rewriting data. The materials include an Al film of a film made from an alloy containing Al; a film made from an alloy containing high melting-point metal; a film made from an alloy containing Ta; and a film made from an alloy containing W. The Al-containing alloy includes $AlCu_x$, $AlSi_xCu_y$, $AlSc_x$, $AlTi_x$, or $AlSi_xT_y$, and in this case x and y are less than 0.5, preferably less than 0.2, and more preferably less than 0.1. The film made from an alloy containing high melting-point metal includes a It film, an Zr film, or an Hf film or $Ti_xN_y$, $Ti_xSi_y$, $Zr_xN_y$, $Zr_xSi_y$, $Hf_xN_y$, or $Hf_xSi_y$, and in the $Ti_xN_y$, $Zr_xN_y$, $Hf_xN_y$, x+y=1, 0.1<x<0.7, preferably 0.3<x<0.6, and more preferably 0.45<x<0.55, and further in the $Ti_xSi_y$, $Zr_xSi_y$, and $Hf_xSi_y$, x+y=1, 0.1<x<0.7, preferably 0.2<x<0.6, and more preferably 0.33<x<0.53. A film made from an alloy containing Ta includes $Ta_xN_y$ and $Ta_xSi_y$, and in the $Ta_xN_y$, x+y=1, 0.1<x<0.7, preferably 0.3<x<0.6, more preferably 0.45<x<0.55, and in the $Ta_xSi_y$, x+y=1, 0.1<x<0.7, preferably 0.2 <x<0.6, and more preferably 0.33<x<0.53. The film made from an alloy containing W comprises W, $W_xN_y$, or $W_xSi_y$, and in the $W_xN_y$, x+y=1, 0.1<x<0.7, preferably 0.3<x<0.6, and more preferably 0.45<x<0.55, and in the $W_xSi_y$, x+y=1, 0.1<x<0.7, preferably 0.2<x<0.6, and more preferably 0.33<x<0.53.

As described above, with the present invention, deformation of a substrate during film formation can be reduced. Because of this feature, even when a thin substrate is used, the substrate can be treated like those based on the conventional technology, and lowering of through-put in a film-formation step can be prevented. Further, quality of the optical disk can be improved and yield of production of optical disks can also be improved. In addition, a substrate can be adsorbed to a substrate holder with a vacuum chuck, and deformation of the substrate can be prevented. Therefore, quality of the optical disk and yield in production of optical disks can be improved. Therefore, with the present invention, it is possible to provide an optical disk substrate film-formation apparatus which does not cause deformation of substrates, nor lower the through-put even when a thinner disk substrate is used.

With the present invention, it is possible to adsorb a substrate to a substrate holder with vacuum chuck, and even when a substrate with a thickness of 0.6 mm, deformation of the substrate can be prevented. Thus, quality of optical disk based on the adhesion system and the yield in the production of optical disks can be improved.

With the present invention, generation of damages on a light beam incidence surface of an optical disk can be prevented, quality of an optical disk is improved with yield in production of optical disks also improved.

With the present invention, by adjusting a contact force between a contact holding surface of a substrate holder and a substrate, the substrate can easily be removed from the contact holding surface. Therefore, even when a substrate is vacuum-chucked, the substrate can be removed with a relatively small force, and loss of substrates in the removal step can be prevented.

With the present invention, a substrate can easily be peeled off from a contact holding surface. Therefore, even when a substrate is vacuum-chucked, the substrate can be removed with a relatively small force, and loss of substrates in the removal step can be prevented.

With the present invention, a substrate holder and a substrate can be adsorbed to each other by generating a pressure difference between a film formation chamber and a substrate carriage chamber. Because of this feature, configuration of the optical disk substrate film-formation apparatus according to the present invention can be simplified, and it is possible to automatically cancel adsorption of an optical disk and to prevent loss of substrates in the removal step.

With the present invention, by making the substrate holding surface of a substrate holder rough, warping of a substrate in the radial and peripheral directions thereof can be suppressed. Further, adhesion of a substrate to a substrate holder is eliminated. Therefore, easiness in peeling off a substrate from a substrate holder is improved.

With the present invention, by setting the surface roughness Rmax of a portion of the substrate holding surface between 10 μm to 500 μm, the effect described above is remarkably improved.

With the present invention, warping of a substrate can be suppressed, and in addition easiness in taking out a substrate from a substrate holder after film formation is finished is further improved. Further, the advantage that damages are hardly generated on a rear surface of a substrate is obtained.

With the present invention, by locating a porous member between a portion which a surface of a plastic plane substrate on which a film is not formed contacts and a portion off from the former portion to link the two sections, it is possible to maintain the thermal deformation prevention effect and the air-tight adhesion prevention effect in a plastic plane substrate can be maintained without reducing the mechanical strength of a substrate holder.

With the present invention, by locating a porous member in an area contacting an area not contacted by a plane substrate, and also by providing a through-hole penetrating a substrate holder on a rear surface of the porous member, scattering materials generated during film formation are not deposited thereon, so that the necessity of replacing the porous member is eliminated, and it is possible to maintain the effects of preventing thermal deformation and the air-tight adhesion of a substrate.

With the present invention, the porous member is made from a material with high thermal conductivity, so that discontinuity in thermal distribution on a surface of a substrate holder is not generated, and it is possible to maintain the effects for preventing thermal deformation and air tight adhesion prevention of a substrate in the most stable conditions.

With the present invention, the porous member is made from a polymeric material or a material with the surface covered with a polymeric material, so that it is possible to maintain the effects of preventing thermal deformation and air tight adhesion of a substrate without giving damages to a surface of a substrate.

With the present invention, the porous member is made from an elastic material, so that it is possible to maintain the effects of preventing thermal deformation and air tight adhesion prevention of a plane substrate without giving damages to a surface of the substrate.

With the present invention, deformation of a substrate during firm formation can be prevented, and in addition the entire rear surface of the substrate does not contact a substrate holder, so that it is possible to prevent the operation for taking out a substrate by means of vacuum adsorption from becoming unstable. Further, it is possible to provide an optical disk which causes deformation of a substrate little and can carry substrate under stable conditions.

With the present invention, it is possible to provide a thickness of an optical disk preventing deformation of a substrate and enabling a stable operation for taking out the substrate.

With the present invention, by giving a tapered shape to an edge of a support holding section of a substrate holder, it is possible to prevent a concentrated mechanical load to a substrate. Further, it is possible to prevent local damages in the substrate and damages to a surface of the substrate.

With the present invention, it is possible to give an optical taper angle to a tapered form given to an edge of a support holding section.

With the present invention, it is possible to prevent damages to a surface of a substrate by forming an edge of a support holding section with a material with hardness higher than that of a substrate.

With the present invention, it is possible to give optimal dimensions to the material with low hardness used in an edge section of a substrate holder.

With the present invention, a specific material with lower hardness used in an edge section of a substrate holder is given, and it is possible to improve the effect of preventing damages to a surface of a substrate by using the material.

With the present invention, it is possible to introduce gas from a gas supply section provided on a surface of the substrate holder in a limited portion between a substrate placement surface of a substrate holder and a substrate on which a film is to be formed, and in a closed space portion formed in the range by contact between the substrate and substrate holder. Because of this feature, it is possible to efficiently execute operations for taking out and carrying a substrate with a film having been formed thereon at a high speed. Even when the gas inlet port of a frame of an optical disk substrate film-formation apparatus and the gas supply port of the substrate holder are air-tightly communicated to each other, it is possible to evacuate inside of a flow path from a gas inlet path of the frame of the optical disk substrate film-formation apparatus to the gas supply section of the substrate holder to a vacuum state. Further even when a substrate is closely contacted to a substrate holder, there is provided the extremely excellent advantage that damages to a rear surface of a substrate can be prevented.

With the present invention, it is possible to realize a substrate holder based on a structure in which at least a portion of a film-formed area is closely contacted to a substrate holder which can obtain the excellent mechanical characteristics and media signal performance of a substrate, even though a groove is prevent on a surface of the substrate holder, when film formation by sputtering is executed. Namely, it is possible to provide an optical data recording medium insuring the excellent mechanical characteristics and media signal performance even when high speed film formation, formation of a large thickness, film formation on a thin disk are performed, or when two or more layers are formed repetitively on the same substrate. Further by eliminating troubles in carrying substrates when film formation is executed continuously, and also by substantially improving serviceability of the optical disk substrate film-formation apparatus, there is provided the extremely excellent advantage that production efficiency is substantially improved and the production cost is reduced.

With the present invention, by providing a rim of the groove section at a concentric position against a center of the optical disk, it is possible to substantially reduce influence of a groove section formed on a surface of the substrate holder over the mechanical characteristics and media signal performance of a substrate.

With the present invention, by providing a taper in an edge section forming a rim of the groove section or executing R machining thereto, damages of a rim section of a groove formed in the substrate holder caused by contact with the disk substrate can be reduced.

With the present invention, by executing a complex plating with water-repelling powder of carbon fluoride (Cf)n or fluororesin (PTFE, PFE, EFP) or executing the processing for water repulsion with a chlorosilane-based chemical adsorbent having a fluoroalkyl base, damages caused by contact between a disk substrate and a substrate holder can substantially be reduced.

With the present invention, by forming a surface of a substrate holder where it contacts a disk substrate with a lubricating material such as PTFE or polyacetal, damages caused by close contact between a disk substrate and a substrate holder can substantially be reduced.

With the present invention, by forming a flow path communicating to the groove section, when a disk substrate is carried out from an optical disk substrate film-formation apparatus, it is possible to introduce a ventilation gas from this non-contact space, whereby generation of vacuum chucking generated when the disk substrate is closely contacted to the substrate holder can be prevented, and stable carriage of substrates can be carried out.

With the present invention, deformation of a substrate during film formation can be reduced. Because of this feature, even when a thinner substrate is used, the substrate can be treated like that based on the conventional technology, and in addition lowering of through-put in the film-formation step can be prevented. Further, quality of optical disk can be improved with yield of optical disk production also improved. In addition, even when a thinner substrate is used, deformation of the substrate can be prevented. Because of the feature, quality of optical disks can be improved, and also yield in production of optical disks can be improved. For the reasons described above, with the present invention, even when a thinner optical disk is used, it is possible to provide an optical disk substrate film-formation apparatus which does not deform a disk substrate, nor lowers the through-put.

With the present invention, a substrate can be adsorbed to a substrate holder by means of vacuum chucking, and even when a substrate with the thickness of 0.6 mm, deformation of the substrate can be prevented. Because of this feature, quality of optical disks based on the adhesion system can be improved, and also yield of production of optical disks can be improved.

With the present invention, a substrate holder and a substrate are adsorbed to each other during film formation without the need of providing a dedicated mechanism for adsorbing the substrate holder and a substrate. Because of this feature, it is possible to simplify configuration of the optical disk substrate film-formation apparatus according to the present invention, and to prevent a substrate from being broken when adsorption of the optical disk is automatically released and the substrate is removed.

With the present invention, a substrate holder and a substrate can be adsorbed to each other during film formation without the need of providing a dedicated mechanism for adsorbing the substrate to the substrate holder. Because of this feature, configuration of the optical disk substrate film-formation apparatus according to the present invention is simplified, and it is possible to prevent a substrate having a thickness of 0.6 mm or less when adsorption of the optical disk substrate is automatically released and the substrate is removed.

With the present invention, deformation of a substrate can be reduced. Because of this feature, even when a thinner substrate is used, film formation can be performed like on the conventional type of substrate, and in addition lowering of through-put in the film-formation step can be prevented. Further quality of optical disk substrate can be improved, and also yield in production of optical disks can be improved. Further, a substrate can be adsorbed to a substrate holder by means of vacuum chuck, and even when a thinner substrate is used, deformation of the substrate can be prevented. Therefore, quality of optical disks can be improved, and also yield in production of optical disks can further be improved. For the reasons described above, with the present invention, it is possible to provide an optical disk substrate film-formation method in which, even when a thinner optical disk is used, the optical disk substrate is not deformed and the through-put is not lowered.

With the present invention, damages to an light beam incidence surface of an optical disk which is a rear surface during film formation can be prevented, and quality of the optical disk can be improved with the yield in production of optical disks further improved.

With the present invention, it is possible to form a protection film without loading heat to a substrate, and to further reduce deformation of a substrate due to heat.

With the present invention, even when such as device as a coater is not available, it is possible to form a protection film, which allows various methods for forming a protection method.

With the present invention, conditions for film formation are well known, and a film made from a material suited to the protection film can be selected. Because of this feature, it is possible to form a protection film suited to protection of a rear surface of the substrate.

With the present invention, substrate, which are not warping, can be produced with high yield.

With the present invention, a substrate holder can easily be manufactured with low cost. Preferably triazine is used for processing a surface of a substrate holding surface, and the surface lubrication effect can be achieved with relatively low cost.

With the present invention, it is possible to provide an optical disk which enables improvement in the production efficiency and reduction of production cost.

With the present invention, a phase-change type of optical disk in which an Ag-based alloy film is used for the reflection/heat-emission layer, and a sulfidization-preventing conductive layer is provided between the upper dielectric body protection layer made from a mixture of zinc sulfide and silicon oxide and the reflection/heat-emission layer is provided. With this phase-change recording type of optical disk, film formation by sputtering can be executed on the disk at a higher speed as compared to a case where Al is used for the reflection/heat-emission layer. In addition the warping amount is small because the temperature does not rise so much. Further degradation of Ag can be suppressed because of existence of the sulfidization-preventing conductive layer.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. An optical disk substrate film-formation apparatus which manufactures an optical disk by forming a thin film on the surface of a substrate, said apparatus comprising:
   a substrate holder which fixes said substrate during the formation of said film,
   wherein said substrate holder includes,
   a contact holding surface contacting at least a portion of a rear surface of a film-formed area of said substrate on which said film is formed,
   a vacuum chuck section for adsorbing and fixing said contact holding surface to said substrate, and
   a removal claw having an inclined section configured to go into a section between a rear surface of the substrate and a top surface of the substrate holder to mechanically peel off the adsorbed substrate from the substrate holder,
   wherein said apparatus is configured to perform sputter film formation in which a laminated film is formed by combining any one or two or more of a reflection layer, a recording layer, a protection layer, or a dielectric body layer on the disk substrate,
   wherein at least one groove section extending once around a center of a section where the disk is placed and having a construction in which an angle between a tangent to a rim of said at least one groove at any position and a tangent to a circle around a center of a section where said disk substrate is placed at the same position is not more than 30 degrees and is provided in an area of a surface of a substrate holder opposing to a film-formed area of the disk substrate, and a portion other than said groove section contacts and supports the rear surface of the film-formed area of said disk substrate.

2. The optical disk substrate film-formation apparatus according to claim 1, wherein the rim of said groove section is a concentric circle around a center of the section where said disk substrate is placed.

3. The optical disk substrate film-formation apparatus according to claim 1, wherein a taper is provided in the edge forming the rim of said groove section.

4. The optical disk substrate film-formation apparatus according to claim 1, wherein the edge forming the rim of said groove section is given a R processing.

5. The optical disk substrate film-formation apparatus according to claim 1, wherein at least a surface of the substrate holder contacting said disk substrate is lubricated.

6. The optical disk substrate film-formation apparatus according to claim 5, wherein the water-repelling processing such as complex plating with water-repelling powder such as carbon fluoride (Cf)n or fluororesin (PTFE, PFE, PEP), or processing with a chlorosilane-based chemical adsorbent having a fluoroalkyl base is executed as the processing for lubrication.

7. The optical disk substrate film-formation apparatus according claims 1, wherein at least a surface of the substrate holder which contacts said disk substrate is made from a material such as PTFE or polyacetal having a lubricating capability.

8. The optical disk substrate film-formation apparatus according to claim 1, wherein a flow path extending from a section of said substrate holder other than the section where a disk substrate is placed, said section vacuum-evacuated and ventilated when said disk substrate is carried into or out from the optical disk substrate film-formation apparatus up to inside of said groove section is formed.

9. An optical disk substrate film-formation method of manufacturing an optical disk by forming a thin-film on a surface of a substrate fixed on a substrate holder, wherein said substrate holder holds said substrate, when fixing the substrate, by contacting at least a portion of a surface where the substrate is placed thereon to a portion of a rear surface of a film-formed area of the substrate in which a thin-film is formed, said optical disk film-forming method comprising:
   inserting a removal claw between a rear surface of the substrate and a top surface of the substrate holder to mechanically peel off an adsorbed substrate from the substrate holder,
   wherein said substrate holder includes,
   a contact holding surface contacting at least the portion of the rear surface of the film-formed area of said substrate on which said film is formed,
   a vacuum chuck section for adsorbing and fixing said contact holding surface to said substrate, and
   the removal claw.

10. An optical disk substrate film-formation method of manufacturing an optical disk by forming a thin-film on a surface of a substrate fixed on a substrate holder, wherein said substrate holder holds, when a substrate having a thickness of 0.6 mm or less is fixed, the substrate by contacting at least a portion of a surface on which the substrate is fixed to at least a portion of a rear surface of a film-formed area of the substrate where a film is formed therein, said optical disk substrate film-formation method comprising:
   adsorbing and fixing a contact holding surface to said substrate with a vacuum chuck section, said contact holding surface contacting at least the portion of the rear surface of the film-formed area of said substrate on which said film is formed; and
   inserting a removal claw between a rear surface of the substrate and a top surface of the substrate holder to mechanically peel off an adsorbed substrate from the substrate holder,
   wherein said substrate holder includes,
   the contact holding surface,
   the vacuum chuck section for adsorbing and fixing said contact holding surface to said substrate, and
   a removal claw having an inclined section configured to go into a section between a rear surface of the substrate and a top surface of the substrate holder to mechanically peel off the adsorbed substrate from the substrate holder.

11. The optical disk substrate film-formation method according to claim 10, wherein said film-formation step further includes a rear surface protection film formation step in which a protection film for protecting a rear surface of a substrate contacting said substrate holder is formed on the rear surface.

12. The optical disk substrate film-formation method according to claim 11, wherein the protection film is formed by spin-coating UV hardening resin which is resin hardened when a ultraviolet ray is irradiated thereto in said rear surface protection film formation step.

13. The optical disk substrate film-formation method according to claim 11, wherein the protection film is formed by sputtering in said rear surface protection film formation step.

14. The optical disk substrate film-formation method according to claim 13, wherein said protection film formed by sputtering is a laminated film comprising one or more of a silicon nitride film a silicon oxide film, a titanium nitride film, and a film made from a composition of indium, titanium, and oxygen.

15. An optical disk film-formation method carried out in an optical disk substrate film-formation apparatus having a film-formation chamber in which a film is formed on a surface of a substrate, a substrate carriage chamber from which a substrate is carried to said film-formation chamber, and a substrate holder having a through-hole provided between said substrate carriage chamber and film-formation chamber and connected to said substrate carriage chamber and film-formation chamber, said optical disk film-formation method comprising:
a film-formation step in which a substrate is fixed on said substrate holder and a film is formed on the substrate by maintaining a pressure in said film-formation chamber higher than that in said film carriage chamber,
wherein said substrate holder includes,
a contact holding surface contacting at least the portion of the rear surface of the film-formed area of said substrate on which said film is formed,
a vacuum chuck section for adsorbing and fixing said contact holding surface to said substrate, and
a removal claw having an inclined section configured to go into a section between a rear surface of the substrate and a top surface of the substrate holder to mechanically peel off the adsorbed substrate from the substrate holder.

16. The optical disk substrate film-formation method according to claim 15, wherein at least a portion of a rear surface of a film-formed area of a substrate in which a film is formed thereon is contacted to said substrate holder in said film-formation step.

17. The optical disk substrate film-formation method according to claim 15 wherein said film-formation step further includes a rear surface protection film formation step in which a protection film for protecting a rear surface of a substrate contacting said substrate holder is formed on the rear surface.

18. The optical disk substrate film-formation method according to claim 17, wherein the protection film is formed by spin-coating UV hardening resin which is resin hardened when a ultraviolet ray is irradiated thereto in said rear surface protection film formation step.

19. The optical disk substrate film-formation method according to claim 17, wherein the protection film is formed by sputtering in said rear surface protection film formation step.

20. The optical disk substrate film-formation method according to claim 19, wherein said protection film formed by sputtering is a laminated film comprising one or more of a silicon nitride film a silicon oxide film, a titanium nitride film, and a film made from a composition of indium, titanium, and oxygen.

21. An optical disk film-formation method carried out in an optical disk substrate film-formation apparatus having a film-formation chamber in which a film is formed on a surface of a substrate, a substrate carriage chamber from which a substrate is carried to said film-formation chamber, and a substrate holder having a through-hole provided between said substrate carriage chamber and film-formation chamber and communicating to said substrate carriage chamber and film-formation chamber, said optical disk film-formation method comprising:
a film-formation step in which, when a substrate having a thickness of 0.6 mm or less is fixed, the substrate is fixed by said substrate holder and a film is formed thereon by maintaining a pressure in said film-formation chamber higher than that in said substrate carriage chamber,
wherein said substrate holder includes,
a contact holding surface contacting at least the portion of the rear surface of the film-formed area of said substrate on which said film is formed,
a vacuum chuck section for adsorbing and fixing said contact holding surface to said substrate, and
a removal claw having an inclined section configured to go into a section between a rear surface of the substrate and a top surface of the substrate holder to mechanically peel off the adsorbed substrate from the substrate holder.

22. The optical disk substrate film-formation method according to claim 21, wherein at least a portion of a rear surface of a film-formed area of a substrate in which a film is formed thereon is contacted to said substrate holder in said film-formation step.

23. The optical disk substrate film-formation method according to claim 21, wherein said film-formation step further includes a rear surface protection film formation step in which a protection film for protecting a rear surface of a substrate contacting said substrate holder is formed on the rear surface.

24. The optical disk substrate film-formation method according to claim 23, wherein the protection film is formed by spin-coating UV hardening resin which is resin hardened when a ultraviolet ray is irradiated thereto in said rear surface protection film formation step.

25. The optical disk substrate film-formation method according to claim 23, wherein the protection film is formed by sputtering in said rear surface protection film formation step.

26. The optical disk substrate film-formation method according to claim 25, wherein said protection film formed by sputtering is a laminated film comprising one or more of a silicon nitride film a silicon oxide film, a titanium nitride film, and a film made from a composition of indium, titanium, and oxygen.

27. An optical disk substrate film-formation method of forming a film by sputtering on a surface of a substrate by contacting a rear surface of a substrate to a substrate holder to hold an optical disk substrate with said substrate holder, said method using an optical disk substrate film formation apparatus comprising:
a substrate holder which holds a substrate at its rear surface so that sputter film formation can be carried out on the front surface of said substrate, said substrate holder having a substrate holding surface which comes in contact with said rear surface of said substrate,
wherein at least a portion of said substrate holding surface is rough, and
wherein said substrate holder includes,
a contact holding surface contacting at least the portion of the rear surface of the film-formed area of said substrate on which said film is formed, a vacuum chuck section for adsorbing and fixing said contact holding surface to said substrate, and a removal claw having an inclined section configured to go into a section between a rear surface of the substrate and a top surface of the substrate holder to mechanically peel off the adsorbed substrate from the substrate holder.

28. A substrate manufacture method comprising:

a step of forming a substrate holder which holds a substrate at its rear surface so that sputter film formation can be carried out on the front surface of said substrate, said substrate holder having a substrate holding surface which comes in contact with said rear surface of said substrate;

a step of making at least a portion of said substrate holding surface contacting a rear surface of said substrate rough; and a step of lubricating said rough surface by complex plating with fine powder of carbon fluoride (CF)n or fluororesin to make the surface roughness Rmax of the lubricated section to 10 μm or more and 500 μm or less, wherein said substrate holder includes, a contact holding surface contacting at least the portion of the rear surface of the film-formed area of said substrate on which said film is formed, a vacuum chuck section for adsorbing and fixing said contact holding surface to said substrate, and a removal claw having an inclined section configured to go into a section between a rear surface of the substrate and a top surface of the substrate holder to mechanically peel off the adsorbed substrate from the substrate holder.

29. A substrate manufacture method comprising:

a step of forming a substrate holder which holds a substrate at its rear surface so that sputter film formation can be carried out on the front surface of said substrate, said substrate holder having a substrate holding surface which comes in contact with said rear surface of said substrate;

a step of making at least a portion of said substrate holding surface contacting a rear surface of said substrate rough; and a step of lubricating said rough surface with a chlorosilane-based chemical adsorbent to make the surface roughness Rmax of the lubricated section to 10 μm or more and 500 μm or less, wherein said substrate holder includes, a contact holding surface contacting at least the portion of the rear surface of the film-formed area of said substrate on which said film is formed, a vacuum chuck section for adsorbing and fixing said contact holding surface to said substrate, and a removal claw having an inclined section configured to go into a section between a rear surface of the substrate and a top surface of the substrate holder to mechanically peel off the adsorbed substrate from the substrate holder.

30. A substrate holder manufacture method comprising:

a step of forming a substrate holder which holds a substrate at its rear surface so that sputter film formation can be carried out on the front surface of said substrate, said substrate holder having a substrate holding surface which comes in contact with said rear surface of said substrate;

a step of making at least a portion of said substrate holding surface contacting a rear surface of said substrate rough; and a step of lubricating said rough surface by organic plating with triazinethiol to make the surface roughness Rmax of the lubricated section to 10 μm or more and 500 μm or less, wherein said substrate holder includes, a contact holding surface contacting at least the portion of the rear surface of the film-formed area of said substrate on which said film is formed, a vacuum chuck section for adsorbing and fixing said contact holding surface to said substrate, and a removal claw having an inclined section configured to go into a section between a rear surface of the substrate and a top surface of the substrate holder to mechanically peel off the adsorbed substrate from the substrate holder.

* * * * *